US008117583B2

(12) United States Patent
Gotou

(10) Patent No.: US 8,117,583 B2
(45) Date of Patent: Feb. 14, 2012

(54) DETERMINING MACRO BLOCKS TERMINAL FOR INTEGRATED CIRCUIT LAYOUT

(75) Inventor: Takashi Gotou, Tokyo (JP)

(73) Assignee: NEC Corporation, Tokyo (JP)

( * ) Notice: Subject to any disclaimer, the term of this patent is extended or adjusted under 35 U.S.C. 154(b) by 758 days.

(21) Appl. No.: 12/036,643

(22) Filed: Feb. 25, 2008

(65) Prior Publication Data
US 2008/0216026 A1 Sep. 4, 2008

(30) Foreign Application Priority Data

Mar. 2, 2007 (JP) ................................. 2007-053302

(51) Int. Cl.
*G06F 17/50* (2006.01)
(52) U.S. Cl. ........ 716/130; 716/105; 716/118; 716/126; 716/132; 716/134
(58) Field of Classification Search .................. 716/118, 716/119, 122, 124, 126, 132, 135, 139, 2, 716/8, 9, 10, 11, 12, 13, 14, 105, 130, 133, 716/134
See application file for complete search history.

(56) References Cited

U.S. PATENT DOCUMENTS

| 6,415,428 B1 * | 7/2002 | Camporese et al. ............ 716/12 |
| 2001/0025368 A1 * | 9/2001 | Cooke et al. .................... 716/13 |
| 2003/0135837 A1 * | 7/2003 | Okabe ............................ 716/12 |
| 2005/0028113 A1 * | 2/2005 | Lin et al. ........................ 716/3 |
| 2007/0044056 A1 * | 2/2007 | Minter et al. ................... 716/8 |
| 2007/0101306 A1 * | 5/2007 | Bowers et al. ................ 716/10 |

FOREIGN PATENT DOCUMENTS

| JP | 3-209848 A | 9/1991 |
| JP | 4-60873 A | 2/1992 |
| JP | 11-307644 A | 11/1999 |
| JP | 2001-319976 A | 11/2001 |
| JP | 2005-332053 A | 12/2005 |

* cited by examiner

*Primary Examiner* — Thuan Do
*Assistant Examiner* — Nha Nguyen
(74) *Attorney, Agent, or Firm* — Sughrue Mion, PLLC

(57) ABSTRACT

Provided is an integrated circuit layout design supporting device which can reduce the wiring length by avoiding bypass wirings when a plurality of same-type macro blocks are used. The integrated circuit layout design supporting device includes a terminal coordinate calculation control unit and a layout processing control unit. The terminal coordinate calculation control unit considers the plurality of same-type macro blocks included in a plurality of types of macro blocks as each of different types of macro blocks, and calculates the optimum coordinate positions of each macro terminal of each macro block. The layout processing control unit performs various types of wiring layout processing related to each of the macro terminals based on each of the macro terminal positions calculated by the terminal coordinate calculation control unit.

16 Claims, 36 Drawing Sheets

FIG. 9

MACRO CHANGE LIST
INFORMATION

|    | MACRO NAMES BEFORE CHANGE | MACRO NAMES AFTER CHANGE | TERMINAL NAMES BEFORE CHANGE | TERMINAL NAMES AFTER CHANGE |
|----|---------------------------|--------------------------|------------------------------|-----------------------------|
| A1 | a                         | a1                       | ta                           | ta_1                        |
| A2 | a                         | a2                       | ta                           | ta_2                        |
| A3 | a                         | a3                       | ta                           | ta_3                        |
| A4 | a                         | a4                       | ta                           | ta_4                        |
| ⋮  | ⋮                         | ⋮                        | ⋮                            | ⋮                           |

FIG.10

| 101 | | PLURAL SAME-TYPE MACROS | | OTHER TYPE MACROS |
|---|---|---|---|---|
| | | MACRO NAMES | TERMINAL NAMES | |
| RIGHT AFTER INPUT OF INFORMATION | FLOOR PLAN SETTLED STAGE | COMMON MACRO NAMES | COMMON TERMINAL NAMES | INDIVIDUAL MACRO & TERMINAL NAMES |
| TOP LAYOUT RELATED PROCESSING (FIRST LAYER) (FIRST PERIOD) | PREPROCESSING (CHANGE TOP HIERARCHY, DETERMINE TERMINAL COORDINATES) | INDIVIDUAL MACRO NAMES | INDIVIDUAL TERMINAL NAMES | |
| | TOP LAYOUT PROCESSING | INDIVIDUAL MACRO NAMES | INDIVIDUAL TERMINAL NAMES | |
| MACRO LAYOUT RELATED PROCESSING (SECOND LAYER) (SECOND PERIOD) | PREPROCESSING (ADD MACRO TERMINAL, SET TERMINAL COORDINATES) | COMMON MACRO NAMES | INDIVIDUAL TERMINAL NAMES | |
| | MACRO LAYOUT PROCESSING | COMMON MACRO NAMES | INDIVIDUAL TERMINAL NAMES | |
| CHIP LAYOUT RELATED PROCESSING (THIRD LAYER) (THIRD PERIOD) | PREPROCESSING (REPLACE MACRO NAMES & TERMINAL NAMES) | COMMON MACRO NAMES | COMMON TERMINAL NAMES | |
| | CHIP LAYOUT PROCESSING | COMMON MACRO NAMES | COMMON TERMINAL NAMES | |

DETERMINING MACRO BLOCKS TERMINAL FOR INTEGRATED CIRCUIT LAYOUT

CROSS-REFERENCE TO RELATED APPLICATION

This application is based upon and claims the benefit of priority from Japanese patent application No. 2007-053302, filed on Mar. 2, 2007, the disclosure of which is incorporated herein in its entirety by reference.

BACKGROUND OF THE INVENTION

1. Field of the Invention

The present invention relates to an integrated circuit layout design supporting device, an integrated circuit layout design supporting method, a program, and a data structure thereof.

2. Description of the Related Art

For designing layout of a large-scaled integrated circuit (for example, LSI), widely used is a method which enables a designing period to be shortened by dividing a chip into pieces of a design unit called a macro (macro block) by a hierarchy layout style and performing layout processing of each macro block in parallel.

In such layout designing of an LSI that uses a plurality of macro blocks including a same function, it is considered to use a plurality of same macro layout patterns on a chip of the LSI for improving the designing efficiency. FIG. 32 and FIG. 33 illustrate such related technique. FIG. 32 is an illustration for describing an example of wiring layout processing between macro blocks performed by a layout design supporting device of the related technique. FIG. 33 is an illustration for describing a wiring layout state after completing layout of a chip.

As shown in FIG. 32, macro blocks 1001a, 1001b, 1001c, and 1001d are arranged within a top hierarchy of a chip 1000. Among those, four macro blocks 1001a are same-types of macro blocks that include a same function. In addition to those, there are a plurality of different types of macro blocks 1001b, 1001c, and 1001d illustrated in FIG. 32. For the same-types of four macro blocks 1001a, already-designed macro blocks, and the like are used. Thus, a pattern of internal functional elements (for example, logic circuit elements) and position of macro terminals 1002 are normally fixed. After arranging each of the macro blocks 1001a, 1001b, 1001c, and 1001d, wiring layout processing is performed to form a wiring 1003 between each of macro terminals 1002 in areas between each of the macro blocks 1001a, 1001b, 1001c, and 1001d. Thereafter, wiring layout processing within each macro block is performed to form layout of the chip 1000 after being wired, as shown in FIG. 33.

Further, as related techniques of an LSI layout design supporting device of this type, there are techniques depicted in Patent Document 1—Patent Document 5 shown in the followings, for example.

In Japanese Unexamined Patent Publication H3-209848 (Patent Document 1), schematic wiring processing between each of functional blocks (macro blocks) of a semiconductor integrated circuit is performed, and a wiring priority direction is determined based on a result of schematic wiring paths obtained after performing the schematic wiring processing and a coordinate positional relation between terminals and sides on the schematic wiring paths. Then, the position of the terminal whose position does not match the wiring priority direction is changed according to the wiring priority direction to re-determine the position of that terminal. As described, Patent Document 1 discloses a technique to shorten the wirings between each of the functional blocks as much as possible by changing the terminal position in each functional block (upper right part on p. 2—lower left part on p. 3).

An integrated circuit designing device disclosed in Japanese Unexamined Patent Publication H4-60873 (Patent Document 2) includes: a provisional layout device which arranges provisional macro blocks whose internal layout is not done, sets virtual external terminals, and performs layout processing of an entire chip and schematic wiring processing; an external terminal position setting device which determines positions of external terminals of each macro block based on a result of the provisional layout; a macro block layout designing device which designs layout of inside each macro block based on the determined positions of the external terminals; a wiring device for performing detailed wirings of the entire chip; and a macro block changing device which changes the determined positions of the external terminals by defining external form of the macro blocks anew (upper right part on p. 3—lower left part on p. 3). With this structure, a plurality of macro blocks are arranged on a chip, and wirings inside the macro blocks and wirings between the macro blocks are set provisionally. Then, after checking the entire layout, size of the macro blocks, layout positions of the terminals, wiring paths, and the like are changed as necessary.

Japanese Unexamined Patent Publication H11-307644 (Patent Document 3) discloses a technique which, in a hard macro designing flow, copies macro layout wiring information for the number of macros (macro blocks) loaded on a chip to chip layout wiring information, and changes the macro names within the chip layout wiring information to which the macro layout wiring information is copied so that the macro names correspond on one on one basis with the macro names of circuit connection information (logic circuits, input/output terminals, wirings, etc.) of the macros in a hierarchical structure (hierarchical illustration in FIG. 6B of Patent Document 3) (paragraph numbers 0038, 0049).

Further, Patent Document 3 discloses a technique to move (offset) the macros to desired loading positions within the chip layout wiring information based on automatic wiring library and offset information (for example, arranged coordinates of logic circuits within macros, wiring coordinates between each of the logic circuits, coordinates of the macros to be loaded on the chip) stored in a library storage part, and create the layout wiring information of the chip where the macros are offset (moved to prescribed positions) (paragraph numbers 0038, 0049). Thereafter, a chip automatic wiring tool is used to readout the circuit connection information of the chip including the macros of hierarchical structure, the automatic layout wiring library of the chip, and the layout wiring information of the chip where the macros are offset, and create layout wiring information with the macros only (paragraph numbers 0038, 0050). Furthermore, the automatic wiring tool of the chip is used to automatically arrange other logic circuits, create layout information, performs automatic wiring, create layout wiring information, checks the result of the layout wiring and the wiring length, and complete the chip designing (paragraph numbers 0030-0034).

Further, Patent Document 3 discloses a technique which inverts the macros in the X-axis direction and the Y-axis direction or rotates the entire macros when offsetting the layout positions of the macros within the layout wiring information of the chip (paragraph number 0076).

Japanese Unexamined Patent Publication 2001-319976 (Patent Document 4) discloses a structure which selects a terminal to be used from a plurality of same function terminals provided in different sides of a macro (macro block)

(paragraph numbers 0026-0027). More specifically, as shown in FIG. 34, a macro block 1010 includes same function terminals (an, bn, ae, be, aw, bw, as, bs) in the fours sides of that macro block 1010. When performing wiring processing between the macro blocks, the terminals in one side (as, bs, for example) with which the wiring between the macro blocks becomes short are selected from a plurality of same function terminals (an, bn, ae, be, aw, bw, as, bs). For the macro input terminals (an, ae, aw, as), only one macro input terminal (as) is used in the wiring processing among the plurality of the terminals. Other unused macro input terminals (an, ae, aw) are subjected to clamp processing on the top layout for being fixed to having logic of 0. The clamp processing means to generate clamp cells CS to be wired to the macro input terminals (an, ae, aw).

Japanese Unexamined Patent Publication 2005-332053 (Patent Document 5) discloses a layout design supporting device which, among a plurality of units (macro blocks) obtained by dividing the top, designs layout of only a single representative unit of a plurality of same structure units except for names of signals. The layout design supporting device designs layout of the top including passing wirings on the plurality of the same units and applies all the passing wirings to the representative unit, while providing macro pins on the boundary of the passing wirings of the representative unit, and fixing the macro pins to design the layout of the representative unit.

When a plurality of same-type macro blocks are used on the chip, an optimum result cannot be achieved in some cases, because the circuit delay in a system LSI in timing designing cannot be set within a range of delay required for achieving a normal operation, due to the wiring property between the macro blocks depending on the layout regarding the same-type macro blocks and other different types of macro blocks formed in the surroundings thereof.

Specifically, the layout within the macro blocks needs to keep the uniformity, so that the positions of the macro terminals that are the external terminals of the macro blocks are all need to be identical. For trying to perform the wiring processing of the top layout by using the same-type macro blocks as described above, a part of the wiring 1003 between the macro blocks becomes detoured in the layout of the top hierarchy as a result, as shown in FIG. 32 and FIG. 33. Therefore, the wiring length is increased, which results in deteriorating the wiring property of the entire LSI and deteriorating the wiring delay time.

In Patent Document 1, the terminal positions (positions of the macro terminals) of each functional block (macro block) can only be changed gradually, and the wiring priority direction is limited to the horizontal direction or vertical direction. Thus, even if the terminal positions are changed, the wiring still needs to be detoured. Therefore, the wiring length is increased.

Further, in Patent Document 1, it is necessary to change the terminal positions, wirings, and the like again after performing the schematic wiring processing, which results in increasing the number of unnecessary processing steps.

In Patent Document 2, the terminal positions are changed by even changing the size and the shape of the macro block. Thus, when a plurality of same-type macro blocks are to be used, the uniformity of each macro block cannot be secured. Further, assuming that a plurality of the macro blocks of Patent Document 2 are used and formed on a chip 1030, a bypass wiring part 1032 is generated within a macro block area even if the terminal position of the macro block that needs to be changed to a terminal position is changed to that position as shown in FIG. 36. Therefore, the wiring length becomes increased. Furthermore, it is necessary to perform correction after provisional layout is performed once by the provisional layout device, so that the number of unnecessary processing steps is increased.

In Patent Document 3, macro blocks are copied on a chip, and the macro blocks are moved to specific positions by offset processing. Thereafter, wiring processing between the macro terminals is performed. Because of the offset processing performed to move the macro blocks from the position copied and arranged to other specific positions, etc., the number of processing steps is increased.

Further, in Patent Document 3, a plurality of macros (macro blocks) are copied and only a plurality of same-type macros are used. Thus, with the layout under a condition where the plurality of same-type macro blocks and other types of plural macro blocks that are different from each other are mixed, it is also necessary to use a bypass wiring like the case of FIG. 32, if the macro blocks of Patent Document 3 are used because the macro terminals of the macro blocks used therein are fixed. Therefore, the wiring length becomes increased.

Further, when the macro blocks of Patent Document 3 are used in the layout shown in FIG. 32, it is considered to invert the macro blocks in the X-axis direction or the Y-axis direction or to rotate the entire macro blocks by performing the offset processing for offsetting the layout positions of the macro blocks. In that case, it is necessary to perform the processing such as rotating the macro blocks for the number of macro blocks that cannot finely fit in the positional relation. This increases not only the number of processing steps but also the amount of calculation for rotating or moving the macro blocks as well as the time required for the processing. In particular, under a condition where a great number of macro blocks are used and each of those needs to be arranged in different directions, the number of processing steps is increased still more.

Further, in Patent Document 3, when moving the macros to prescribed loading positions in the layout wiring information of the chip by the offset processing performed after copying the macros, it is necessary to move each of a plurality of copied macros individually. Therefore, the names of the macros are changed for discriminating each macro before the offset processing, because the macros are not discriminated before the change in the wiring connection information of the chip generated by copying (wiring connection information of) the macros, even though each of the macro names is discriminated in the circuit connection information of the chip which shows the hierarchical structure. However, assuming that a plurality of macro blocks of Patent Document 3 are used in the case of FIG. 32, it is necessary to perform the offset processing for each of the plurality of macro blocks even if the macro names are changed. Further, since bypass wirings are formed within the macro blocks, the total wiring length of the chip as a whole can not be formed short.

Furthermore, in Patent Document 3, in a case where a desired wiring can not be achieved by automatic wiring in the wiring processing on the inside the macro or the like, the automatic wiring needs to be corrected by a manual wiring function of the automatic layout wiring tool of the chip as necessary (paragraph number 0025). Further, the automatic layout wiring tool is also utilized for the wiring processing outside the macros. In that case, it is necessary to check the wiring length within the macro blocks and between the macro blocks and to correct the wiring when it is found that the automatic wiring is not in a desirable state. Thus, there is required more time for the processing. That is, in Patent Document 3, it is necessary to correct the wiring within the macro blocks and to correct the wiring between the macro blocks in addition to performing the offset processing. Therefore, the number of processing steps is increased.

With Patent Document 4, it takes time and effort to perform clamp processing to each of the unused macro input terminals on three sides among the four sides of the macro block. For example, as shown in FIG. 34, it is necessary to perform clamp processing for each of the three input terminals aw, an, and ae except for the macro input terminal, as, to be used. At that time, clamp cells CS and wirings for connecting the clamp cells CS and the terminals (an, ae, aw) are required. If a plurality of the macro blocks 1010 in such structure are to be used, it becomes necessary to perform clamp processing on each of the unused terminals for each macro block. Thus, there is required still more time and effort.

For example, as shown in FIG. 35, in the case of a chip 1020 that uses a plurality of macro blocks 1010 of Patent Document 4, it is necessary to include the clamp cell CS and a wiring for one macro block 1010 in addition to including the clamp cell for performing the clamp processing to the above-described unused terminals and wiring between the clamp cells CS and the unused terminals for another macro block 1010. Moreover, the three sides requiring the clamp processing in each macro block are at different positions, so that the clamp processing needs to be performed in accordance with the surrounding conditions. Thus, it requires time and effort for performing the processing, and the number of processing steps is increased. Further, the clamp cells as well as the wirings for connecting the unused terminals and the clamp cells CS need to be provided outside the area of the macro block 1010, thereby increasing the number of unnecessary elements and wirings. This causes delay in the processing speed and increase in the power consumption of the entire chip.

Furthermore, with Patent Document 4, as shown in FIG. 34, in an actual functional macro area (internal core circuit) 1011 functioning actually as a macro (aggregate of logic elements) of the macro block 1010, it is necessary to provide a plurality of new logic elements called terminal selecting devices in an area (terminal selecting device area) between reference numeral 1012 and reference numeral 1013 for giving multiplicity of the use to the terminals on each side. In addition, it is necessary to secure a larger space for the dimension of the terminal selecting device area than that of the actual functioning macro area. Thus, the dimension of a single macro area as a whole becomes expanded.

Because of this, when a plurality of macro blocks 1010 of Patent Document 4 are used, for example, areas SA occupied by the terminal selecting devices become increased as shown in FIG. 35. Thus, the actual functioning macro area cannot be utilized effectively. Further, it becomes necessary to provide elements used exclusively for the terminal selecting devices other than elements for the actual functioning macro areas, so that the number of the elements becomes increased. To provide such function parts used exclusive for connection other than those functioning originally as macro circuits in the macro blocks 1010 results in useless increase in the number of elements and wirings, which causes delay in the operation speed of the entire chip.

With Patent Document 5, the wiring (net) between each unit (macro block) is detoured, so that the wiring length becomes increased.

SUMMARY OF THE INVENTION

An exemplary object of the present invention is to provide an integrated circuit layout design supporting device which can avoid bypass wirings to shorten the wiring length when using a plurality of same-type macro blocks.

In order to achieve the foregoing exemplary object, an integrated circuit layout design supporting device according to an exemplary aspect of the invention is a layout design supporting device for supporting designing layout of an integrated circuit. The device includes: a terminal coordinate calculation control unit which changes same-type macro blocks among macro blocks as targets of layout into individually identifiable specific macro blocks, and determines coordinates of macro terminals of the specific macro blocks; and a layout processing control unit which performs, on the macro terminals at the determined coordinates, wiring layout processing for connecting between the macro blocks.

An integrated circuit layout design supporting method according to another exemplary aspect of the invention is a layout design supporting method for supporting designing layout of an integrated circuit. The method includes: changing same-type macro blocks among macro blocks as targets of layout into individually identifiable specific macro blocks, and determining coordinates of macro terminals of the specific macro blocks; and performing, on the macro terminals at the determined coordinates, wiring layout processing for connecting between the macro blocks.

As an exemplary advantage according to the invention, regarding the wiring layout processing inside and outside a plurality of macro blocks including a plurality of same-type macro blocks, it is possible to design layout by shortening all the wirings connected to the macro terminals while securing the necessary macro block area without performing unnecessary processing such as provisional layout and schematic wiring processing, offset processing, or clamp processing, and without forming unnecessary elements. Therefore, it is possible to avoid bypass wirings (detour routing of the wirings) and improve the wiring property of the semiconductor integrated circuit so as to suppress deterioration in the wiring delay time.

BRIEF DESCRIPTION OF THE DRAWINGS

FIG. 9 is an illustration for describing an example of a table (macro changing list), showing corresponding relation between the macro names and the macro terminal names before and after the changes, which is stored in a hierarchical macro change list information storage part of the layout design supporting device shown in FIG. 1;

FIG. 10 is an illustration for describing an example of changed state of the macro names and the terminal names in various types of layout processing performed with the layout design supporting device shown in FIG. 1;

DETAILED DESCRIPTION OF THE EXEMPLARY EMBODIMENTS

Hereinafter, examples of exemplary embodiments of the present invention will be described in a specific manner by referring to the accompanying drawings.

First Exemplary Embodiment (Overall Structure of Integrated Circuit Layout Design Supporting Device)

Figure 1:
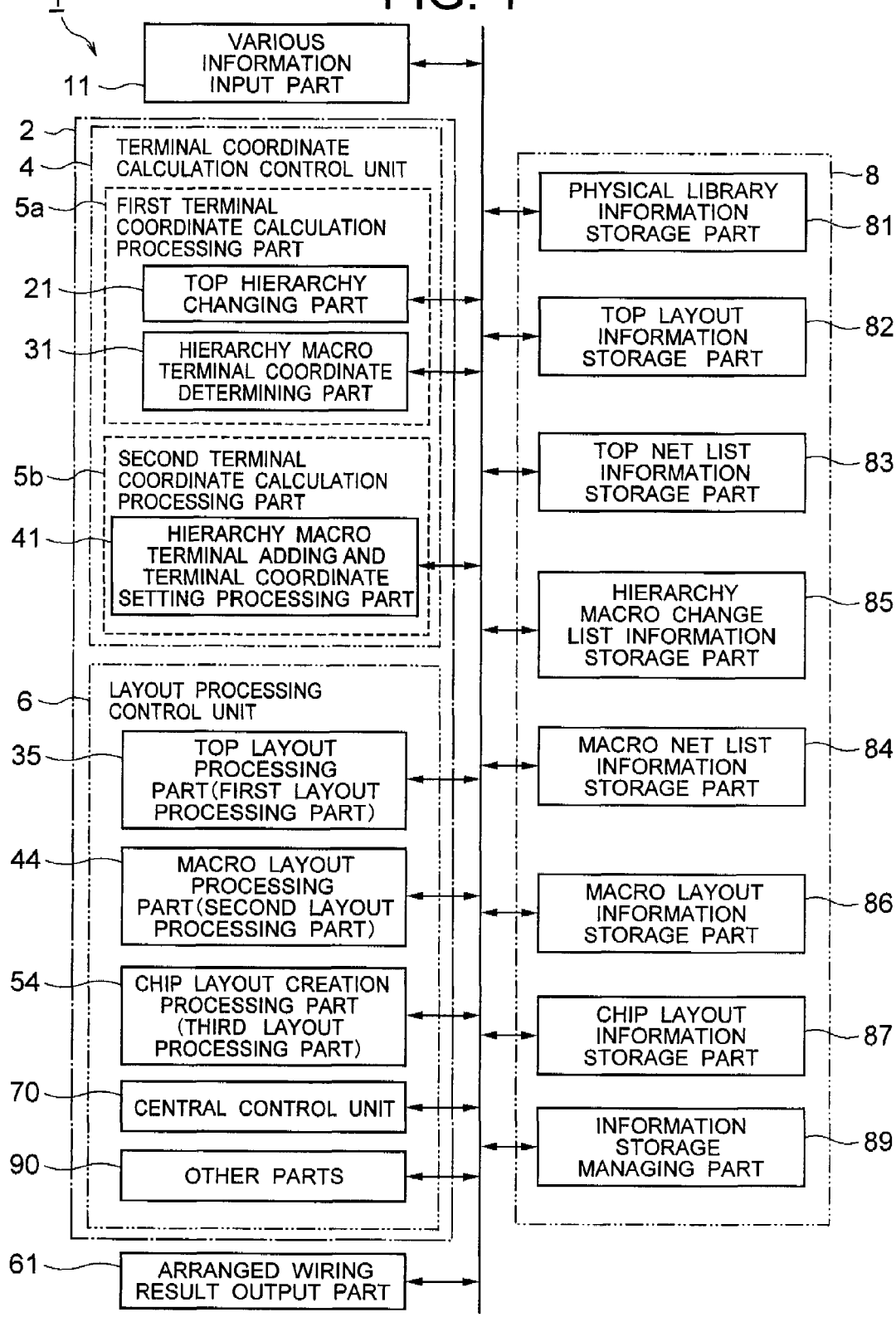
FIG. 1 is a block diagram showing an example of an entire structure of an integrated circuit layout design supporting device according to a first exemplary embodiment of the present invention.

First, the overall structure of an integrated circuit layout design supporting device according to the present invention will be described by referring to FIG. 1. FIG. 1 is a block diagram showing a schematic structure of the entire LSI layout design supporting device according to this exemplary embodiment.

A layout design supporting device 1 for an integrated circuit (for example, LSI) according to the exemplary embodiment is an information processor (computer) used by a user for designing an integrated circuit. As shown in FIG. 1, the layout design supporting device 1 includes: a various information input part 11 for inputting various types of information; a storage unit 8 as an accumulating processing part which stores and performs accumulating processing of information that is registered in advance and information inputted by the user (layout designer) through operations; an arranged wiring result output part 61 which outputs an arranged wiring result after performing layout; and a control unit 2 which performs various types of processing based on the information inputted through the various information input part 11 as well as performing controls of each of those parts.

The various information input part 11 may include a keyboard, a mouse, etc., which functions as an operation input part for being operated to input various data. The storage unit 8 may be a memory such as a RAM, a hard disk, or the like, which has various types of data, various types of programs, and the like stored therein. The arranged wiring result output part 61 may be a screen or the like as a display part for displaying various types of information or the like, for example. The control unit 2 may be a CPU, CPU+program ROM, etc. Although not shown, a plurality of communication units capable of communicating with other peripheral apparatuses through a prescribed interface may also be formed.

Furthermore, the layout design supporting device 1 is operated by program controls, which may be any types of computer such as a desktop computer, a laptop computer, other information apparatuses including radio or wired communication function, or computers similar to those types. Further, it may include a network-related function, and no matter if it is of a mobile type or a fixed type.

Each of the blocks (for example, reference numerals 4, 6, 5*a*, 5*b*, 21, 31, 41, 35, 44, 54, 70, 90, etc.) in a block diagram shown in FIG. 1 is a software module structure, showing a state where it is functionalized by various types of programs when a computer executes those programs stored in proper memories. That is, the physical structure is a CPU (or a CPU and memories) or the like. However, the software structures including each part indicate a plurality of functions, which are achieved by the CPU through program controls, are expressed as structural elements configured by each of the plurality of parts. When functionally expressing the dynamic state where the CPU is executed by the program (when executing each procedure that configures the program), each part is to be configured including the CPU. In this case, as shown in FIG. 1, each of the parts (for example, reference numerals 4, 6, 5*a*, 5*b*, 21, 31, 41, 35, 44, 54, 70, 90, etc.) is formed within the control unit 2. In a static state where the program is not executed, the whole programs for achieving the structures of each part (or each part of the program contained in the structure of each part) are stored in a storage area such as a memory (program ROM or the like) or hard disk. Needless to say, explanations of each part provided hereinafter can be taken as the explanations of a computer functionalized by the programs along with the functions of the programs or can be taken as a device including a plurality of electronic circuit blocks that are functionalized permanently by proper hardware. Therefore, those functional blocks can be achieved in various forms such as only with hardware, only with software, or combinations of those, and it is to be understood that the form thereof is not limited to one of those.

(Inclusive Relation regarding Structures of Each Part)

As shown in FIG. 1, the control unit 2 includes: a terminal coordinate calculation control unit 4 that considers a plurality of same-types of macro blocks contained in a plurality of types of macro blocks as each of different types of macro blocks, and respectively calculates optimum coordinate positions of each macro terminal of each of the macro blocks; and a layout processing control unit 6 which performs various types of wiring layout processing related to each of the macro terminals based on each macro terminal position calculated by the terminal coordinate calculation control unit 4.

The terminal coordinate calculation control unit 4 includes: a first terminal coordinate calculation processing part Ba for calculating a first coordinate position of each macro terminal within block boundary areas between each of the macro blocks; and a second terminal coordinate calculation processing part 5*b* which calculates, based on each of the first coordinate positions of each of the macro terminals calculated by the first terminal coordinate calculation processing part Ba, a second coordinate position as a relative position of the first coordinate position with respect to a specific origin within the macro block, and arranges all the macro terminals of the plurality of same-type macro blocks that are considered as being different types at each of the second coordinate positions that are on the boundary area of one of the same-type macro blocks.

The first terminal coordinate calculation processing part 5*a* includes a top hierarchy changing part 21, and a hierarchy macro terminal coordinate determining part 31. The second terminal coordinate calculation processing part 5*b* includes a hierarchy macro terminal adding and macro terminal coordinate setting processing part 41.

The layout processing control unit 6 includes a top layout processing part 35 (corresponds to "first layout processing part" of the present invention) which performs wiring layout processing for wiring between each of the macro terminals within a first layout area formed between each of the macro blocks, based on each of the first coordinate positions of each macro terminal calculated by the first terminal coordinate calculation processing part 5*a*.

The layout processing control unit 6 includes a macro layout processing part 44 (corresponds to "second layout processing part" of the present invention) which performs, for the same-type macro blocks, wiring layout processing for wiring the functional elements and all the macro terminals arranged by the entire terminal arrangement processing part within a second layout area formed within the same macro blocks and, for other macro blocks, performs wiring layout processing for wiring the functional elements and the macro terminals.

The layout processing control unit 6 includes a chip layout creation processing part 54 (corresponds to "third layout processing part" of the present invention) The chip layout creation processing part 54 merges the top layout area (first layout area) that has gone through the wiring layout processing performed by the top layout processing part 44 with the macro layout area (second layout area) that has gone through the wiring layout processing performed by the macro layout processing part 44 so as to create a chip layout area (third layout area) that includes the top layout area and the macro layout area, and deletes an extra wiring part whose connection is uncompleted among each of the wiring parts wired to all the macro terminals in the chip layout area.

The layout processing control unit 6 includes other parts 90 which perform other various processing or other various control processing, and a central control part 70 for controlling each of those parts.

The storage unit 8 functions as an accumulation processing unit, which includes: a physical library information storage part 81; a top layout information storage part 82 (corresponds to "first layout accumulation processing part" of the present invention") for storing the top layout information (first layout information); a top net list information storage part 83 (corresponds to "first net list accumulation processing part" of the present invention") for storing the top net list information (first net list information); a macro net list information storage part 84 (corresponds to "second net list accumulation processing part" of the present invention") for storing the macro net list information (second net list information) ; a hierarchy macro change list information storage part 85 (corresponds to "macro change list accumulation processing part" of the present invention) for storing the macro change list information; a macro layout information storage part 86 (corresponds to "second layout information accumulation processing part" of the present invention) for storing the macro layout information (second layout information); a chip layout information storage part 87; and an information storage managing part 89 which manages storing processing or information accumulation processing of each of those parts. The storage unit 8 may be structured as a database used exclusively.

(Details of Each Part)

Next, details of the structures of each part will be described by referring to FIG. 1 and FIG. 2. As shown in FIG. 1, the various information input part 11 inputs information required for designing the layout of the LSI, such as the physical library information of the LSI, the top layout information, the top net list information, and the macro net list information. Each of the inputted information (the physical library information of the LSI, the top layout information, the top net list information, the macro net list information) is stored to the physical library information storage part 81, the top layout information storage part 82, the top net list information storage part 83, the macro net list information storage part 84, and the like, respectively. Note here that "net" in the logic designing means a connecting relation between the macro and the logic circuit element.

When a plurality of same-type hierarchy macros are used in the top layout information and the top net list information in the arrangement after being inputted through the various information input part 11, the top hierarchy changing part 21 replaces those hierarchy macros with other macros that have different names but the same size and same terminals to change the top layout information and the top net list information. Then, the top hierarchy changing part 21 stores the changed result to the hierarchy macro change list information storage part 85.

Figure 2:
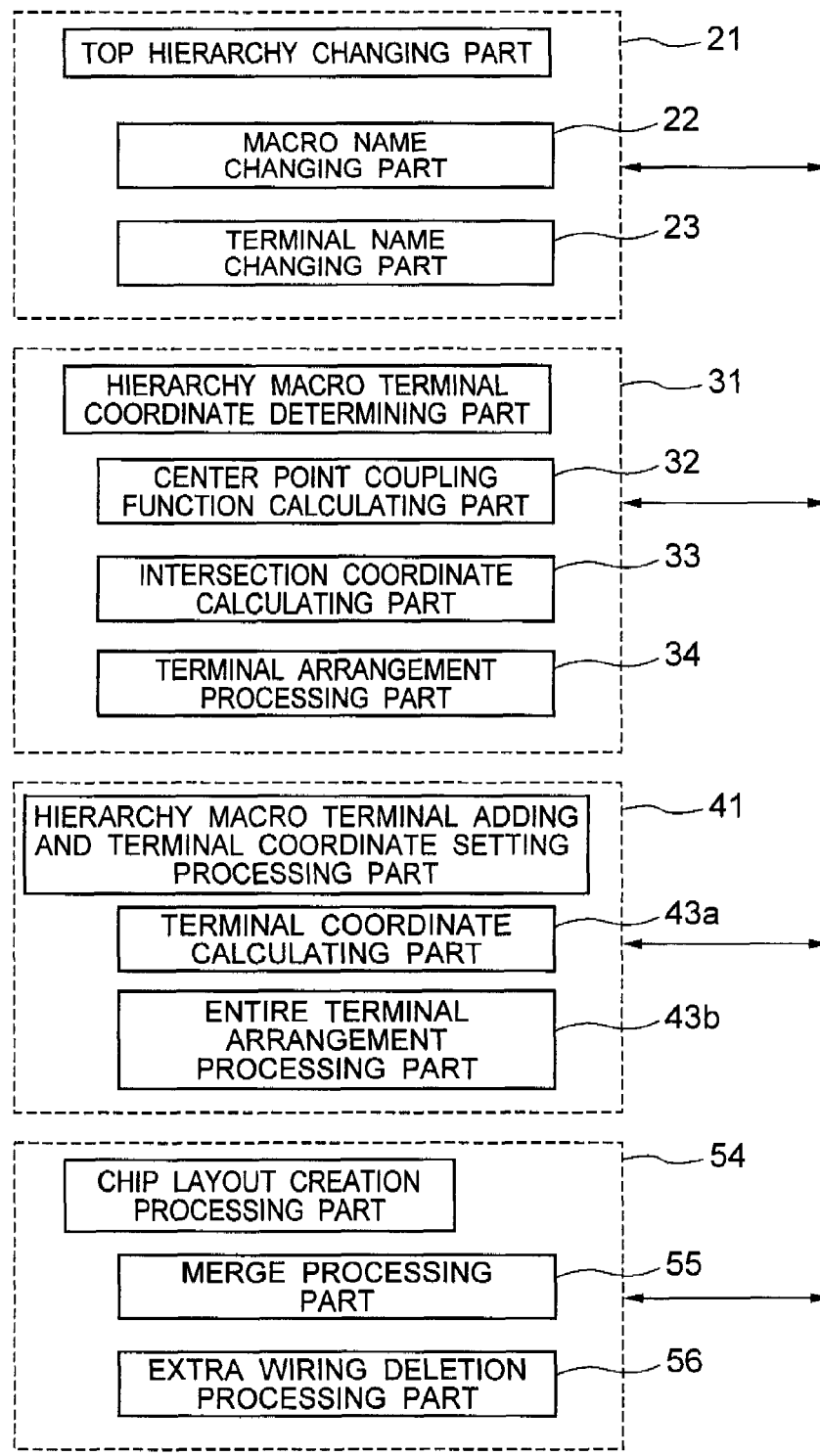
FIG. 2 is a block diagram showing examples of more detailed structures of each unit of the layout design supporting device shown in FIG. 1.

As shown in FIG. 2, the top hierarchy changing part 21 includes a macro name changing part 22, and a terminal name changing part 23.

The macro name changing part 22 changes the originally allotted common macro names into individual macro names by allotting macro names that are different from each other to the plurality of same-type macro blocks.

The terminal name changing part 23 changes the originally allotted common macro terminal names into individual macro terminal names by allotting macro terminal names that are different from each other to each of the macro terminals of the plurality of same-type macro blocks. Through changing the macro names and the terminals names in advance in this manner before calculating the terminal coordinates, it becomes possible to discriminate the plurality of same-type macro blocks to consider those as different types of macro blocks.

As shown in FIG. 1, the hierarchy macro terminal coordinate determining part 31 refers to the top layout information and the top net list information changed by the top hierarchy changing part 21 and, based on the positional relation between the hierarchy macros and the connected relation between each of the hierarchy macros in the top net list, arranges the terminals at the positions with which the distance between the hierarchy macro terminals becomes short and updates the top layout information.

Further, as shown in FIG. 2, the hierarchy macro terminal coordinate determining part 31 includes a center point coupling function calculating part 32 (corresponds to "specific point coupling function calculating part" of the present invention), an intersection coordinate calculating part 33, and a terminal arrangement processing part 34.

The center point coupling function calculating part 32 calculates a center point coupling function that connects between each of the center points of at least two macro blocks. An example of the coupling function may be a linear function (straight line form). However, it is not limited only to that. The coupling function may be a cubic function or the like, as long as it is a function that passes through two points at least. Further, the two points may not have to be each of the center points but may be specific points within the boundary area of the macro blocks. Further, it also applies to a case where a first specific point of one of the macro block is coupled with a second specific point of another macro block. In such case, it is possible to provide a specific point coupling function calculating part. This specific point coupling function calculating part calculates a specific point coupling function that connects each of the specific points of at least two macro blocks.

The intersection coordinate calculating part 33 calculates positions of the coordinates of the intersection points at which the center point coupling function calculated by the center position coupling function calculating part 32 and each of the boundary lines of each macro block intersect with each other. Based on the result, the terminal arrangement processing part 34 performs processing for arranging the macro terminals to the intersection points.

As shown in FIG. 1, the top layout processing part 35 connects the wirings between each of the hierarchy macros by referring to the top layout information in the top layout information storage part 82 that is updated by the hierarchy macro terminal coordinate determining part 31 and the top net list information in the top net list information storage part 83 that is updated by the top hierarchy changing part 21, and creates top layout information after the wiring is completed.

As shown in FIG. 1, the hierarchy macro terminal adding and macro terminal coordinate setting processing part 41, when setting the layout area within the hierarchy macro and the external terminal information of the hierarchy macro by referring to the top layout information created by the top layout processing part 35, changes the hierarchy macro net list in the macro net list information storage part 84 in such a manner that all the terminals within a plurality of types of hierarchy macros after being changed by the top hierarchy changing part 21 are allotted within the macro layout area by replacing those with the terminals of the same-type hierarchy macros in the original state, by referring to the hierarchy macro change list information in the hierarchy macro change list information storage part 85. Then, the hierarchy macro terminal adding and macro terminal coordinate setting processing part 41 creates the hierarchy macro layout information and stores it to the macro layout information storage part 86.

Further, as shown in FIG. 2, the hierarchy macro terminal adding and terminal coordinate setting processing part 41 i includes a terminal coordinate calculating part 43a and an entire terminal arrangement processing part 43b.

The terminal coordinate calculating part 43a calculates, based on each of the first coordinate positions of each macro terminal calculated by the hierarchy macro terminal coordinate determining part 31, a second coordinate position that is a relative position of the first coordinate position with respect to a specific origin within the macro block. An example of the specific origin may be one of the corner part (vertex coordinates) of the macro block. The second coordinate positions are calculated for allotting all the macro terminals on the boundary lines of the same-type macro blocks. It is preferable to transform the first coordinate positions of the macro terminals calculated on the coordinate system of the top layout area (top layout coordinate system) into the coordinate system of the macro layout area (macro layout coordinate system).

The entire terminal arrangement processing part 43b arranges each of all the macro terminals of the plurality of same-type macro blocks that are considered as being different types at each of the second coordinate positions calculated by the terminal coordinate calculating part 43*a* that are on the boundary area of one of the same-type macro blocks.

As shown in FIG. 1, the macro layout processing part 44 performs layout wiring processing within the macro area by referring to the macro layout information and the macro net list information created by the hierarchy macro terminal adding and terminal coordinate setting processing part 41, and creates macro layout information. Then, the hierarchy macro terminal adding and macro terminal coordinate setting processing part 41 stores it to the macro layout information storage part 86.

The chip layout creation processing part 54 merges the top layout information created by the top layout processing part 35 with the macro layout information created by the top layout processing part 44 so as to create chip layout information. Thereafter, the chip layout creation processing part 54 deletes an excessive wiring part (segment) that is not connected as a wiring between the macros to change the chip layout information, and stores it to the chip layout information storage part 87.

Further, as shown in FIG. 2, the chip layout creation processing part 54 includes a merge processing part 55 and an extra wiring deletion processing part 56.

The merge processing part 55 creates the chip layout area (third layout area) that includes the top layout area and the macro layout area by merging the top layout area (first layout area) that has gone through wiring layout processing performed by the top layout processing part (first layout processing part) with the macro layout area (second layout area) that has gone through wiring layout processing performed by the macro layout processing part (second layout area).

Among each of the wiring parts wired towards the entire macro terminals within the chip layout area, the extra wiring deletion processing part 56 deletes the extra wiring part whose connection is uncompleted.

As shown in FIG. 1, the layout wiring result output processing part 61 outputs the chip layout information that is obtained by the chip layout creation processing part 54.

The central control part 70 controls a series of operations of the storage unit 8, the various information input part 11, the top hierarchy changing part 21, the hierarchy macro terminal coordinate determining part 31, the top layout processing part 35, the hierarchy macro terminal adding and terminal coordinate setting processing part 41, the macro layout processing part 44, the chip layout creation processing part 54, the layout wiring result output processing part 61, and the other parts 90 through controlling the programs. For example, the central control part 70 is preferable to be an execution file that is executed along with a program and a managing program such as an operating system or the like as well as other programs that operate in cooperation with each part.

(Data Structure of Storage Unit)

Figure 3:
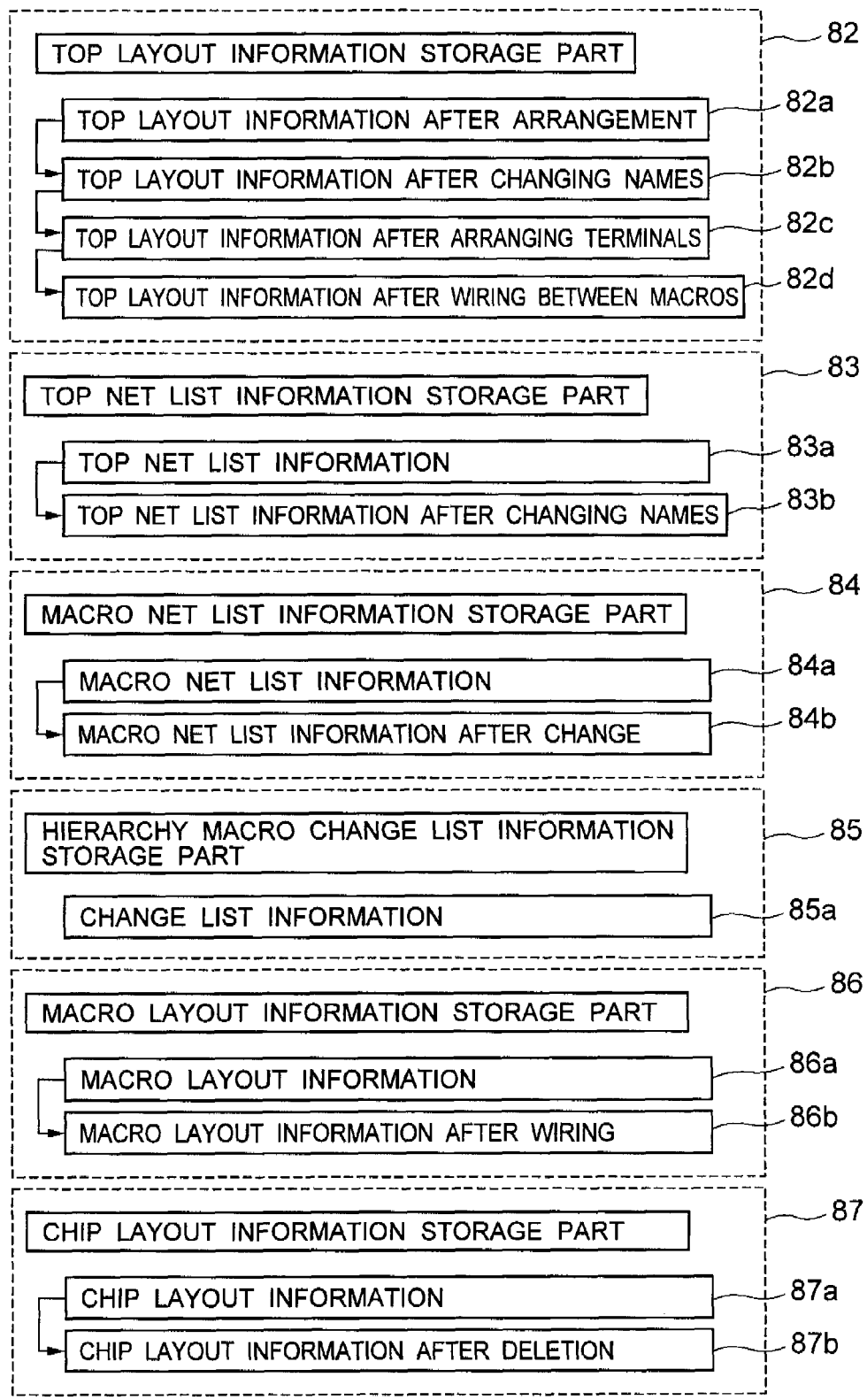
FIG. 3 is a block diagram showing examples of more detailed structures of each part of the layout design supporting device shown in FIG. 1.

Next, detailed structures of each part of the storage unit 8 will be described by referring to FIG. 3. FIG. 3 is a block diagram showing examples of more detailed structures of each part of the storage unit 8 of the layout design supporting device 1 shown in FIG. 1. Hereinafter, "top layout information", "top net list information", "macro net list information", "macro change list information", "macro layout information", and "chip layout information" will be described in this order.

(Top Layout Information)

Figure 14:
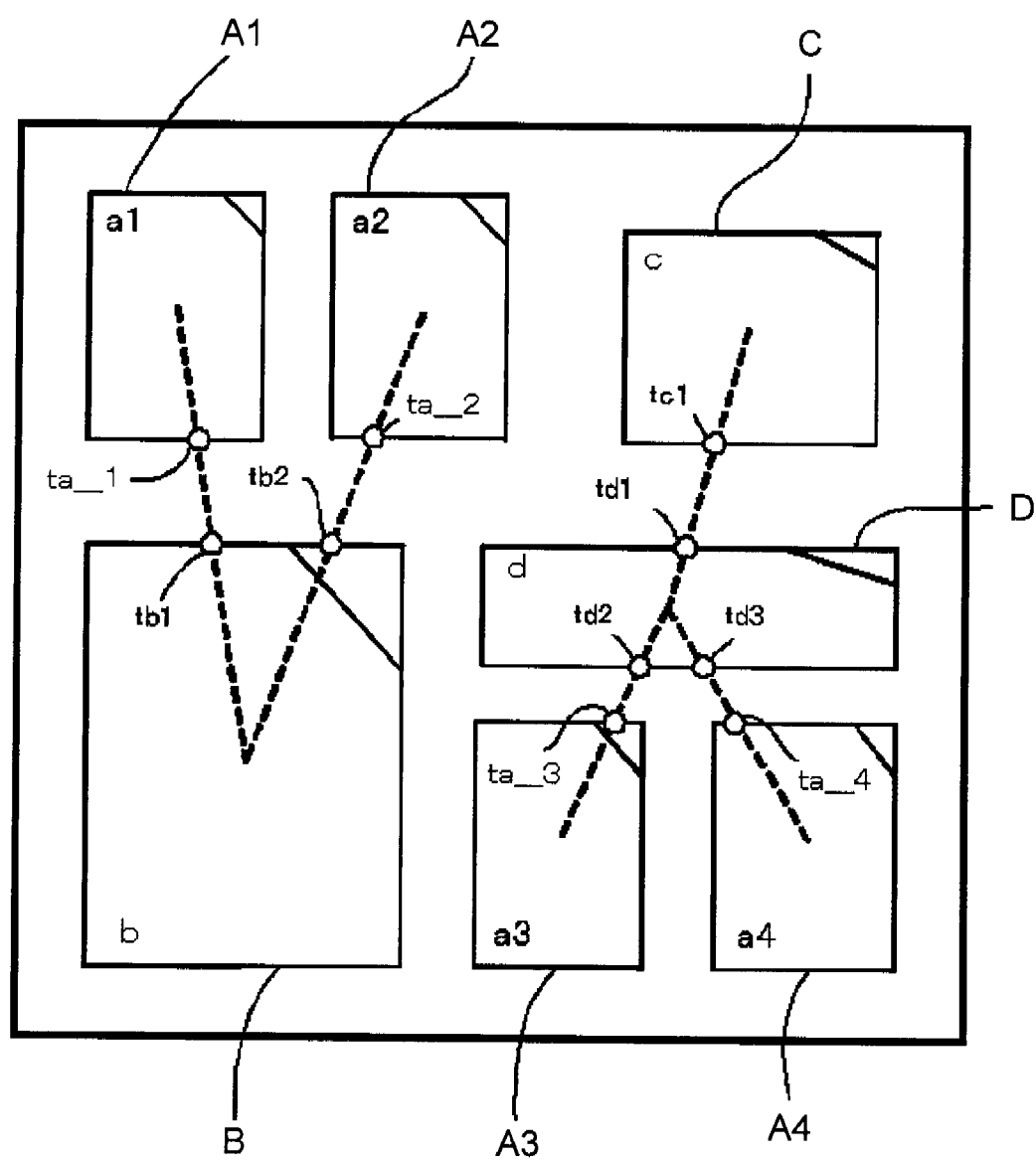
FIG. 14 is an illustration for describing a way of calculating the macro terminal position with the layout design supporting device of FIG. 1.

As shown in FIG. 3, the top layout information storage part 82 includes: top layout information 82*a* (first top layout information; for example, a state of FIG. 5) in which arranged relations (positional relations) of each macro block immediately after the input of information is defined and arranged; name-changed top layout information 82*b* (second top layout information; for example, a state of FIG. 7) in which the macro names are changed; terminal-arranged top layout information 82*c* (third top layout information; for example, a state of FIG. 14) in which the macro terminals are arranged at the calculated first coordinate positions; and inter-macro wired top layout information 82*d* (fourth top layout information; for example, a state of FIG. 15) in which the wiring layout processing between the macro blocks is performed. The information transits in this order.

The first top layout formation is updated to the second top layout information for calculating the optimum arranging positions of the macro terminals. By changing the names of the plurality of same-type macro blocks, the computer recognizes the same-type macro blocks as the different macro blocks and grasps the positional relation between the neighboring macro blocks. After the calculation of the optimum arranging positions, the information becomes the third top layout information in which the macro terminals are allotted. After the wiring layout processing between the macro blocks are performed, the third top layout information turns to the fourth top layout information.

Figure 5:
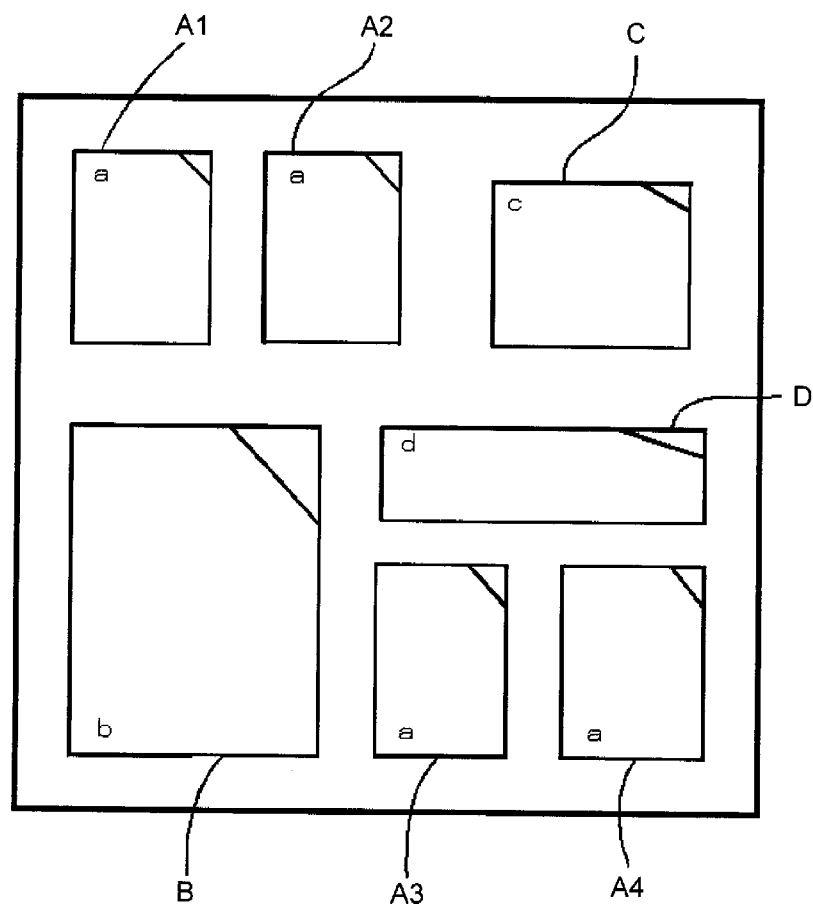
FIG. 5 is an illustration for describing an example of contents of top layout information of the layout design supporting device of FIG. 1.

FIG. 5 shows an example of the contents of the top layout information that is inputted through the various information input part 11 and stored to the top layout information storage part 82. As shown in FIG. 5, hierarchy macro blocks A1-A4, a hierarchy macro block B, a hierarchy macro block C, and a hierarchy macro block D are arranged on an LSI chip. The same-type hierarchy macro blocks A1-A4 are arranged in the same size. At this stage, only the arranging positions of each hierarchy block and the sizes thereof (floor plan) are determined, and the positions of the macro terminals of each hierarchy macro block, the wirings connecting between the macro terminals, and the like are not determined yet.

Figure 15:
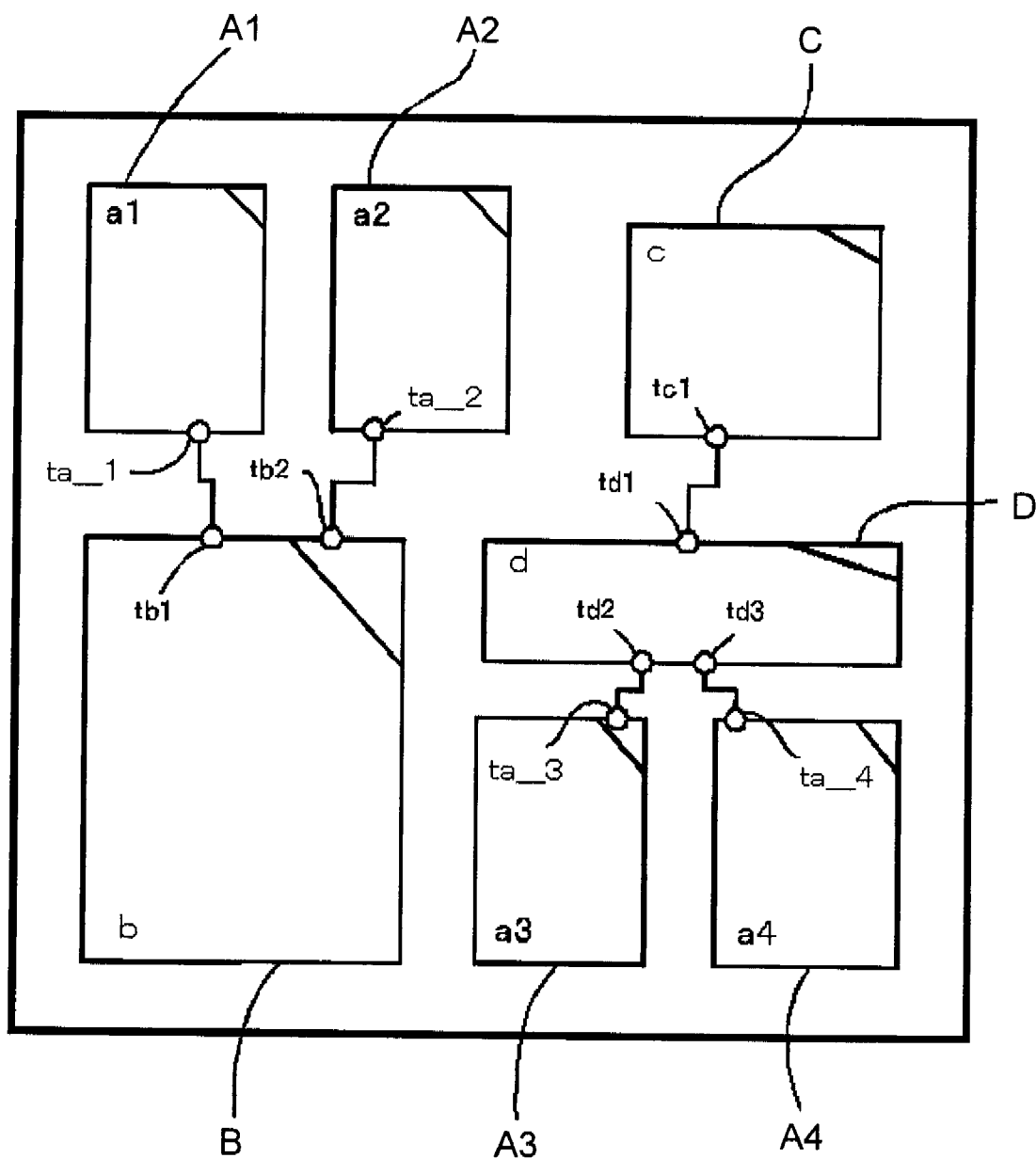
FIG. 15 is an illustration for describing an example of contents of top layout information after performing wiring layout processing between macros with the layout design supporting device of FIG. 1.

FIG. 15 shows the top layout information after performing the wiring layout processing (fourth top layout information). As shown in FIG. 15, a macro terminal (terminal name "ta_1") of the macro block A1 (macro name "a1") is connected via a wiring with a macro terminal (terminal name "tb_1") of the macro block B (macro name "b"). Further, a macro terminal (terminal name "ta_2") of the macro block A2 (macro name "a2") is connected via a wiring with a macro terminal (terminal name "tb_2") of the macro block B (macro name "b"). Furthermore, a macro terminal (terminal name "ta_3") of the macro block A3 (macro name "a3") is connected via a wiring with a macro terminal (terminal name "td_2") of the macro block D (macro name "d") Moreover, a macro terminal (terminal name "ta_4") of the macro block A4 (macro name "a4") is connected via a wiring with a macro terminal (terminal name "td_3") of the macro block D (macro name "d"). Further, a macro terminal (terminal name "tc_1") of the macro block C (macro name "c") is connected via a wiring with a macro terminal (terminal name "td_1") of the macro block D (macro name "d").

(Top Net List Information)

As shown in FIG. 3, the top net list information storage part 83 includes: top net list information 83*a* (first top net list information; for example, a state of FIG. 4) in which connecting relations of each block immediately after the input of information is defined; and name-changed top net list information 83*b* (second top net list information; for example, a state of FIG. 8) in which the macro names and the macro terminal names of the same-type macro blocks are changed. The information transits in this order.

Figure 4:
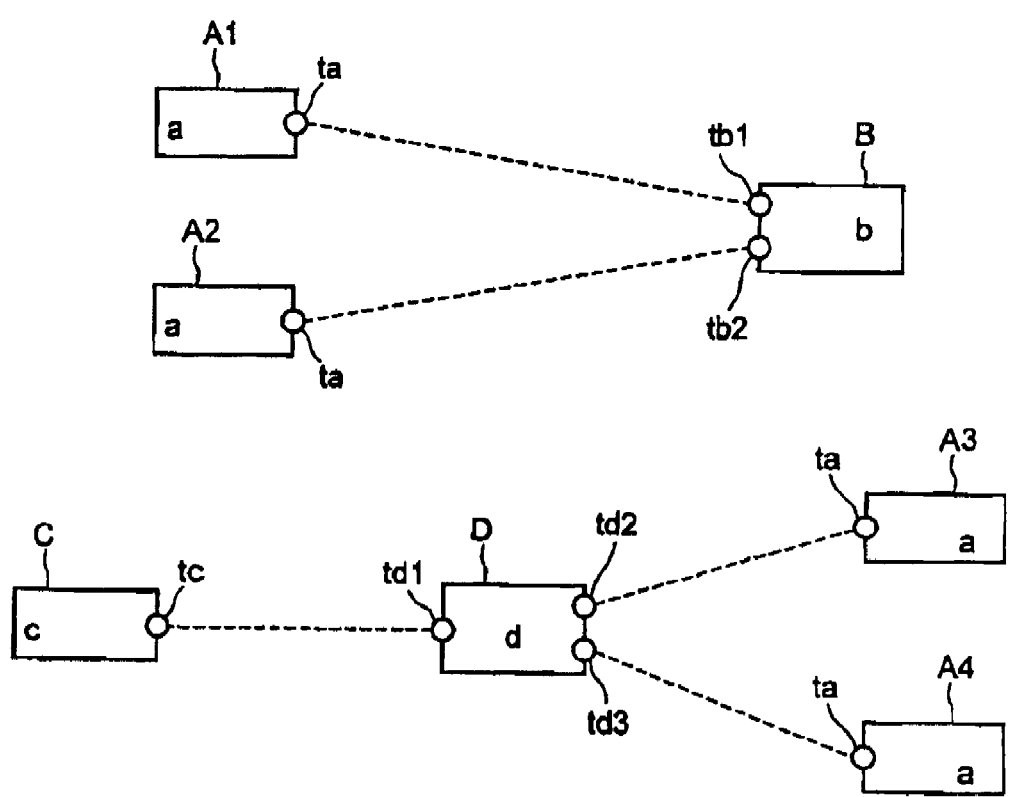
FIG. 4 is an illustration for describing an example of top net list information of the layout design supporting device of FIG. 1.

FIG. 4 shows an example of the top net list information that is inputted through the various information input part 11. As shown in FIG. 4, the top net list information includes seven hierarchy macro blocks such as the first hierarchy macro blocks A1-A4, the second hierarchy macro block B, the third hierarchy macro block C, and the fourth hierarchy macro block D. Among those, used as the first hierarchy macro blocks A1-A4 are the same-type (same function) of hierarchy macro blocks (macro type name: a). For the second hierarchy macro block B, the third hierarchy macro block C, and the fourth hierarchy macro block D, used are the macro blocks with the macro type names b, c, and d, respectively.

A macro terminal ta is formed in the hierarchy macro block A1, a macro terminal ta is formed in the hierarchy macro block A2, a macro terminal ta is formed in the hierarchy macro block A3, and a macro terminal ta is formed in the hierarchy macro block A4. A macro terminal tb1 and a macro terminal tb2 are formed in the hierarchy macro block B, and a macro terminal tc is formed in the hierarchy macro block C. A macro terminal td1, a macro terminal td2, and a macro terminal td3 are formed in the hierarchy macro block D.

Reference numerals ta, tb1, tb2, tc, td1, td2, and td3 indicate the macro terminal names of the hierarchy macro blocks. The connecting relations between each of the macro terminals are illustrated with broken lines.

(Macro Net List Information)

As shown in FIG. 3, the macro net list information storage part 84 includes: macro net list information 84a (first macro net list information; for example, a state of FIG. 6) in which the connecting relation of functional elements (for example, logic circuit elements) within the macro block is defined, which is a state immediately after the input of information; and changed macro net list information 84b (second macro net list information; for example, a state of FIG. 16) in which the macro terminal names of the plurality of the same-type macro blocks are changed, all the terminals are allotted, and connecting relations between the internal functional elements are defined. The information transits in this order.

Figure 6:
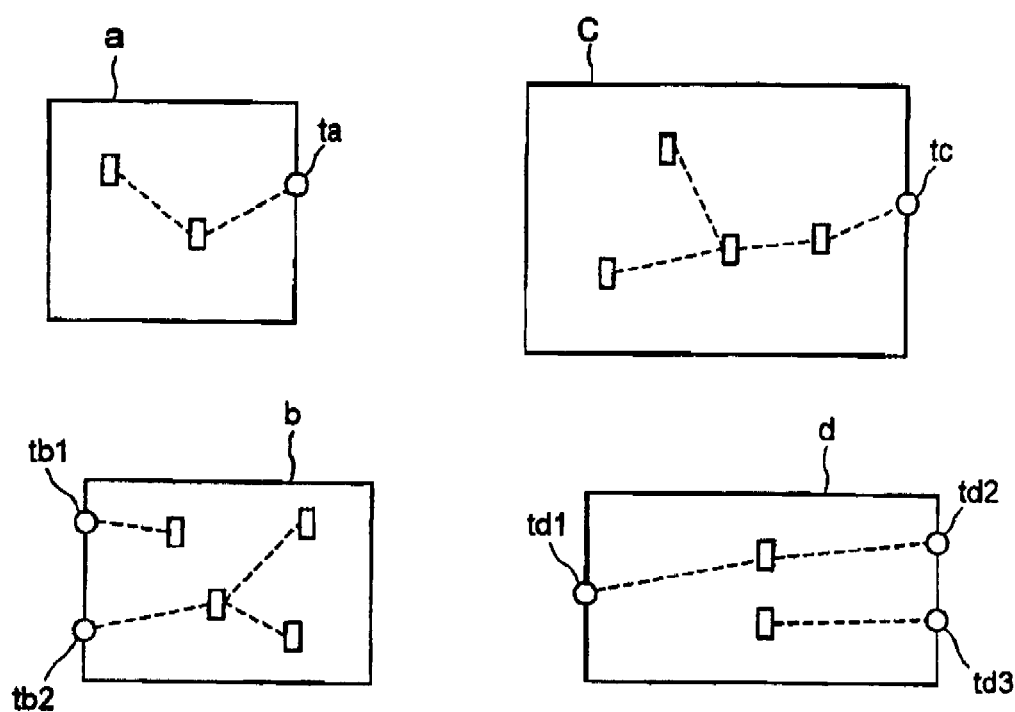
FIG. 6 is an illustration for describing an example of contents of macro net list information of the layout design supporting device of FIG. 1.

FIG. 6 shows an example of the macro net list information stored in the macro net list information storage part 86. The connecting relations between the logic circuit elements provided within the hierarchy macro blocks and the macro terminals of the hierarchy macro blocks are illustrated with broken lines.

(Macro Change List Information)

As shown in FIG. 3, the hierarchy macro change list information storage part 85 stores macro change list information 85a.

FIG. 9 shows an example of the hierarchy macro change list information according to the exemplary embodiment. As shown in FIG. 9, the hierarchy macro change list information includes areas where the macro names before being changed and the macro names after being changed are defined (corresponding relation between the unchanged macro names and changed macro names). Further, the hierarchy macro change list information includes areas where the macro terminal names before being changed and the macro terminal names after being changed are defined (corresponding relation between the unchanged macro terminal names and changed macro terminal names). Furthermore, each of these areas is related to the type names of the macros.

Therefore, the hierarchy macro change list information includes a first area for storing the information regarding macro type names A1, A2, A3, A4, - - - , a second area for storing the information regarding the original macro names a, a, a, a, - - -, a third area for storing the information regarding changed macro names a1, a2, a3, a4, - - - , a fourth area for storing the information regarding original terminal names ta, ta, ta, ta, - - - , and a fifth area for storing the information regarding the changed terminal names ta_1, ta_2, ta_3, ta_4, - - - .

(Macro Layout Information)

As shown in FIG. 3, the macro layout information storage part 86 includes: macro layout information 86a (first macro layout information) in which the number of functional elements (for example, logic circuit elements) within the macro blocks and arranged relations thereof are defined; and changed macro layout information 86b (second macro layout information; for example, a state of FIG. 18) in which wiring layout processing between each macro terminal and a specific functional element is performed in regular macro blocks, and wiring layout processing between the entire allotted macro terminals and specific functional element is performed in a plurality of same-type macro blocks. The information transits in this order.

Figure 18:
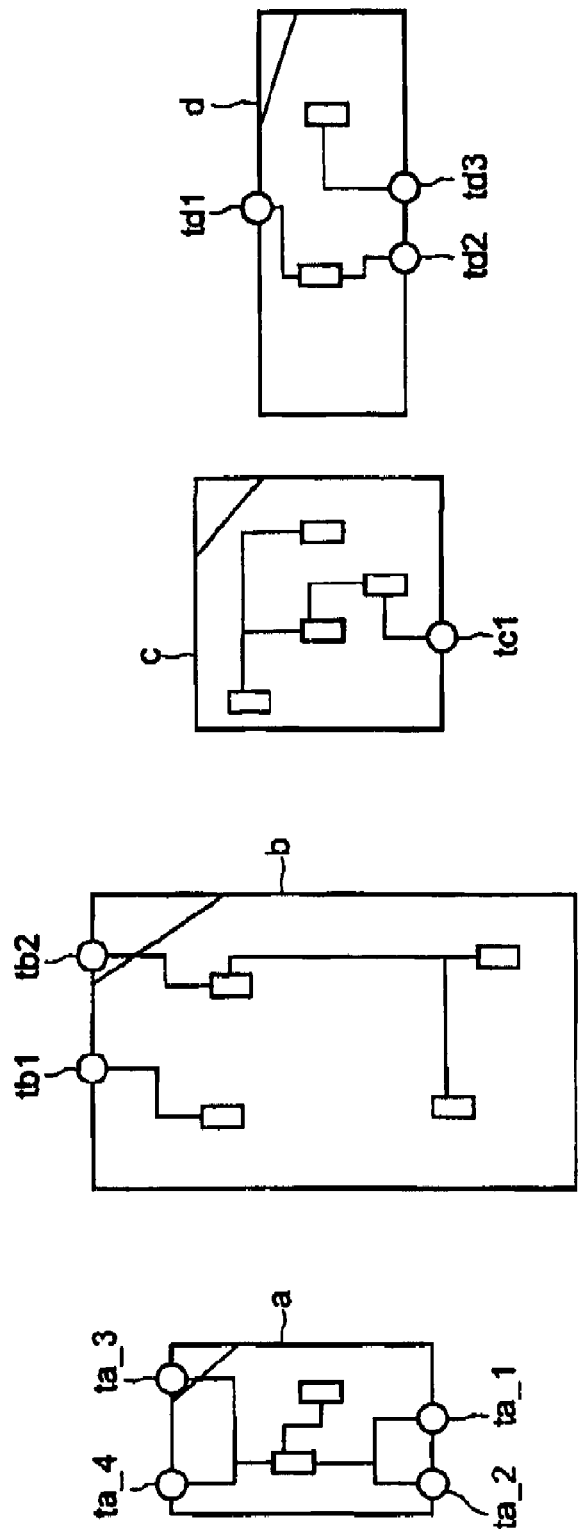
FIG. 18 is an illustration for describing an example of layout of each macro after performing wiring layout processing within the macros with the layout design supporting device of FIG. 1.

FIG. 18 shows the layout of each hierarchy macro block after being wired. As shown in FIG. 18, originally provided macro terminals are arranged in the different types of macro blocks b, c, and d. That is, the macro terminals tb1 and tb2 are arranged for the macro block b. The macro terminal tc1 is arranged for the macro block c. The macro terminals td1 and td2, and td3 are arranged for the macro block d.

In the meantime, for the macro blocks a that are the plurality of same-type macro blocks, all the terminals such as the macro terminal ta_1, the macro terminal ta_2, the macro terminal ta_3, and the macro terminal ta_4 of the respective macro blocks a1, a2, a3, and a4 considered as different types are arranged.

In addition, the wiring from the logic circuit element inside the macro block a is connected towards all the terminals ta_1, ta_2, ta_3, and ta_4. With this, the macro blocks that are considered different on the top layout can be standardized on the macro layout, so that those can sufficiently function as the macros.

Under a state before calculation of the second coordinate position and the like is performed, the macro layout information shows the state where the macro terminal and each functional element are not wired inside the macro blocks. Thus, it is considered that before performing the wiring layout processing (macro layout processing) inside the macro blocks, the relative positional relation between the macro terminals and each functional element can be determined relatively flexibly (provided that the environmental condition, i.e. the positional relation between the macro blocks, is ignored). Therefore, such macro block is considered as a macro block whose property is slightly different from a regular macro block (macro block whose macro terminal position is fixed, and the wiring between the functional element and the macro terminal are determined), and it can be considered as a macro block in a middle of fabricating process.

Further, under a state where all the macro terminals are arranged in the same-type macro blocks, the wiring layout processing is performed from a specific functional element towards the entire terminals. The macro block in this state is also a special macro block. Such macro block is formed by considering the environmental condition of the surroundings of the macro block (after calculating the optimum arranging positions of the macro terminals). Thus, it can be considered as a general-purpose macro block that can be applied to all of the plurality of same-type macro blocks. However, it is necessary to have a structure for deleting the extra wiring to be described later.

(Chip Layout Information)

As shown in FIG. 3, the chip layout information storage part 87 includes: chip layout information 87a (first chip layout information; for example, a state of FIG. 20) in which the top layout information is merged with the macro layout information; and deleted-state chip layout information 87b (second chip layout information; for example, a state of FIG. 21) in which the extra wiring part is deleted. The information transits in this order.

(Schematic Operations of Layout Design Supporting Device)

The integrated circuit layout design supporting device 1 according to the exemplary embodiment configured in the manner described above roughly operates as follows. That is, as shown in FIG. 1, the various information input part 11 inputs information required for designing layout of an LSI, such as the physical library information of the LSI, the top layout information, the top net list information, the macro net list information.

When a plurality of same-type hierarchy macro blocks are used in the top layout information and the top net list information in the arrangement after being inputted through the various information input part 11, the top hierarchy changing part 21 replaces those hierarchy macro blocks with other macro blocks that have different names but the same size and same terminals to change the top layout information (first top layout information) and the top net list information (first top net list information) to be in (second) top layout information and (second) top net list information, respectively. Further, the top hierarchy changing part 21 stores the changed result to the hierarchy macro change list information storage part 85 as the hierarchy macro change list information.

Figure 7:
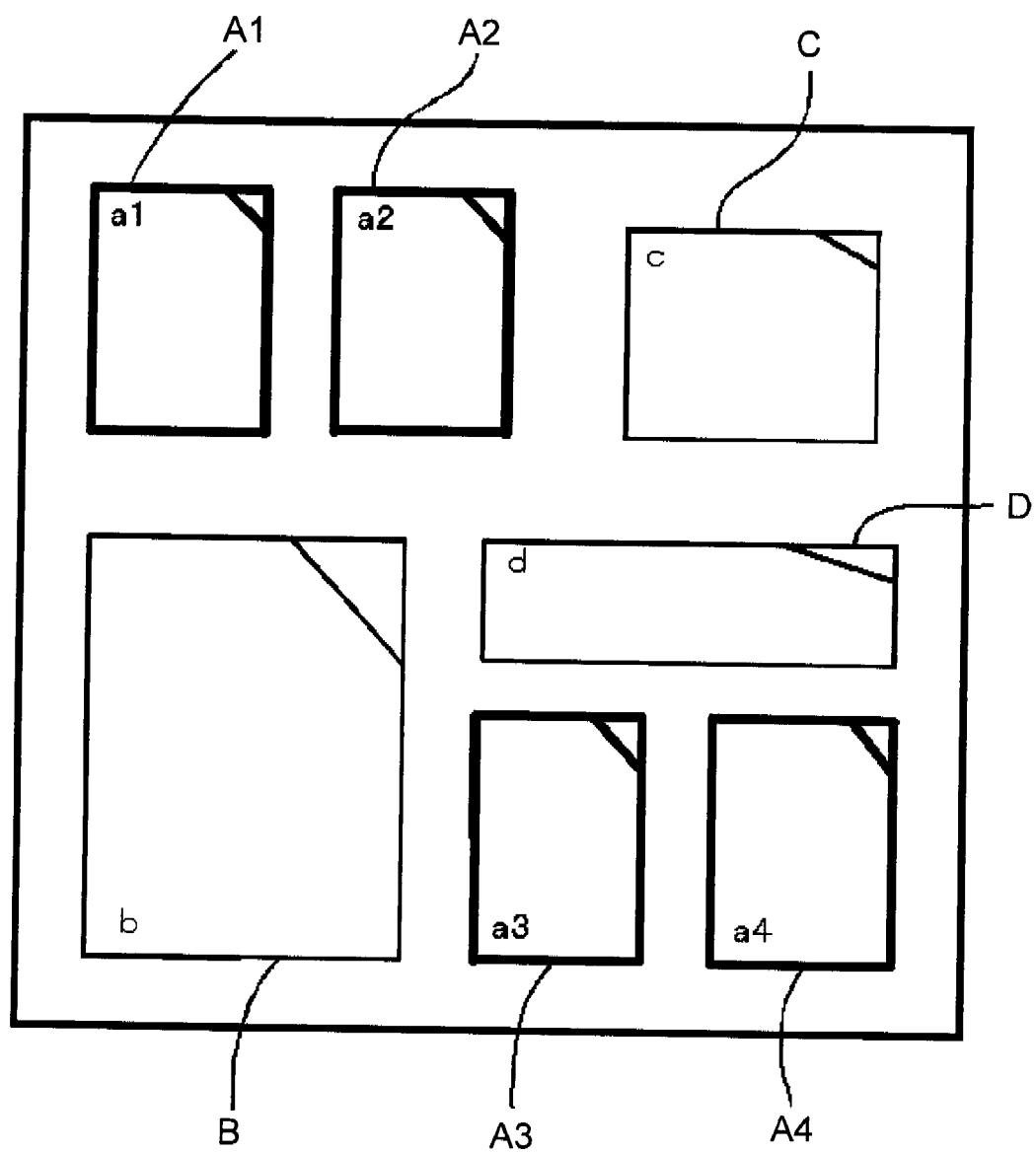
FIG. 7 is an illustration for describing and showing an example of the contents of the top layout information after names of same-type macros are changed with the layout design supporting device of FIG. 1.
Figure 8:
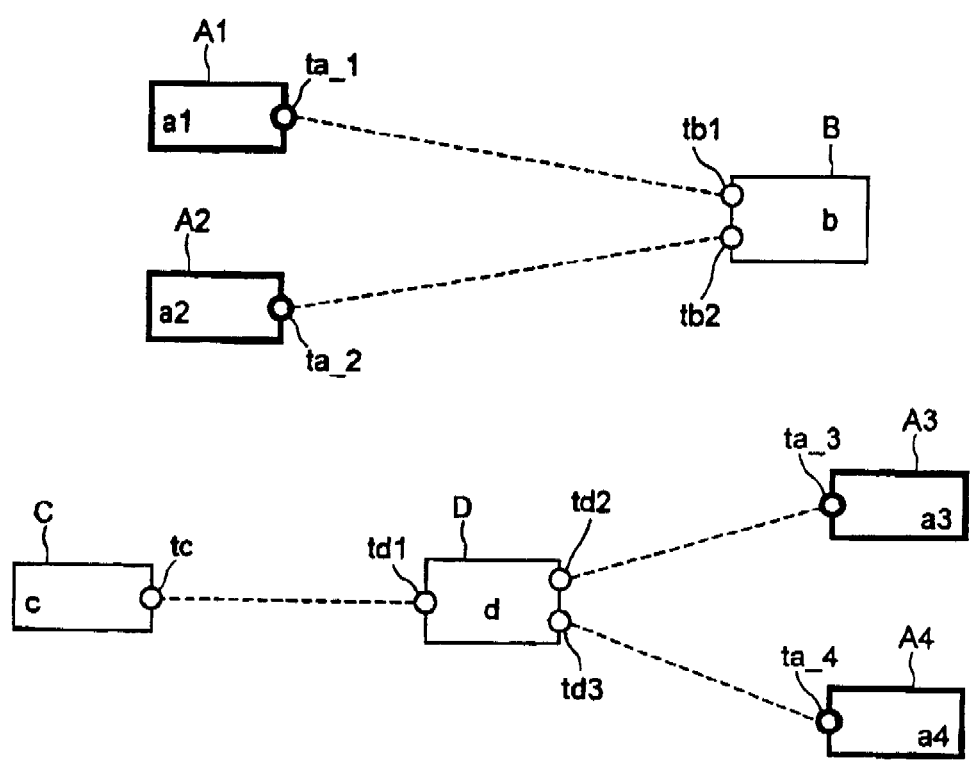
FIG. 8 is an illustration for describing and showing an example of the contents of the top net list information after the names of the same-type macros and names of macro terminals thereof are changed with the layout design supporting device of FIG. 1.

Specifically, as shown in FIG. 7 and FIG. 8, the hierarchy macro blocks A1-A4 are used as the same macro type a. Thus, those are changed to other macro names such as a1, a2, a3, and a4. Further, the terminals ta on the hierarchy macros a are changed to other terminal names such as ta_1, ta_2, ta_3, and ta_4, respectively. The corresponding relations of the macro names, the macro type names, and the terminal names before and after the changes are registered to the hierarchy macro change list information storage part 85 as the macro change list information (FIG. 9).

The hierarchy macro terminal coordinate determining part 31 refers to the top layout information (second top layout information) and the top net list information (second top net list information) changed by the top hierarchy changing part 21 and, based on the positional relation between each of the hierarchy macro blocks and the connecting relation between each of the hierarchy macro blocks in the top net list information, arranges the macro terminals at the positions with which the distance between the macro terminals of the hierarchy macro blocks becomes short and updates the top layout information (second top layout information) to obtain (third) top layout information. Then, the hierarchy macro terminal coordinate determining part 31 stores it to the top layout information storage part 82.

For determining the terminal coordinates, the terminals are arranged at positions with which the distance between the macro terminals becomes short, by referring to the positional relation between the hierarchy macro blocks set in the top layout information stored in the top layout information storage part 82 and the connecting relation between each hierarchy macro blocks in the top net list information.

Figure 13:
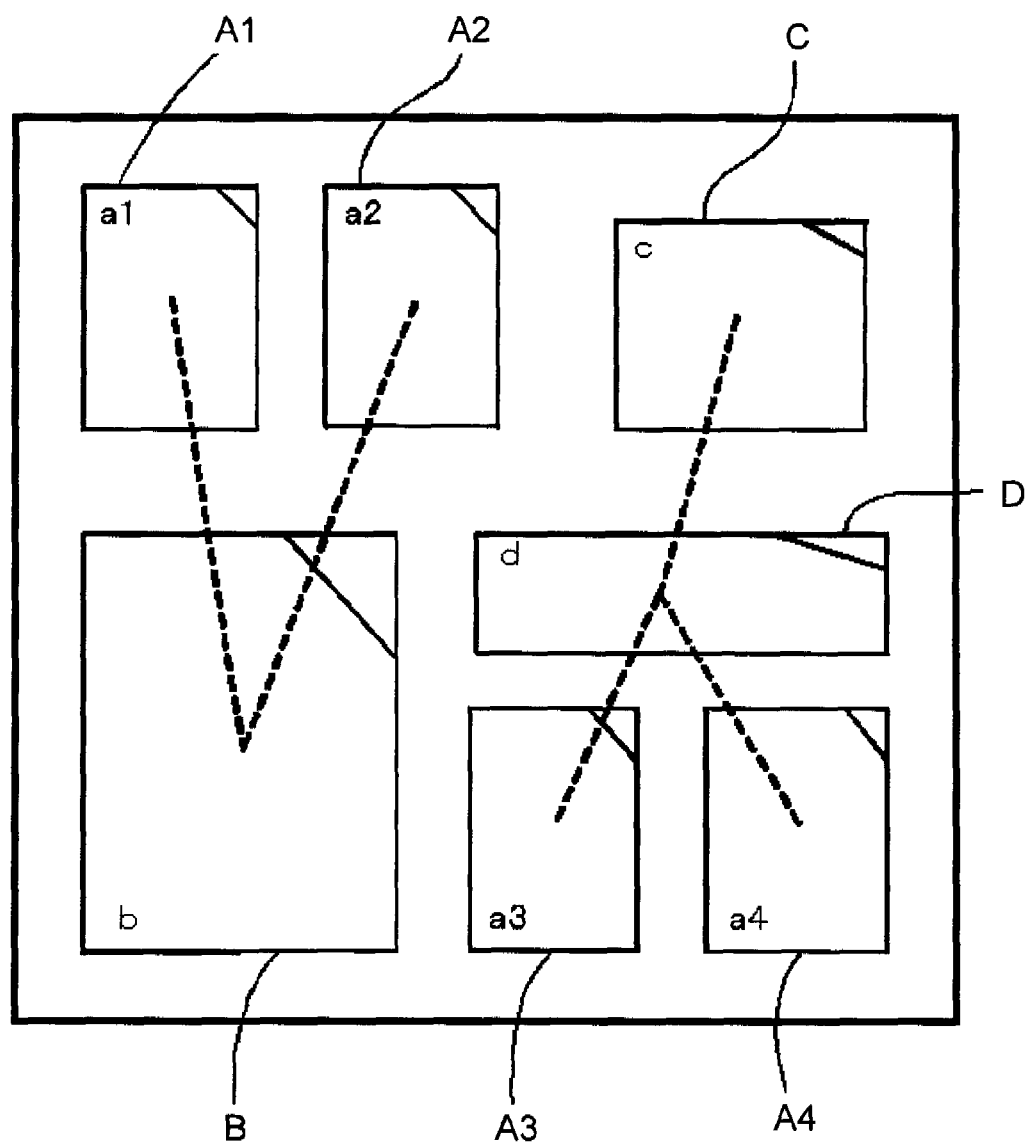
FIG. 13 is an illustration for describing a way of calculating the macro terminal position with the layout design supporting device of FIG. 1.

As a specific method for calculating the arranging position of the macro terminal, there is a method described in the followings, for example. As shown in FIG. 13, coupling lines (coupling functions) connecting between each of the center points of the hierarchy macro blocks that are in a connected relation are drawn by the center point coupling function calculating part 32. Then, the intersection coordinate calculating part 33 calculates the points at which the coupling lines intersect with the boundary lines (boundary areas) of the macro blocks or the vicinity area thereof (that is, intersection parts).

The terminal arrangement processing part 34 arranges the macro terminals at the intersection parts.

Figure 32:
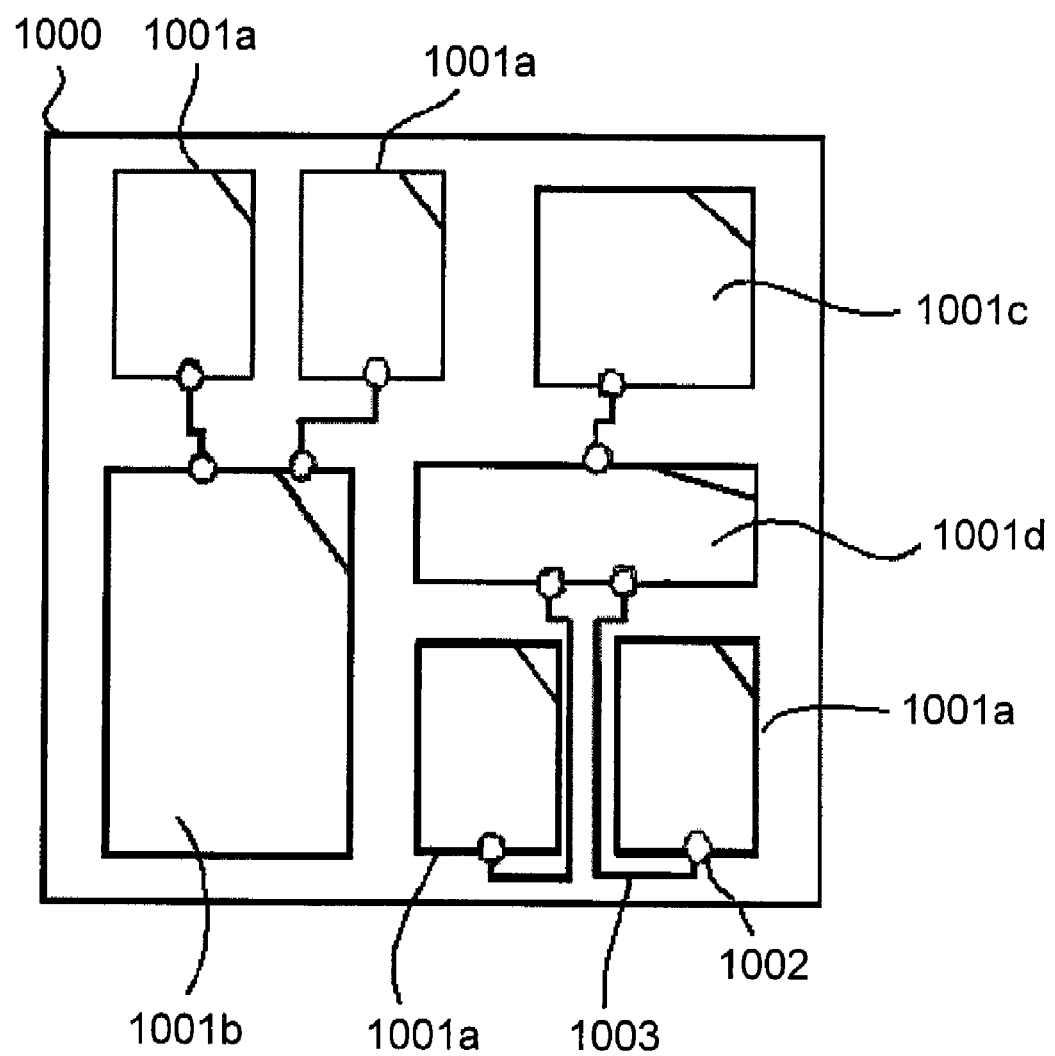
FIG. 32 is an illustration for describing and showing an example of wiring layout processing performed between macro blocks with a layout design supporting device of a related technique.
Figure 33:
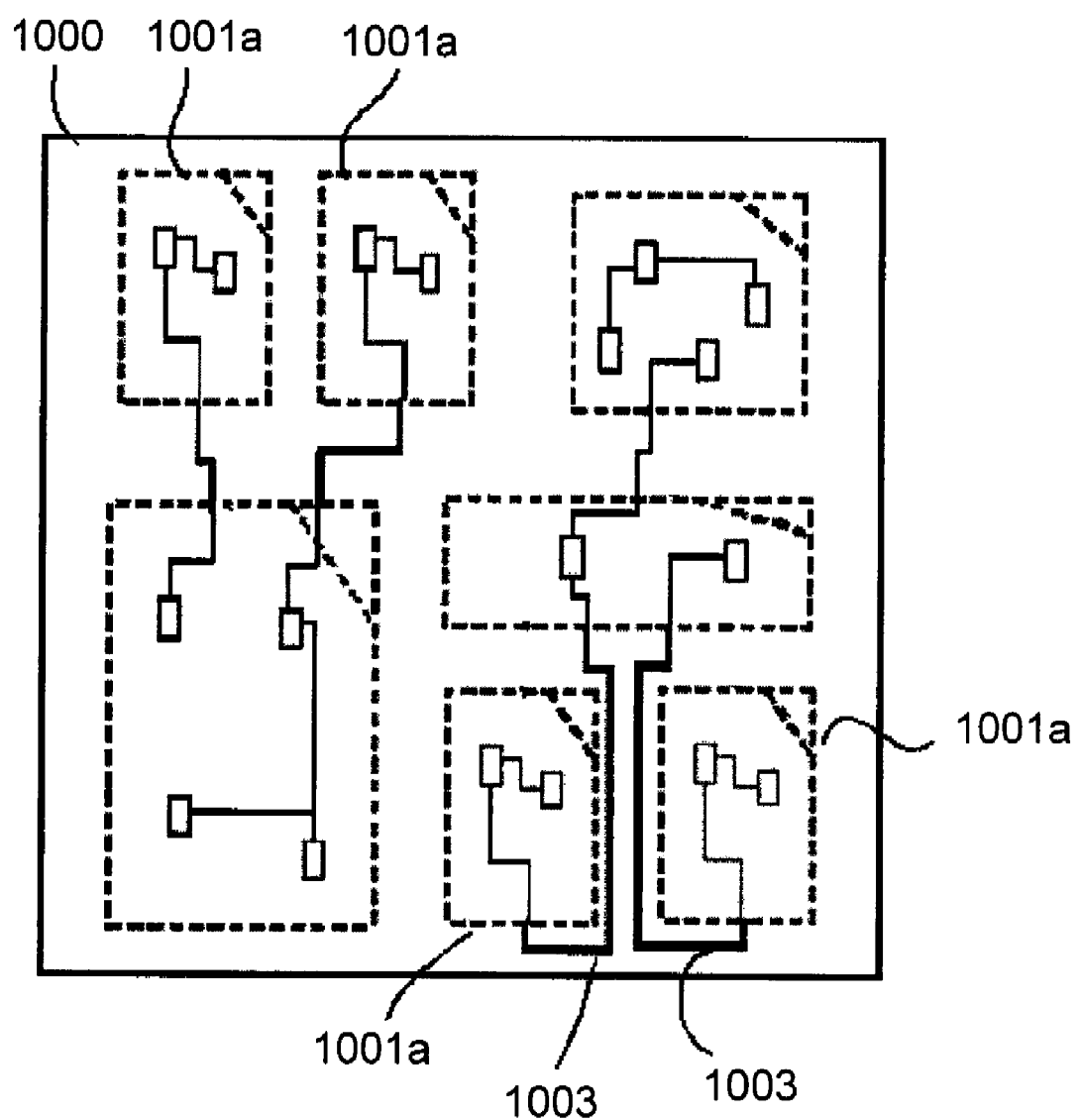
FIG. 33 is an illustration for describing and showing an example of a state of wiring layout after performing layout of a chip with the layout design supporting device of the related technique.
Figure 34:
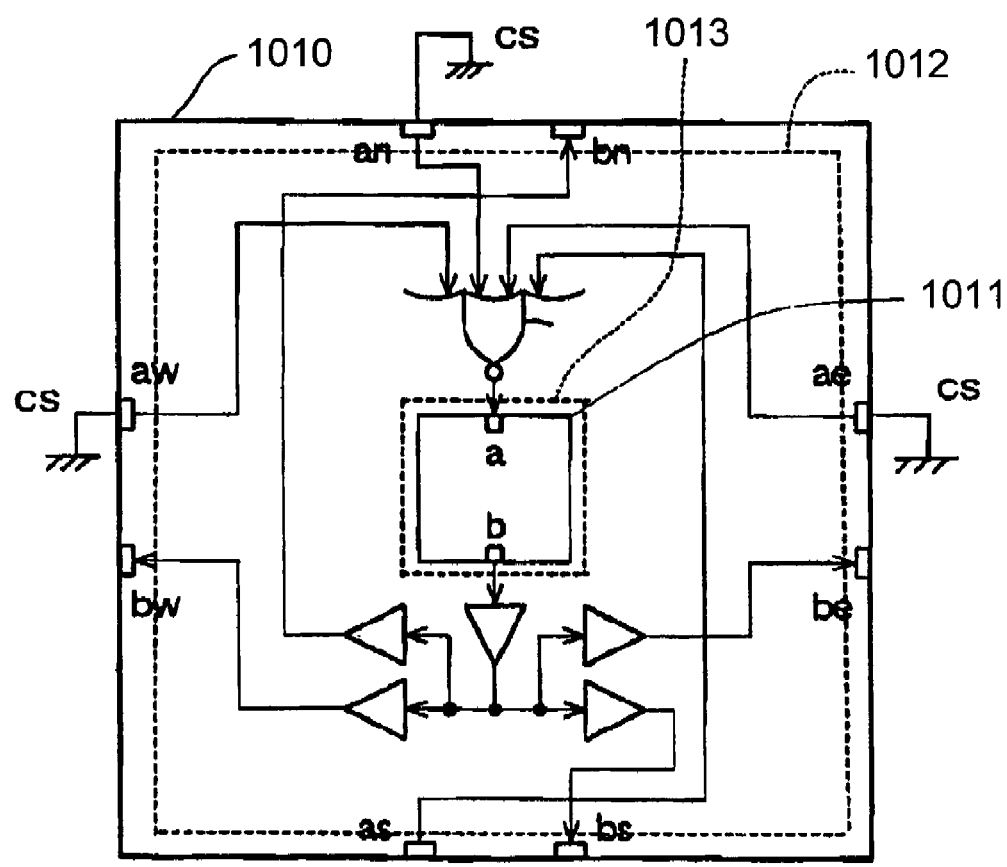
FIG. 34 is an illustration for describing and showing an example of a macro block according to the related technique.
Figure 35:
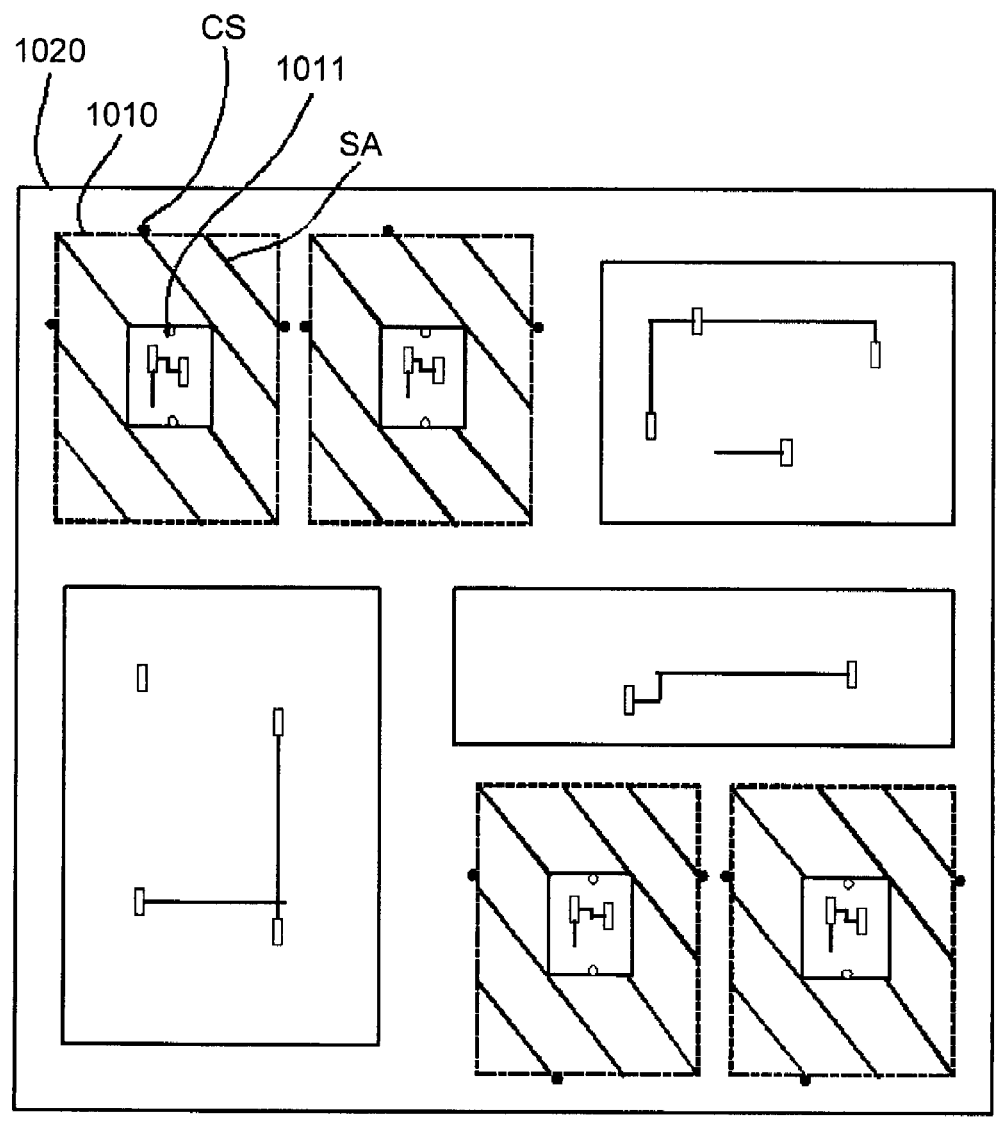
FIG. 35 is an illustration for describing an issue of the macro block according to the related technique.

In traditional cases, the macro names and the terminal names of the hierarchy macro blocks are not changed by the top hierarchy changing part 21. Thus, as shown in FIG. 32, for the terminal coordinates of the same hierarchy macros, all of those are arranged at the same positions. Therefore, the chip layout obtained at last becomes as shown in FIG. 33, so that the length of the wirings between the macros becomes long in part of the top layout area. Meanwhile, first, the exemplary embodiment uses the macro blocks that are in the middle of fabricating process, in which the wiring layout processing between the macro terminals and the functional element is not performed in the internal structure of the macro blocks. Then, macro names are allotted to each of the plurality of same-type macro blocks so as to provide a state where the macro terminals can be arranged at desired positions in advance. Then, the optimum arranging positions of the macro terminals are obtained by the above-described calculation to arrange the macro terminals. With this, the wiring length between the macro blocks can be shortened. In addition, the calculation can be performed respectively for all of the plurality of macro blocks that are arranged on the LSI. Therefore, the wiring lengths between all of the plurality of macro blocks can be formed short, which largely contributes to increasing the operation speed for the entire LSI.

The top layout processing part 35 performs wiring layout processing between each of the hierarchy macro blocks by referring to the top layout information (third top layout information) that is updated by the hierarchy macro terminal coordinate determining part 31 and the top net list information (second top net list information) that is updated by the top hierarchy changing part 21, and creates top layout information (fourth top layout information). Then, the top layout processing part 35 stores it to the top layout information storage part 82.

The hierarchy macro terminal adding and terminal coordinate setting processing part 41, when setting the layout area (macro layout area) within the hierarchy macro block and the macro terminal (external terminal) information of the hierarchy macro block by referring to the top layout information (fourth top layout information) created by the top layout processing part 35, changes the hierarchy macro net list in such a manner that the terminals of the hierarchy macros before being changed by the top hierarchy changing part 21 are all replaced with the terminals within the hierarchy macros that are being changed so as to be allotted to the macro layout area by referring to the macro change list information in the hierarchy macro change list information storage part 85. Then, the hierarchy macro terminal adding and macro terminal coordinate setting processing part 41 stores the changed hierarchy macro net list to the macro net list information storage part 84, while creating the hierarchy macro layout information and storing it to the macro layout information storage part 86.

More specifically, the macro net list is changed (FIG. 16) by replacing the macro terminals ta of the hierarchy macro blocks a before being changed by the top hierarchy changing part 21 with all the terminals ta_1-ta_4 of each of the hierarchy macro blocks a1-a4 that are being changed, by referring to the macro change list information (FIG. 9). For replacing those, the connecting relations between the macro terminals ta and the internal logic circuit elements before the change are to be maintained. For creating the macro layout information, first, the top layout information is referred, and the internal areas of each hierarchy macro are cut out as they are to be allotted as the macro layout areas.

Figure 17:
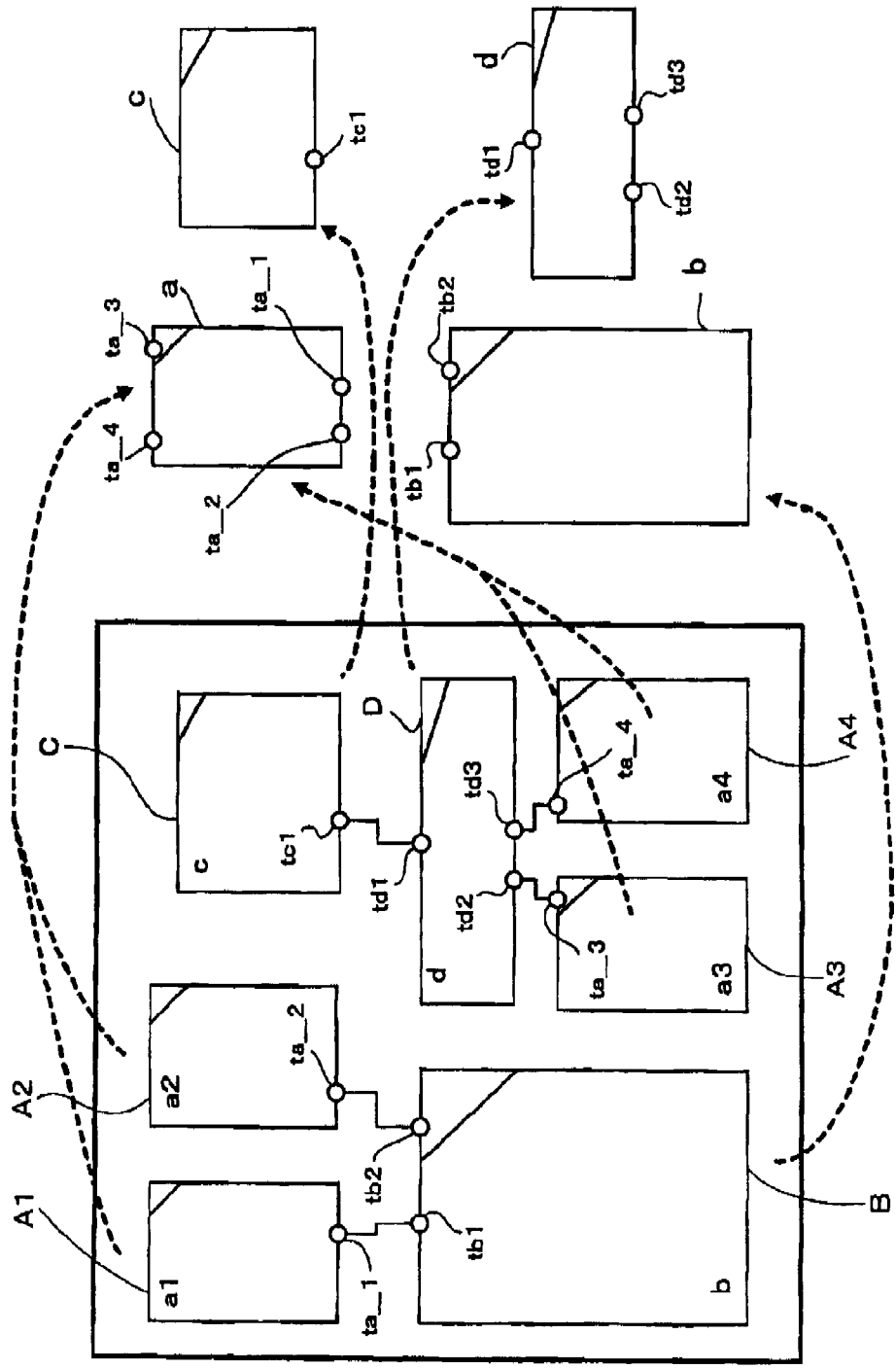
FIG. 17 is an illustration for describing an example of a case where each macro terminal is allotted within a macro layout area with the layout design supporting device of FIG. 1.

Then, each macro terminal of the hierarchy macro blocks is allotted on the macro layout area while keeping the positional relations with respect to the hierarchy macro blocks on the top layout (FIG. 17). At that time, each of the macro terminals ta_1, ta_2, ta_3, and ta_4 of the hierarchy macro blocks a1, a2, a3, and a4 changed by the top hierarchy changing part 21 are allotted as they are at four points as the terminal coordinates of the hierarchy macro block a.

The macro layout processing part 44 performs layout wiring processing within the macro block area by referring to the macro layout information and the macro net list information created by the hierarchy macro terminal adding and terminal coordinate setting processing part 41, and creates macro layout information.

The chip layout creation processing part 54 merges the top layout information created by the top layout processing part 35 with the macro layout information created by the macro layout processing part 44 so as to create chip layout information. Thereafter, the chip layout creation processing part 54 deletes an excessive wiring part (segment) that is not connected as a wiring between the macro blocks and changes the chip layout information.

For the hierarchy macro blocks whose macro type names are changed on the top layout, the macro layout is merged by changing the changed hierarchy macro type names and macro terminal names to the macro type names and macro terminal names in the original state by referring to the macro change list. Note here that "to merge" means to integrate or combine a plurality of files, data, objects, or the like according to a certain rule.

Figure 19:
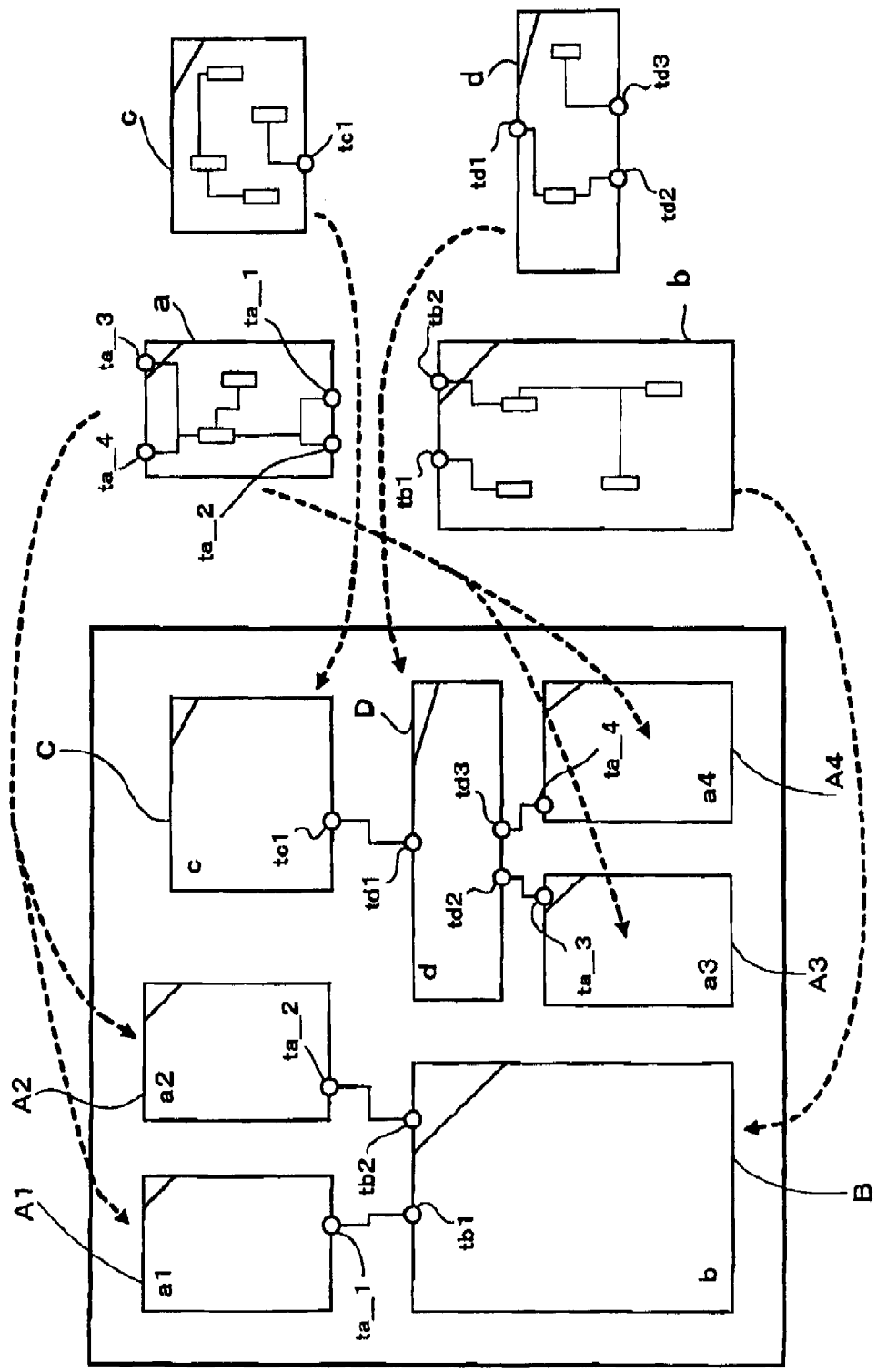
FIG. 19 is an illustration for describing an example where the macro layout is merged with the top layout in the layout design supporting device shown in FIG. 1.
Figure 20:
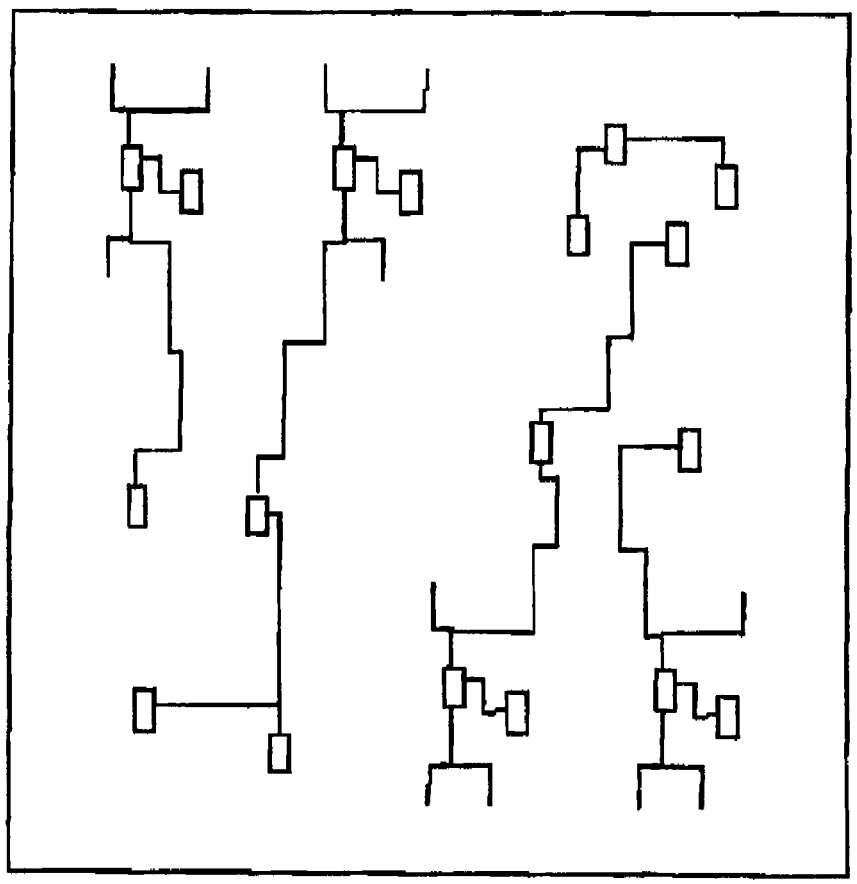
FIG. 20 is an illustration for describing an example of a state where wiring is floated after the macro layout is merged with the top layout in the layout design supporting device shown in FIG. 1.

Referring to FIG. 19, for the hierarchy macro blocks A1-A4 with the macro type names of a1-a4, the macro layout of the hierarchy macro block a is merged with the top layout in this exemplary embodiment. The wirings connected to each macro terminal are connected to the wirings on the top layout by merging the layout. For the case where the terminal are copied by the hierarchy macro terminal adding and macro terminal coordinate setting processing part 41, the wiring is connected to only one of those terminals, and the wirings connected to the rest of the terminals are not connected to the logic circuit elements and are in a floating state (FIG. 20). Thus, those extra wirings are deleted thereafter.

Figure 21:
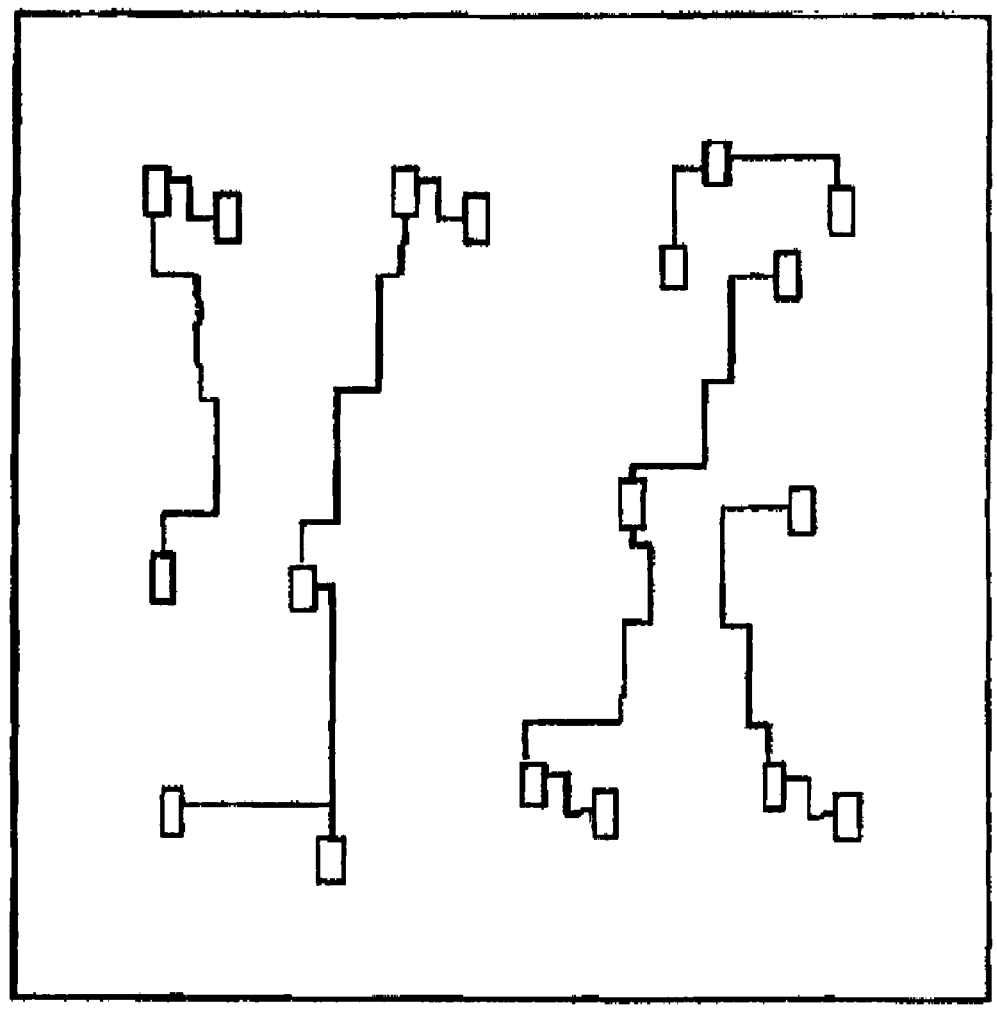
FIG. 21 is an illustration for describing an example of a state after deletion processing is performed, after the macro layout is merged with the top layout in the layout design supporting device shown in FIG. 1.

Specifically, for the wirings on the chip layout, the extra wiring deletion processing part 56 searches the wirings whose end point of each segment configuring the wirings is not connected to other segments or logic circuit elements Then, the extra wiring deletion processing part 56 performs deletion until there is no more such segment. FIG. 21 shows the chip layout after the deletion.

At last, the arranged wiring result output processing part 61 outputs the chip layout information obtained by the chip layout creation processing part 54.

When the plurality of same-type hierarchy macros are used in the layout of the LSI that employs the hierarchy layout method as described above, those macro blocks are considered as different macros and the coordinates of the macro terminals are determined to design the top layout (wiring processing between the macros). For the macro layout, the wiring processing of the macros is performed only once to connect the wirings to all the terminals that are set as being at different coordinates. After merging the top layout with the macro layout, extra wirings whose connection between the macros is uncompleted are deleted. With this, detour routing of the wirings between the macros can be avoided while keeping the uniformity of the macro layout so as to improve the wiring property of the entire LSI and to suppress deterioration in the wiring delay time.

(Regarding Changes in Macro Names and Terminal Names)

Changes in the macro names and the terminals names performed in the exemplary embodiment are peculiar in respect that the changing operations thereof are not only performed for simply changing those but are also performed selectively in accordance with each layout processing (top layout processing, macro layout processing, chip layout processing) or the layout information and the net list information. This point will be described in detail hereinafter.

FIG. 10 shows an illustration for describing at what point (top layout, macro layout, chip layout) the macro names and the terminals names are to be changed. As shown in FIG. 10, when a plurality of same-type macro blocks are formed, the common macro name is used for the plurality of same-type macro blocks (or the same function macro blocks) and the common terminal name is used for the macro terminals of the same-type macro blocks at a stage immediately after input of the information.

At a stage of the top layout related processing, individual macro names are used for the plurality of same-type macro blocks so that those can be considered as different macro blocks, and individual terminal names are used for each macro terminal of each of the same-type macro blocks that are considered as different.

More specifically, at a top hierarchy changing stage that is a preprocessing of the top layout related processing, the common macro names are changed to the individual macro names, and the common terminal names are changed to the individual terminal names. It is necessary to change the macro names and the terminal names for each of the corresponding sections of the top layout information and the top net list information, respectively. Through changing the names in that way, it becomes possible to calculate the terminal coordinate positions individually.

Further, the individual macro names and the individual terminal names are used also at a stage of the top layout processing. This is for performing the wiring layout processing for connecting the wiring between each of the macro terminals.

At a stage of the macro layout related processing, the common macro names are used for the plurality of same-type macro blocks, and the individual terminal names are used for the macro terminals of each of the plurality of the same-type macro blocks that are considered as different macro blocks.

More specifically, at a macro terminal adding stage that is a preprocessing of the macro layout related processing, all of the individual terminals of each of the same-type macro blocks considered as different macro blocks are arranged (FIG. 17) while the common macro name is kept for one of the same-type macro blocks (halfway-created macro blocks: general name for the macro blocks in the macro net list information and the macro layout information) Use of the macro blocks under the common macro names and the terminals under the individual terminal names is applied in each of the corresponding sections of the macro layout information and the macro net list information. Through changing the names in this manner, the wiring layout processing (micro layout) performed once within the same-type macro block can be applied to all the same-type macro blocks that are considered as different macro blocks.

Further, the common macro names and the individual terminal names are used also at a stage of the macro layout processing. This is for performing the wiring layout processing for connecting the wirings between the functional element and each of the macro terminals.

At a stage of the chip layout related processing, the common macro names are used for the plurality of same-type macro blocks, and the common terminal name is used for each of the macro terminals. The names are returned to the original state at a stage of chip layout.

(Control System Related to Changing Macro Names and Terminal Names)

Figure 11:
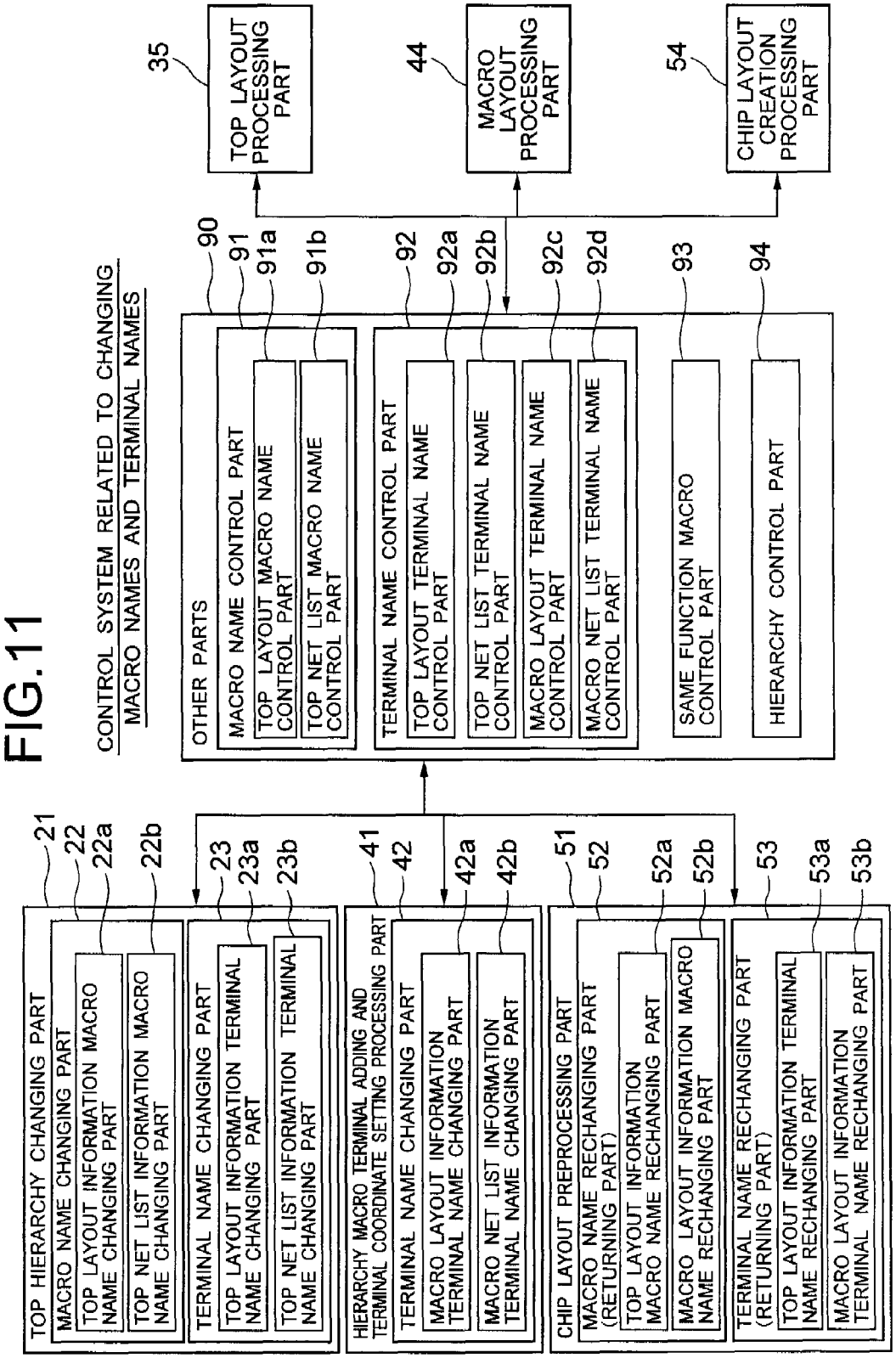
FIG. 11 is a block diagram showing details of a control system for performing changing processing of the macro names and the terminal names with the layout design supporting device of FIG. 1.

Next, a control system related to changing the macro names and terminal names will be described by referring to FIG. 11. FIG. 11 is a block diagram in which the parts in the layout design supporting device of FIG. 1 relating to changing the macro names and terminal names are picked up, and the parts related to the controls thereof are illustrated in an exaggerated way.

As shown in FIG. 11, the control system includes the top hierarchy changing part 21, the hierarchy macro terminal adding and macro terminal coordinate setting processing part 41, a chip layout preprocessing part 51, the top layout processing part 35; the macro layout processing part 44; the chip layout creation processing part 54; and the other parts 90 for controlling each of those parts.

The macro name changing part 22 of the top hierarchy changing part 21 includes: a top layout information macro name changing part 22a for performing processing to change the common macro names applied to the same-type macro blocks in the top layout information into the individual macro names; and a top net list information macro name changing part 22b for performing processing to change the common macro names applied to the same-type macro blocks in the top net list information into the individual macro names.

The terminal name changing part 23 of the top hierarchy changing part 21 includes: a top layout information terminal name changing part 23a for performing processing to change the common terminal names applied to the macro terminals of the same-type macro blocks in the top layout information into the individual terminal names; and a top net list information terminal name changing part 23b for performing processing to change the common terminal names applied to the macro terminals of the same-type macro blocks in the top net list information into the individual terminal names.

A terminal name changing part 42 of the hierarchy macro terminal adding and terminal coordinate setting processing part 41 includes: a macro layout information terminal name changing part 42a for performing processing to change the common terminal names applied to the macro terminals of the same-type macro blocks in the macro layout information into the individual terminal names; and a macro net list information terminal name changing part 42b for performing processing to change the common terminal names applied to the macro terminals of the same-type macro blocks in the macro net list information into the individual terminal names.

The chip layout preprocessing unit 51 includes a macro name rechanging part 52 for rechanging the macro names, and a terminal name rechanging part 53. The macro name rechanging part 52 includes a top layout information macro name rechanging part 52a, and a macro layout information macro name rechanging part 52b. The terminal name rechanging part 53 includes a top layout information terminal name changing part 53a, and a macro layout information terminal name rechanging part 53b.

The other parts 90 includes: a macro name control part 91 for controlling each part related to changing operations of the macro names performed by the top hierarchy changing part 21 and the chip layout preprocessing part 51; a terminal name control part 92 for controlling each part related to changing operations of each terminal name performed by the top hierarchy changing part 21, the hierarchy macro terminal adding and terminal coordinate setting processing part 41, and the chip layout preprocessing part 51; a same-function macro control part 93 for conducting controls of the entire operations related to changing the names; and a hierarchy control part 94 for conducting general controls over each layout processing and changing of the names.

The same-function macro control part 93 performs controls over the macro names and the terminal names of the same-type macro blocks. The hierarchy control part 94 is capable of controlling the setting of the periods for each processing by switching to the top layout processing part 35, the macro layout processing part 44, and the chip layout processing part 54 as necessary. Further, the hierarchy control part 94 has a function of managing for controlling not to change the individual macro names and individual terminal names of the other different types of macro blocks, which cannot be controlled by the same function macro control part 93.

As shown in FIG. 10 and FIG. 11, for the plurality of same-type macro blocks (the plurality of same-function macros), the macro name control part 91 of the control system having the above-described structure performs a control to keep the state with the common macro names in a period immediately after input of the information. Then, in a period (first period) of the top layout related processing including the top layout processing performed by the top layout processing part 35, the macro name control part 91 performs a control to change the common macro names to the individual macro names by the macro name changing part 22 of the top hierarchy changing part 21 and to keep the state with the individual macro names. Particularly, the names are changed at the time of changing the top hierarchy that is preprocessing of the top layout processing in the top layout related processing. Then, the macro name control part 91 performs a control to keep the state with the individual macro names in the terminal coordinate determining processing and the top layout processing performed thereafter.

When changing the common macro names to the individual macro names, it is necessary to change the macro names in the top layout information and the macro names in the top net list information, respectively. Therefore, when it is shifted from the state immediately after input of the information to the state of the top layout related processing, the macro name control part 91 supplies respective change instruction information to the top layout information macro name changing part 22a and the top net list information macro name changing part 22b of the macro name changing part 22.

Note here that a top layout macro name control part 91a of the macro name control part 91 supplies first changing instruction information to the top layout information macro name changing part 22a of the macro name changing part 22, and a top net list macro name control part 91b supplies second changing instruction information to the top net list information macro name changing part 22b of the macro name changing part 22.

Based on the first changing instruction information, the top layout information macro name changing part 22a searches a plurality of same-type macro blocks in the top layout information and performs processing for changing the common macro names into the individual macro names. Further, based on the second changing instruction information, the top net list information macro name changing part 22b searches a plurality of same-type macro blocks in the top net list information, and performs processing for changing the common macro names into the individual macro names. With this, the computer considers the plurality of same-type macro blocks as different types of macro blocks on the top layout and the top net list.

Further, the macro name control part 91 performs a control to keep the common macro name during a period (second period) of the macro layout related processing including the macro layout processing performed by the macro layout processing part 44.

Further, the macro name control part 91 performs a control to keep the common macro name during a period (third period) of the chip layout related processing including the chip layout processing performed by the chip layout processing part 54.

The macro name rechanging part 52 of the chip layout preprocessing part 51 performs processing for returning the individual macro names in the top layout information into the common macro names and performs processing for returning the individual macro names in the macro layout information into the common macro names. The former processing is executed when the top layout macro name control part 91a of the macro name control part 91 gives an instruction to the top layout information macro name rechanging part 52a. The latter processing is executed when the macro name control part 91 gives an instruction to the macro layout information macro name rechanging part 52a.

When rechanging the individual macro names to the common macro names to be in the original state, it is necessary to rechange the macro names in the top layout information and the macro names in the macro layout information, respectively. Therefore, in the chip layout related processing, the macro name control part 91 supplies respective change instruction information to the top layout information macro name rechanging part 52a and the macro layout information macro name rechanging part 52b of the macro name rechanging part 52.

Note here that the top layout macro name control part 91a of the macro name control part 91 supplies first changing instruction information to the top layout information macro name rechanging part 52a of the macro name rechanging part 52, and a macro layout macro name control part (not shown) of the macro name control part 91 supplies second changing instruction information to the macro layout information macro name rechanging part 52b of the macro name rechanging part 52.

Based on the first changing instruction information, the top layout information macro name rechanging part 52a searches a plurality of same-type macro blocks in the top layout information and performs processing for rechanging the individual macro names into the common macro names to be in the original state. Further, based on the second changing instruction information, the macro layout information macro name rechanging part 52b searches a plurality of same-type macro blocks in the macro layout information, and performs processing for rechanging the individual macro names into the common macro names to be in the original state. With this, the computer considers the plurality of same-type macro blocks as the same types of macro blocks on the top layout and the macro layout.

The macro names regarding the same-type macro blocks are controlled by the same-function macro control part 93. For the different types of macro blocks other than the same-type macro blocks, the macro name control part 91 controls to keep those under the individual names in all the steps by an instruction from the hierarchy control part 94.

Meanwhile, for the plurality of same-type macro blocks (the plurality of same-function macros), the terminal name control part 92 performs a control to keep the state with the common terminal names in a period immediately after input of the information. Then, in a period (first period) of the top layout related processing including the top layout processing performed by the top layout processing part 35, the terminal name control part 92 performs a control to change the common terminal names to the individual terminal names by the terminal name changing part 23 of the top hierarchy changing part 21 and to keep the state with the individual terminal names. Particularly, the names are changed at the time of changing the top hierarchy that is preprocessing of the top layout processing in the top layout related processing. Then, the terminal name control part 92 performs a control to keep the state with the individual terminal names in the terminal coordinate determining processing and the top layout processing performed thereafter.

When changing the common terminal names to the individual terminal names, it is necessary to change the terminal names in the top layout information and the terminal names in the top net list information, respectively. Therefore, when it is shifted from the state immediately after input of the information to the state of the top layout related processing, the terminal name control part 92 supplies respective change instruction information to the top layout information terminal name changing part 23a and the top net list information terminal name changing part 23b of the terminal name changing part 23.

Note here that the top layout terminal name control part 92a of the terminal name control part 92 supplies first changing instruction information to the top layout information terminal name changing part 23a of the terminal name changing part 23, and the top net list terminal name control part 92b supplies second changing instruction information to the top net list information terminal name changing part 23b of the terminal name changing part 23.

Based on the first changing instruction information, the top layout information terminal name changing part 23a searches a plurality of same-type macro blocks in the top layout information and performs processing for changing the common terminal names thereof into the individual terminal names. Further, based on the second changing instruction information, the top net list information terminal name changing part 23b searches a plurality of same-type macro blocks in the top net list information and performs processing for changing the common terminal names thereof into the individual terminal names. With this, the computer considers the macro terminals of the plurality of same-type macro blocks as the macro terminals of different types of macro blocks on the top layout and the top net list.

Next, during a period (second period) of the macro layout related processing including the macro layout processing performed by the macro layout processing part 44, the terminal name control part 92 performs a control to change the common terminal names in the original state to the individual terminal names by the terminal name changing part 42 of the hierarchy macro terminal adding and terminal coordinate setting processing part 41 and to keep the state with the individual terminal names. Particularly, the names are changed at the time of adding the macro terminals, which is preprocessing of the macro layout processing in the macro layout related processing. Then, the terminal name control part 92 performs a control to keep the state with the individual terminal names in the terminal coordinate determining processing and the macro layout processing performed thereafter.

When changing the common terminal names to the individual terminal names, it is necessary to change the terminal names in the macro layout information and the terminal names in the macro net list information, respectively. Therefore, when it is shifted from the state of the top layout related processing to the state of the macro layout related processing, the terminal name control part 92 supplies respective change instruction information to the macro layout information terminal name changing part 42a and the macro net list information terminal name changing part 42b of the terminal name changing part 42.

Note here that a macro layout terminal name control part 92c of the terminal name control part 92 supplies first changing instruction information to the macro layout information terminal name changing part 42a of the terminal name changing part 42, and a macro net list terminal name control part 92d supplies second changing instruction information to the macro net list information terminal name changing part 42b of the terminal name changing part 42.

Based on the first changing instruction information, the macro layout information terminal name changing part 42a searches a plurality of same-type macro blocks in the macro layout information and performs processing for changing the common terminal names into the individual terminal names. Further, based on the second changing instruction information, the macro net list information terminal name changing part 42b searches a plurality of same-type macro blocks in the macro net list information and performs processing for changing the common terminal names into the individual terminal names. With this, the computer considers the macro terminals of the plurality of same-type macro blocks as the macro terminals of different types of macro blocks on the macro layout and the macro net list as well.

Next, during a period (third period) of the chip layout related processing including the chip layout processing performed by the chip layout creation processing part 54, the terminal name control part 92 performs a control to rechange the changed individual terminal names to the common terminal names by the terminal name rechanging part 53 of the chip layout preprocessing part 51 to return those to the original state, and to keep the state with the common terminal names. Particularly, the names are changed at the time of preprocessing of the chip layout processing in the chip layout related processing. Then, the terminal name control part 92 performs a control to keep the state with the common terminal names in the chip layout processing including the merge processing and deletion processing performed thereafter.

When rechanging the individual terminal names to the common terminal names to return those to the original state, it is necessary to rechange the terminal names in the top layout information and the terminal names in the macro layout information, respectively. Therefore, when it is shifted from the state of the macro layout related processing to the state of the chip layout related processing, the terminal name control part 92 supplies respective change instruction information to the top layout information terminal name rechanging part 53a and the macro layout information terminal name rechanging part 53b of the terminal name rechanging part 53.

Note here that the top layout terminal name control part 92a of the terminal name control part 92 supplies first changing instruction information to the top layout information terminal name rechanging part 53a of the terminal name rechanging part 53, and the macro layout terminal name control part 92c supplies second changing instruction information to the macro layout information terminal name rechanging part 53b of the terminal name rechanging part 53.

Based on the first changing instruction information, the top layout information terminal name rechanging part 53a searches a plurality of same-type macro blocks in the top layout information and performs processing for rechanging the individual macro terminal names into the common macro terminal names to be in the original state. Further, based on the second changing instruction information, the macro layout information terminal name rechanging part 53b searches a plurality of same-type macro blocks in the macro layout information and performs processing for rechanging the individual macro terminal names into the common macro terminal names to be in the original state. With this, the computer considers the macro terminals of the plurality of same-type macro blocks as the same macro terminals on the top layout and the macro layout as well.

The terminal names regarding the same-type macro blocks are controlled by the same-function macro control part 93. For the different types of macro blocks other than the same-type macro blocks, the terminal name control part 92 controls to keep those under the individual names in all the steps by an instruction from the hierarchy control part 94.

The above can be summarized as follows. That is, regarding the first period for performing the processing (top layout preprocessing and top layout processing) related to the top layout area (between macro blocks: first layout area), the second period for performing processing (micro layout preprocessing and macro layout processing) related to the macro layout area (within the macro blocks: second layout area), and the third period for performing the processing (chip layout preprocessing and chip layout processing) related to the chip layout area (the area where the macro layout area is merged with the top layout area: third layout area), the macro name control part 91 controls to perform the processing (top layout preprocessing, the top layout processing) in the first period by using the individual macro names that are being changed by the macro name changing part, and controls to perform each of the processing (macro layout preprocessing, macro layout processing, chip layout preprocessing, chip layout processing) in the second period and the third period by using the common macro names of the original state.

The terminal name control part 92 controls to perform each of the processing (top layout preprocessing, the top layout processing, the macro layout preprocessing, the macro layout processing) in the first period and the second period by using the individual terminal names that are being changed by the terminal name changing part 23, and controls to perform the processing (the chip layout preprocessing, the chip layout processing) in the third period by using the common terminal names of the original state.

(Control System Related to Calculating Terminal Positions)

Figure 12:
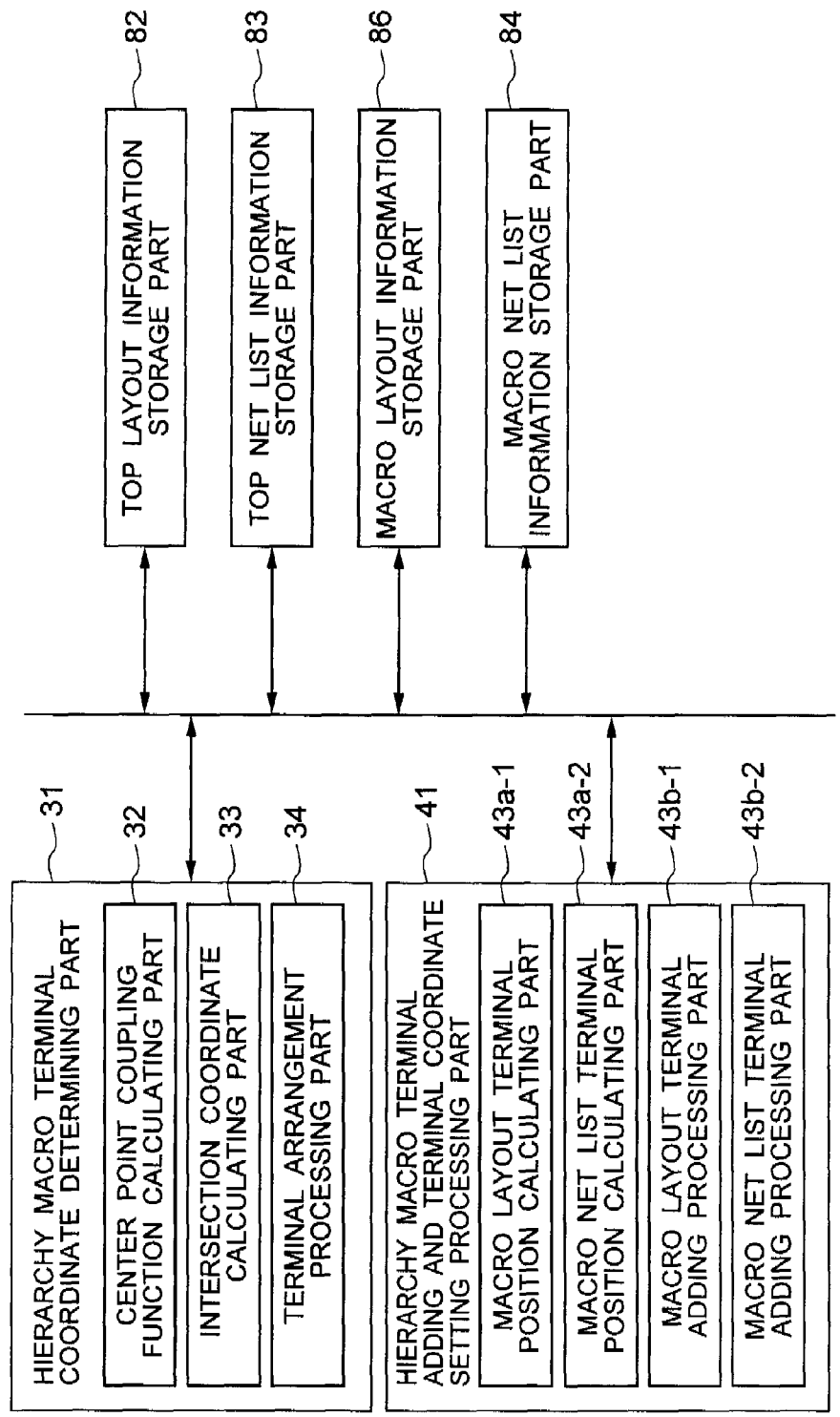
FIG. 12 is a block diagram showing details of a control system for performing terminal position calculating processing with the layout design supporting device of FIG. 1.

The calculating operation of the terminal positions according to the exemplary embodiment is peculiar in respect that it is necessary to perform each calculation in accordance with each layout processing (top layout processing, macro layout processing). This point will be described in detail hereinafter. The control system related to calculation of the terminal positions will be described by referring to FIG. 12. FIG. 12 is a block diagram in which the parts in the layout design supporting device of FIG. 1 relating to calculation of the macro terminal positions are picked up, and the parts related to the control thereof are illustrated in an exaggerated way.

As shown in FIG. 12, this control system includes: the hierarchy macro terminal coordinate determining part 31, the hierarchy macro terminal adding and terminal coordinate setting processing part 41; the top layout information storage part 82; the top net list information storage part 83; the macro layout information storage part 86; and the macro net list information storage part 84.

The hierarchy macro terminal adding and terminal coordinate setting processing part 41 includes: a macro layout terminal position calculating part 43a-1; a macro net list terminal position calculating part 43a-2; a macro layout terminal adding processing part 43b-1; and a macro net list terminal adding processing part 43b-2.

The hierarchy macro terminal adding and macro terminal coordinate setting processing part 41 may include a wiring base end position determining part (not shown) which determines, as the base end of the wiring towards the macro terminal from the functional element, the coordinate position of the intersection part at which the element terminal coupling function (connecting the center point of the functional element block to the macro terminal) intersects with the boundary line of the functional element block, when connecting the wiring between the functional element (for example, logic element) and the macro terminal, in the same manner as that of finding the arranging positions of the macro terminals. Alternatively, the hierarchy macro terminal adding and macro terminal coordinate setting processing part 41 may include a wiring length investigating part for investigating the wiring length between the functional elements and the macro terminals, a functional element identifying part for identifying the types of the functional elements, and a functional element rearranging part for rearranging the functional elements.

As shown in FIG. 12, in the control system related to calculation of the terminal positions configured in the manner described above, the hierarchy macro terminal coordinate calculating part 31 calculates first terminal coordinates, and the hierarchy macro terminal adding and terminal coordinate setting processing part 41 calculates second terminal coordinates and arranges all the terminals in the top layout processing.

More specifically, the center point coupling function calculating part 32 of the hierarchy macro terminal coordinate determining part 31 calculates, among at least two connected macro blocks, first center coordinates of one of the macro blocks and second center coordinates of the other macro block (respective center coordinate calculating function) based on the top layout information (information on positional relation between each of the macro blocks) from the top layout information storage part 82 and the top net list information (information on connecting relation between each of the macro blocks) from the top net list information storage part 83, and calculates a coupling function that connects the first center coordinates and the second center coordinates (for example, a linear function such as a straight line form).

Further, the intersection coordinate calculating part 33 of the hierarchy macro terminal coordinate determining part 31 calculates, regarding two opposing macro blocks, first intersection point coordinates between the coupling function and an opposing side (boundary line) of one of the macro blocks. Further, the intersection coordinate calculating part 33 calculates second intersection point coordinates between the coupling function and an opposing side (boundary line) of the other macro block.

Then, the terminal arrangement processing part 34 of the hierarchy macro terminal coordinate determining part 31 determines the first intersection point coordinates as the position of the macro terminal of one of the macro blocks and arranges the macro terminal for that macro block. Further, the terminal arrangement processing part 34 determines the second intersection point coordinates as the position of the macro terminal of the other macro block and arranges the macro terminal for that macro block. The top layout information after the macro terminals are arranged is accumulated and processed in the top layout information storage part 82. The "first intersection point coordinates" and the "second intersection point coordinates" configure examples of the "optimum coordinate position" of the present invention. Further, the "first intersection point coordinates" and the "second intersection point coordinates" configure examples of the "first coordinate position" of the present invention.

Then, the macro layout terminal position calculating part 43*a*-1 of the hierarchy macro terminal adding and terminal coordinate setting processing part 41 obtains information (terminal coordinates and the like for each macro block) regarding a plurality of same-type macro blocks from the top layout information (terminal coordinate obtaining function), and performs processing for calculating to find at what position the macro terminal of one of the same-type macro blocks is located with respect to one of the vertex of the same-type macro blocks (relative position calculating function). At this point, there is performed processing for transforming the terminal coordinates on the top layout coordinate system into the terminal coordinates on the macro layout coordinate system (coordinate transforming function). With this, the coordinate position is calculated. The calculated coordinate position configures an example of the "second coordinate position" of the present invention.

Further, the macro layout terminal adding processing part 43*b*-1 performs arranging processing of all the terminals for the macro blocks in the macro layout information, based on the calculated terminal coordinates (macro layout coordinate system).

Each of the above-described processing is performed for the macro layout information. Similarly, for the macro net list information, the macro net list terminal position calculating part 43*a*-2 and the macro net list terminal adding part 43*b*-2 perform the respective processing.

With the control system related to the calculation of the terminal positions cofigured in the above-described manner, the optimum coordinate position of the macro terminal is calculated from the intersection point (intersection part) between the coupling line that connects the center points of each of the macro blocks and the boundary line of the macro block. Thus, the distance between each of the macro terminals of each of the macro blocks can be set short, so that the length of the wiring wired between the macro blocks can be formed short. Therefore, it is possible to avoid a bypass wiring and to form the short wiring regardless of the arranging relation (positional relation) of the macro blocks.

With the processing for replacing the terminals in the original state to all the terminals that are being changed, only one-time macro layout processing is required for each of the same-type macro blocks that are considered as different types, through allotting all the macro terminals of each of the same-type macro blocks that are considered as different types in the boundary area of one of the same-type macro blocks.

(Regarding Processing Procedure)

Next, procedures of various types of processing performed by the layout design supporting device having the above-described structure will be described by referring to FIG. 22-FIG. 25.

(Overall Processing)

Figure 22:
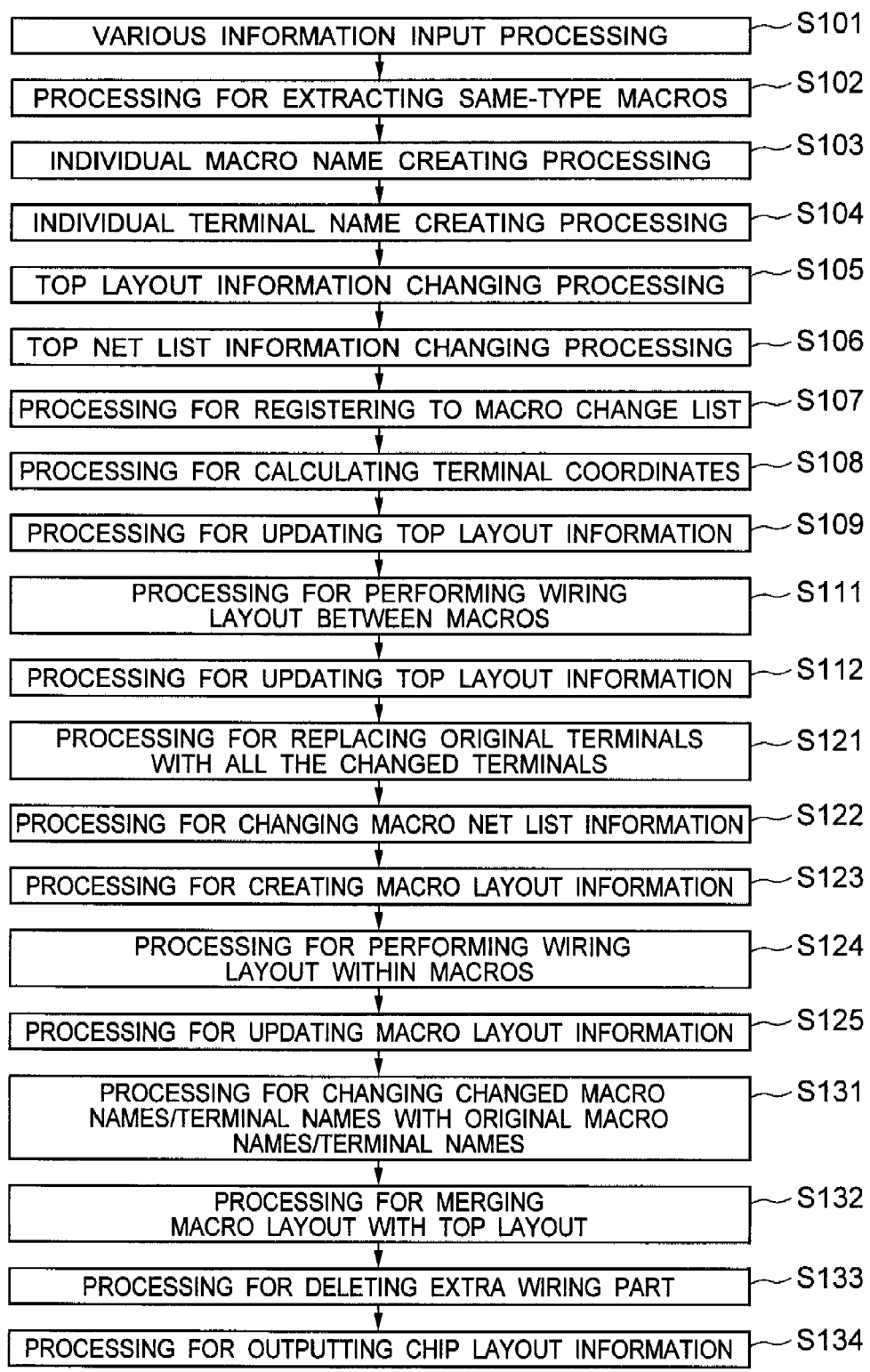
FIG. 22 is a flowchart showing an example of processing order of the layout design supporting device shown in FIG. 1.

First, overall processing will be described by referring to a flowchart of FIG. 22. FIG. 22 is a flowchart showing an example of a processing procedure of the layout design supporting device of FIG. 1. First, performed is processing for inputting various types of information (step S101: various information input step or various information input processing) Examples of the information to be inputted may be physical library information, top layout information, top net list information, and macro net list information.

Next, there is performed processing for finding out whether or not there are a plurality of same-type macro blocks and, if there are, extracting the corresponding same-type macro blocks (step S102: same-type macro block extracting step or same-type macro block extracting processing). In the case of the drawing described above, illustrated as the plurality of same-type macro blocks are only single-type macro blocks A1-A4. However, when there are a plurality of types (first type of F1-F4, second type of G1-G7, and third type of H1-H3, for example), it is also possible without a question to extract each of the types and to perform each of the processing described in the followings for the respective types simultaneously.

Subsequently, in order to change the macro names of the plurality of same-type macro blocks (A1-A4) extracted in the step S102 from the common macro name (a) to individual macro names (a1-a4), processing is performed to generate the individual macro names (step S103: individual macro name generating step or individual macro name generating processing).

Further, in order to change the macro terminal names of the plurality of same-type macro blocks (A1-A4) extracted from the common terminal name (ta) to individual terminal names (ta_1-ta_4), processing is performed to generate the individual terminal names (step S104: individual terminal name generating step or individual terminal name generating processing).

Based on the individual macro names and individual terminal names generated respectively in the steps S103 and S104 described above, there is performed processing for changing the common macro names of the same-type macro blocks in the top layout information into the individual macro names and changing the common terminals names of the same-type macro blocks into the individual terminals names (step S105: top layout information macro name changing step/top layout information terminal name changing step or top layout information macro name changing processing/top layout information terminal name changing processing).

Further, based on the individual macro names and individual terminal names generated respectively in the steps S103 and S104 described above, there is performed processing for changing the common macro names of the same-type macro blocks in the top net list information into the individual macro names and changing the common terminal names of the same-type macro blocks into the individual terminal names (step S106: top net list information changing step or top net list information changing processing. Further, there is performed processing for registering the corresponding relations of the macro names and the terminal names before and after the changes, respectively, as a macro change list (step S107: macro change list registering processing). With the above-described steps S102-S107, the "macro name changing step" and the "terminal name changing step" of the present invention can be configured.

Then, after the macro names and the terminal names are changed, there is performed processing for calculating the optimum coordinate position of the macro terminal in the top layout area (step S108: top layout optimum coordinate position calculating step or top layout optimum coordinate position calculating processing).

After calculating the optimum coordinate positions where the macro terminals are to be arranged, there is performed processing for updating the previous top layout information to the latest top layout information where the macro terminals are arranged at the corresponding positions (step S109: first top layout information updating step or first top layout information updating processing). With the above-described steps S102-S109, the "first terminal coordinate calculating processing step" of the present invention can be configured.

Subsequently, there is performed wiring layout processing between each of the macro blocks (step S111: top layout wiring step or top layout wiring processing. Here, regarding at least two macro blocks, one of the macro terminals of one of the macro blocks is connected to the other macro terminal of the other macro block.

Then, there is performed processing for updating the top layout information in which the macro terminals are arranged to the top layout information in which the wiring is connected (step S112: second top layout information updating step or second top layout information updating processing). With the above-described steps S111-S112, the "first layout processing step" of the present invention can be configured.

Figure 16:
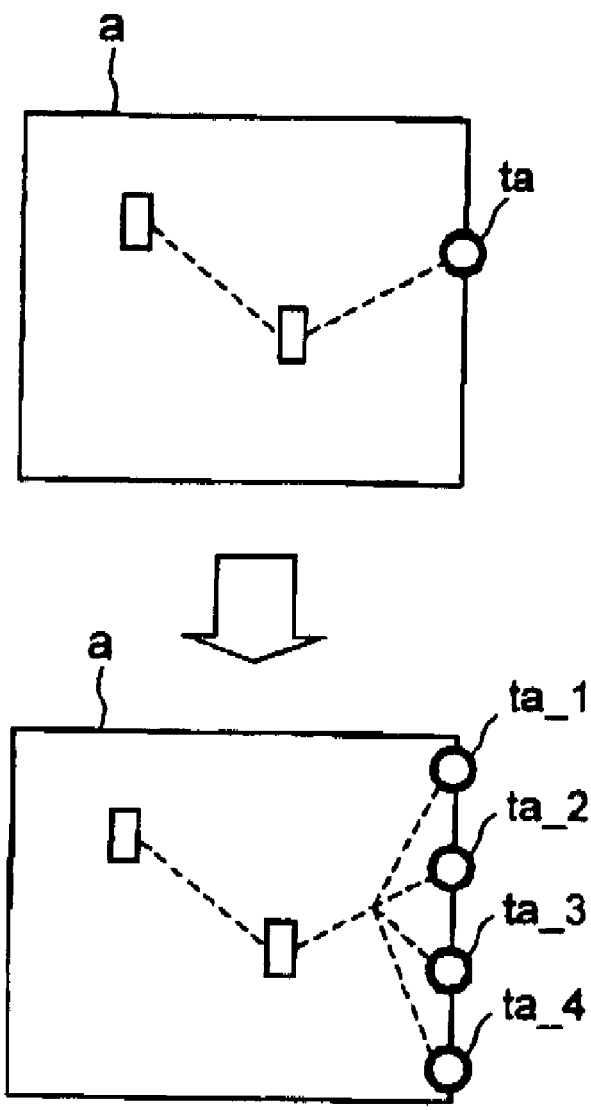
FIG. 16 is an illustration for describing and showing an example of the contents of the macro net list information after the names of the same-type macros and names macro terminals thereof are changed with the layout design supporting device of FIG. 1.

Then, there is performed processing for replacing the macro terminals under unchanged terminal names with all of the plurality of macro terminals under changed terminal names (FIG. 16, step S121: entire macro terminal arranging step or entire macro terminal arranging processing). Then, there is performed processing for updating the macro net list information before the replacement with the macro net list information after the replacement (step S122: macro net list information updating step or macro net list information updating processing). Subsequently, there is performed processing for creating the macro layout information with all the replaced macro terminals (step S123: macro layout creating step or macro layout creating processing). With the above-described steps S121-S123, the "second terminal coordinate calculation processing step" of the present invention can be configured.

Further, wiring layout processing is performed within the macro blocks (step S124: macro layout wiring step or macro layout wiring processing). Here, for the same-type macro blocks, each of the individual terminals of the plurality of same-type macro blocks is all arranged on the boundary line of one of the same-type macro blocks. Under this state, wring is connected from the functional element within the same-type macro block to all the terminals. Then, there is performed processing for updating the previous macro layout information to the macro layout information in which the wiring layout is performed (step S125: macro layout information updating step or macro layout information updating processing). With the above-described steps S124-S125, the "second layout processing step" of the present invention can be configured.

Then, there is performed processing for rechanging the changed macro names and terminal names to the original macro names and terminal names (step S131: macro name rechanging step/terminal name rechanging step or macro name rechanging processing/terminal name rechanging processing). Further, there is performed processing for merging the macro layout with the top layout (step S132: merge processing step or merge processing). With the above-described steps S131-S132, the "third layout step" of the present invention can be configured.

There is performed processing for deleting the extra wiring part in the chip layout area (step S133: extra wiring part deleting step or extra wiring part deleting processing). Then, there is performed processing for outputting the chip layout information (step S134: chip layout information output step or chip layout information output processing). With the above-described step S133, the "extra wiring deleting step" of the present invention can be configured.

(Regarding Processing for Calculating Terminal Coordinates)

Figure 23:
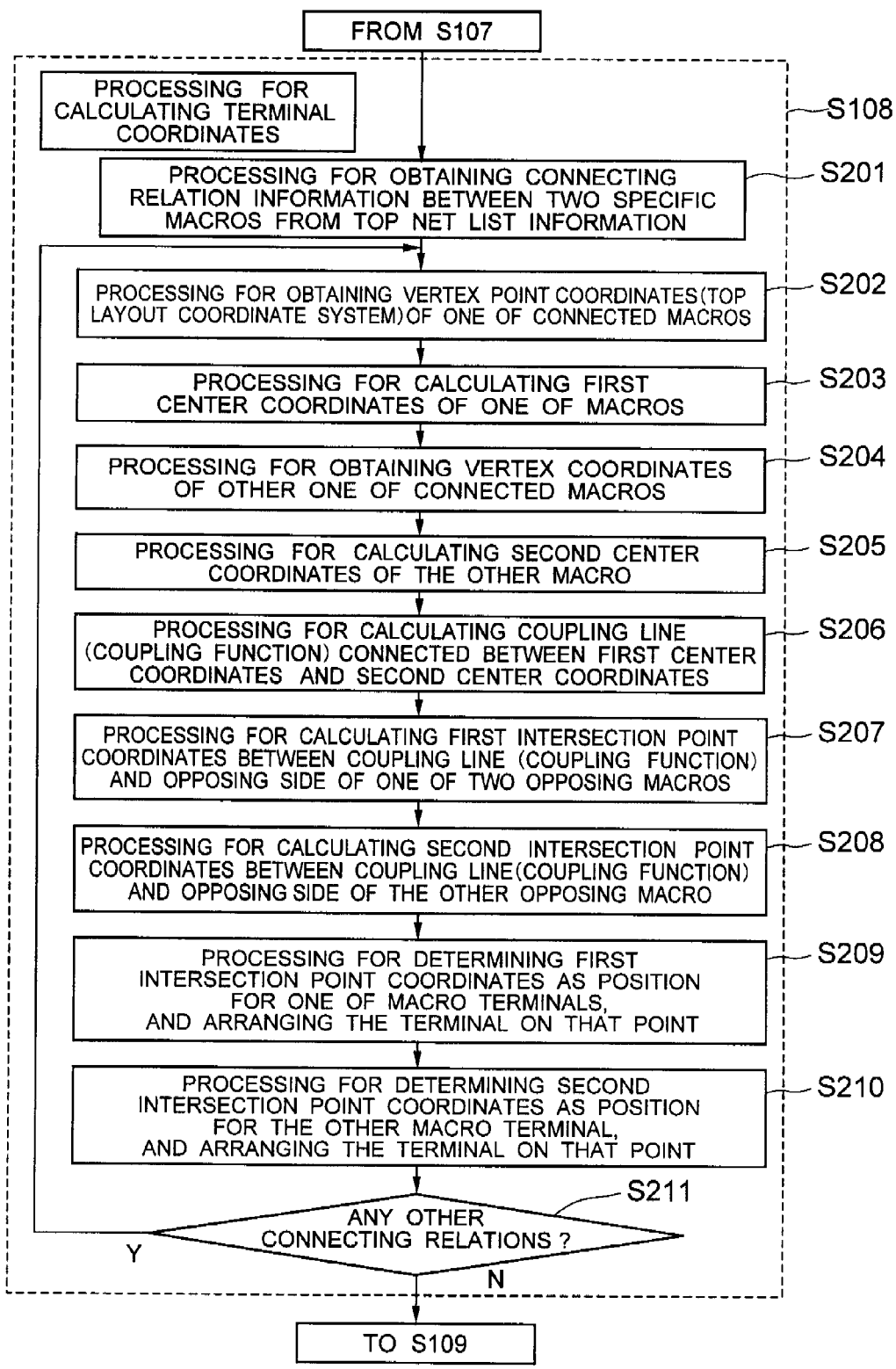
FIG. 23 is a flowchart showing an example of more detailed procedure of the processing order shown in FIG. 22.

Next, regarding each of the above-described steps, the processing of the step S108 for calculating the terminal coordinates will be described in detail by referring to FIG. 23. FIG. 23 is a flowchart showing the detailed procedure of the processing for calculating the terminal coordinates. As shown in FIG. 23, in the step S108, first, there is performed processing for obtaining the connecting relation information between specific two macro blocks from the top net list information (step S201: macro block connecting relation information obtaining step or macro block connecting relation information obtaining processing).

After obtaining the connecting relation information, there is performed processing for obtaining coordinates (top layout coordinate system) of each vertex of one of the macro blocks that are being connected (step S202: first macro vertex coordinate obtaining step or first macro vertex coordinate obtaining processing). Further, there is performed processing for calculating first center coordinates of that macro block (step S203: first center coordinate calculating step or first center coordinate calculating processing).

Furthermore, there is performed processing for obtaining coordinates of each vertex of the other one of the macro blocks that are being connected (step S204: second macro vertex coordinate obtaining step or second macro vertex coordinate obtaining processing). Further, there is performed processing for calculating second center coordinates of that macro block (step S205: second center coordinate calculating step or second center coordinate calculating processing).

Then, there is performed processing for calculating a coupling line (coupling function) that connects the first center coordinates and the second center coordinates (step S206: center coordinate coupling function calculating step or center coordinate coupling function calculating processing). It does not necessarily have to be the "center coordinates" but may also be specific points within the macro block area. The coupling function connecting between two points may be any functions. With the above-described steps S201-S206, the "specific point coupling function calculation control step" of the present invention can be configured.

Then, there is performed processing for calculating first intersection point coordinates between the coupling line (coupling function) and an opposing side of one of the two opposing macro blocks (step S207: first intersection point coordinate calculating step or first intersection point coordinate calculating processing). Further, there is performed processing for calculating second intersection point coordinates between the coupling line (coupling function) and an opposing side of the other one of the two opposing macro blocks (step S208: second intersection point coordinate calculating step or second intersection point coordinate calculating processing). With the above-described steps S207-S208, the "intersection coordinate calculation control step" of the present invention can be configured.

In this manner, the first intersection point coordinates are determined as the position of the macro terminal of one of the macro blocks, and performs processing for arranging the macro terminal (step S209: first macro terminal arranging step or first macro terminal arranging processing). Further, the second intersection point coordinates are determined as the position of the macro terminal of the other macro block, and performs processing for arranging the macro terminal (step S210: second macro terminal arranging step or second macro terminal arranging processing).

Then, it is judged whether or not there is other connecting relation information between macro blocks (step S211: connecting relation searching/judging step or connecting relation searching/judging processing). When it is judged with the judging processing that there is other connecting relation information between the macro blocks, the procedure is returned to the step S202. Meanwhile, when it is judged that there is no other connecting relation information between the macro blocks, the processing of the step S108 is ended, and the procedure is shifted to a next step S109.

With the above-described processing for calculating the terminal coordinates, the optimum coordinate position of the macro terminal is calculated from the intersection point (intersection part) between the coupling line that couples the center points of each of the macro blocks and the boundary line of the macro block. Thus, the distance between each of the macro terminals of each of the macro blocks can be set short, so that the length of the wiring wired between the macro blocks can be formed short. Therefore, it is possible to avoid bypass wirings and to form the short wiring regardless of the arranging relation (positional relation) of the macro blocks.

In particular, when a plurality of same-type macro blocks are formed, it has such an advantage that the wiring length can be formed short at all times regardless of the state of the positional relation in the surroundings.

(Processing for Replacing Original-State Terminals to All of Changed Terminals)

Figure 24:
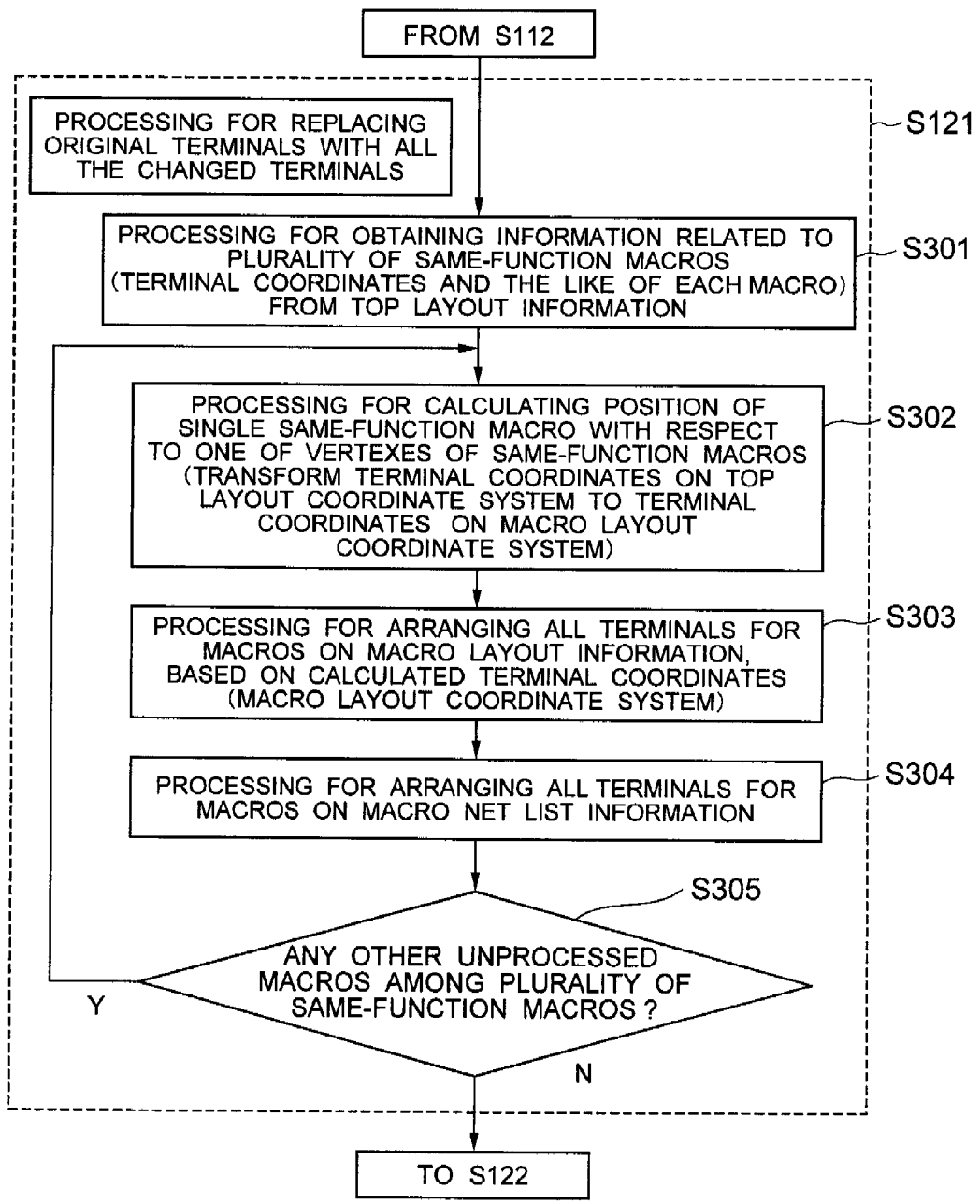
FIG. 24 is a flowchart showing an example of more detailed procedure of the processing order shown in FIG. 22.

Next, by referring to FIG. 24, there will be described the detailed procedure of the processing of the above-described step S121 for replacing the original-state terminals with all the terminals that are being changed. FIG. 24 is a flowchart showing an example of the more detailed procedure of the processing for replacing the original-state terminals with all the terminals that are being changed.

In the step S121, first, there is performed processing for obtaining information (terminal coordinates and the like for each macro block) regarding a plurality of same-type macro blocks from the top layout information (step S301: same-type macro block related information obtaining step or same-type macro block related information obtaining processing).

Then, there is performed processing for calculating to find at what position the macro terminal of one of the same-type macro blocks is located with respect to one of the vertex of the same-type macro blocks (Step S302: relative position calculating step or relative position calculating processing).

At this point, there is performed processing for transforming the terminal coordinates on the top layout coordinate system into the terminal coordinates on the macro layout coordinate system. Based on the calculated terminal coordinates (macro layout coordinate system), there is performed processing for arranging all the terminal for the macro blocks in the macro layout information (step S304).

Next, there is performed processing for judging whether or not there are any other unprocessed macro blocks in the plurality of same-type macro blocks (step S305: same-type macro block searching/judging step or same-type macro block searching/judging processing). When judged in this judging processing that there is another unprocessed macro block among the plurality of same-type macro blocks, the procedure is returned to the step S302. Meanwhile, when it is judged that there is no other unprocessed macro block among the plurality of same-type macro blocks, the step S121 is ended, and the procedure is shifted to a next step S122.

With the above-described processing for replacing the terminals in the original state to all the terminals that are being changed, only one-time macro layout processing is required for each of the same-type macro blocks that are considered as different types, through allotting all of the macro terminals of each of the same-type macro blocks that are considered as different types to a boundary area of the same-type macro blocks.

(Processing for Deleting Extra Wiring Part)

Figure 25:
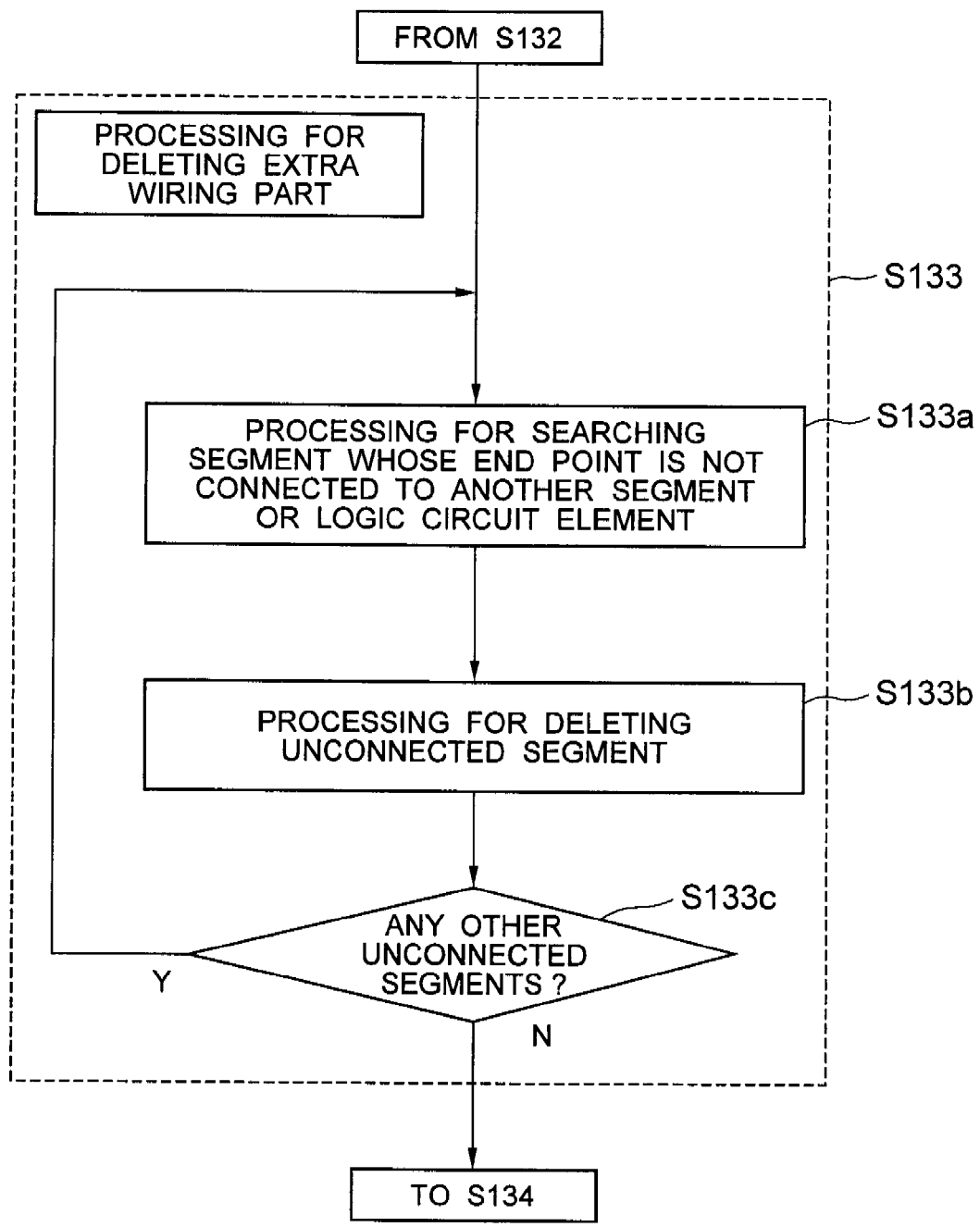
FIG. 25 is a flowchart showing an example of more detailed procedure of the processing order shown in FIG. 22.

Next, by referring to FIG. 25, there will be described the detailed procedure of the processing of the above-described step S133 for deleting an extra wiring part. FIG. 25 is a flowchart showing an example of the detailed procedure of the processing for deleting an extra wiring part.

In the step S133, there is performed processing for searching a segment whose end point is not connected to another segment or to a logic circuit element (step S133a: end point searching step or end point searching processing). Then, there is performed processing for deleting the segment that is not connected to another segment or the logic circuit element (step S133b.

Then, there is performed processing for judging whether or not there is a segment that is not connected to others (step S133c: segment judging step or segment judging processing). When it is judged in this judging processing that there is a segment that is not connected to others, the procedure is returned to the step S133a. Meanwhile, when it is judged in the judging processing that there is no segment that is not connected to others, the processing of the step S133 is ended, and the procedure is shifted to a next step S134.

With the above-described processing for deleting the extra wiring part, it is possible to delete the extra wiring part automatically even if the wiring layout processing from the functional element to all the terminals is performed in the macro layout within the macro block. As a result, the chip layout with the improved wiring property can be provided.

(Explanations of Effects)

As described above, regarding the wiring layout processing inside and outside a plurality of macro blocks including a plurality of same-type macro blocks, it is possible with the exemplary embodiment to design layout by shortening all the wirings connected to the macro terminals, while securing the necessary macro block area without performing unnecessary processing such as provisional layout and schematic wiring processing, offset processing, or clamp processing, and without forming unnecessary elements. Therefore, it is possible to avoid bypass wirings (detour routing of the wirings) and improve the wiring property of the semiconductor integrated circuit so as to suppress deterioration in the wiring delay time.

When the plurality of same-type hierarchy macros are used in the layout of the LSI that employs the hierarchy layout method as described above, those are considered as different macros and the coordinates of the macro terminals are determined to design the top layout (wiring processing between the macros). For the macro layout, the wiring processing of the macros is performed only once to connect the wiring to all the terminals set at different coordinates. After merging the top layout with the macro layout, extra wirings whose connection between the macros is uncompleted are deleted. With this, detour routing of the wirings between the macros can be avoided while keeping the uniformity of the macro layout so as to improve the wiring property of the entire LSI and to suppress deterioration in the wiring delay time.

Figure 26:
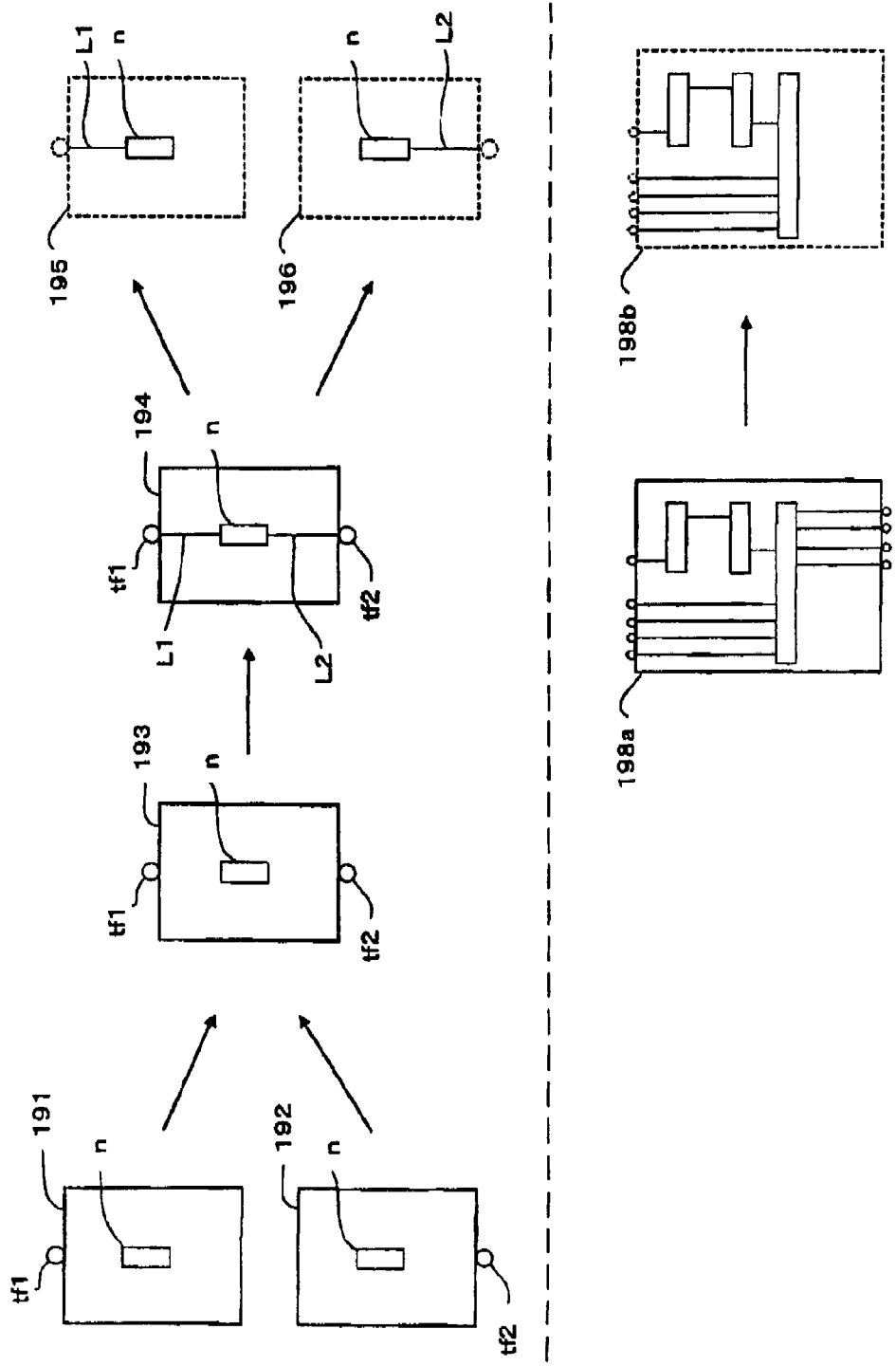
FIG. 26 is an illustration for describing an example of a process for performing wiring layout within the macro block with the layout design supporting device shown in FIG. 1.

FIG. 26 illustrates, in a conceptually simplified manner, a series of steps for arranging entire macro terminals to the macro blocks, wiring all the macro terminals within the macro block, and deleting an extra part from the wiring part after the chip layout in the structure according to the exemplary embodiment. As shown in FIG. 26, regarding a plurality of same-type macro blocks 191 and 192, a macro terminal tf1 and a functional element (for example, logic circuit element) n are formed in one of the macro blocks, 191. A macro terminal tf2 and a functional element n are formed in the other same-type macro block, 192 (at this point, it is to be assumed that the macro names and the macro terminal names are already being changed, the optimum arranging positions of the macro terminals are calculated, and the macro terminals are arranged).

Then, all the macro terminals tf1 and tf2 are to be arranged in one of the same-type macro blocks, 193 (the macro block in this state is referred to as half-created macro block for convenience, since it is in a middle of a process from the first macro layout information (state with only the functional element) to the second macro layout information (state of reference numeral 194).

Then, macro layout processing (wiring processing) is performed in the same-type macro block 193 to form wiring parts L1 and L2. Further, after the chip layout, an area 195 corresponding to one of the same-type macro blocks and an area 196 corresponding to the other same-type macro block are formed. The wiring parts L1 and L2 are formed in the area 19S. However, the wiring part L2 is deleted by extra wiring part deleting processing. Further, the wiring parts L1 and L2 are formed in the area 196. However, the wiring part L1 is deleted by the extra wiring part deleting processing.

Figure 36:
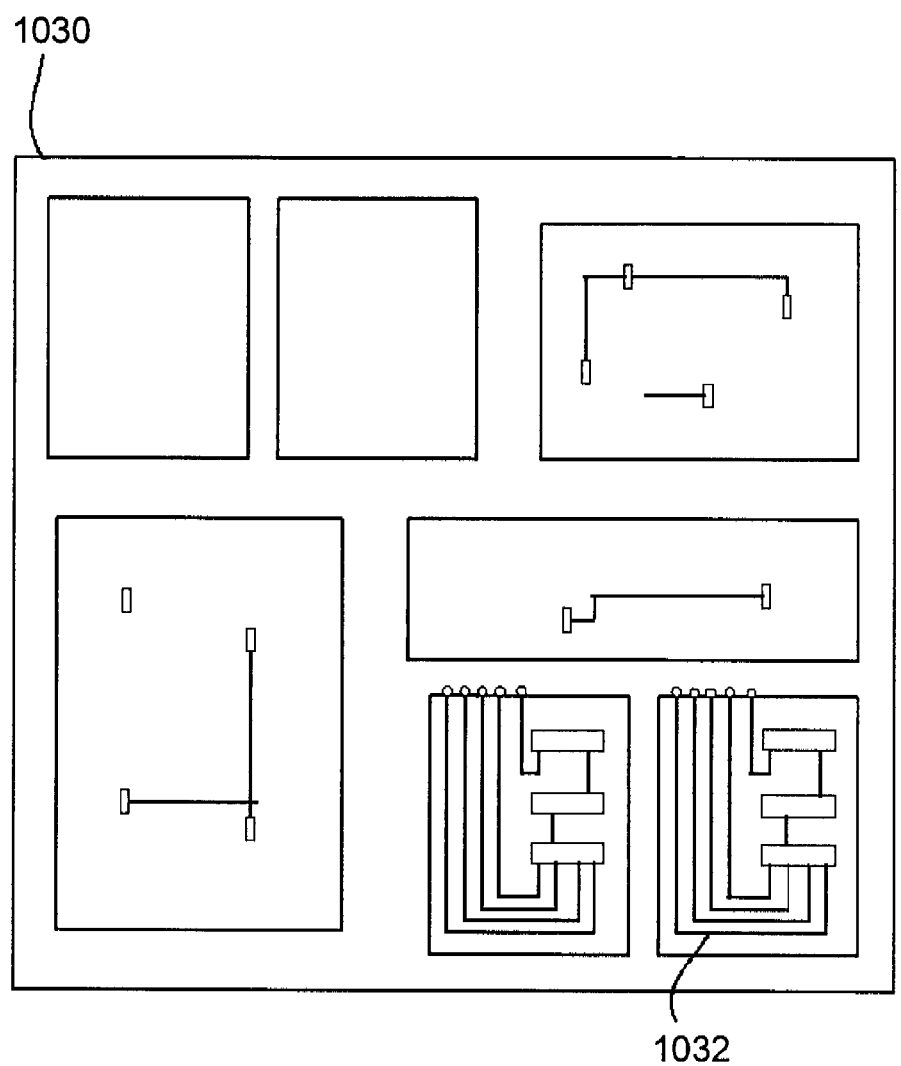
FIG. 36 is an illustration for describing an issue of the macro block according to the related technique.

With those points in mind, a case of using not the technical spirit of Patent Document 2 but the technical spirit of the exemplary embodiment for processing the macro block of Patent Document 2 as a related technique, for example, will be investigated as a comparative case to find out how the wiring layout turns out at last. In this case, as shown in FIG. 26, a macro block 198a in which all the terminals are wired is generated. After the chip layout, an area 198b that corresponds to the macro block comes to have a wiring part formed with the extra wiring part being deleted at the last stage. Comparing the wiring layout (198b of FIG. 26) at the last stage and the wiring part 1032 wired according to the technical spirit of Patent Document 2 shown in FIG. 36, it can be clearly understood that the wiring is formed shorter with the method of the exemplary embodiment.

From this viewpoint, the macro terminals are simply moved with Patent Document 2 and the wiring length within the macro block cannot be shortened. Meanwhile, it is possible with the exemplary embodiment to shorten the wiring length. The reason for this is that the macro terminals and the functional element are not wired within the macro block at an initial stage, and those are wired after obtaining the optimum coordinate positions of the macro terminals by calculations. Therefore, the optimum positions can be found in a single attempt without going through such steps required in Patent Document 2, such as the provisional layout step and the correcting step performed thereafter for correcting the terminal positions and wiring positions.

Second Exemplary Embodiment

Next, a second exemplary embodiment according to the present invention will be described by referring to FIG. 27-FIG. 30. Explanations of substantially the same structures as those of the first exemplary embodiment will be omitted, and only different points will be described hereinafter. FIG. 8 is a block diagram showing an example of the second exemplary embodiment of the layout design supporting device according to the present invention. The structures of the layout design supporting device of this exemplary embodiment is different from the structures of the layout design supporting device of the first exemplary embodiment described above in regards to the structure of the hierarchy macro terminal coordinate determining part.

That is, the above-described first exemplary embodiment describes the method which obtains the intersection part between the coupling lines that connect center points of each macro block and the boundary line of each macro block for calculating the optimum coordinate positions of the macro terminals. However, the second exemplary embodiment discloses a method which obtains a pair of sides with which the distance between the connected macro blocks becomes the shortest, and arranges the macro terminals on those sides.

Figure 27:
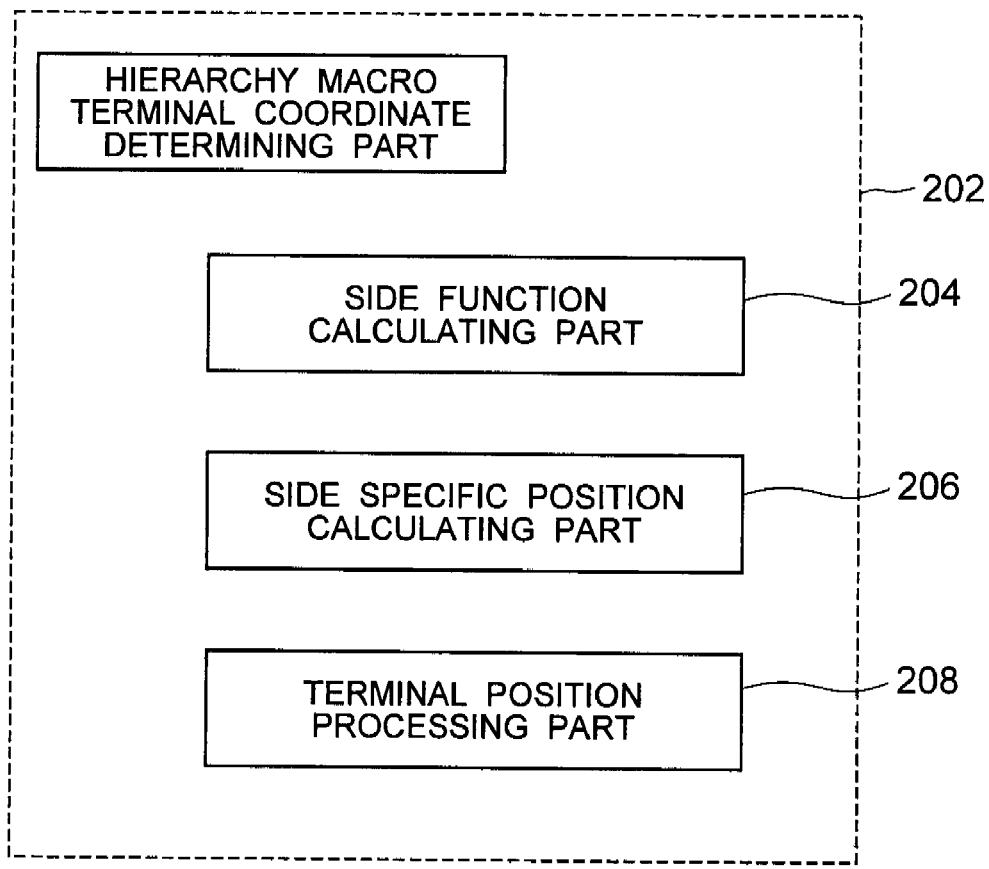
FIG. 27 is a block diagram showing an example of a detailed structure of a hierarchical macro terminal coordinate determining part of a layout design supporting device according to a second exemplary embodiment of the present invention.

Specifically, as shown in FIG. 27, the hierarchy macro terminal coordinate determining part 202 of the layout design supporting device includes a side function calculating part 204 (corresponds to the "side calculating part" of the present invention), a side specific position calculating part 206 (corresponds to the "specific position calculating part" of the present invention), and a terminal arrangement processing part 208.

Figure 28:
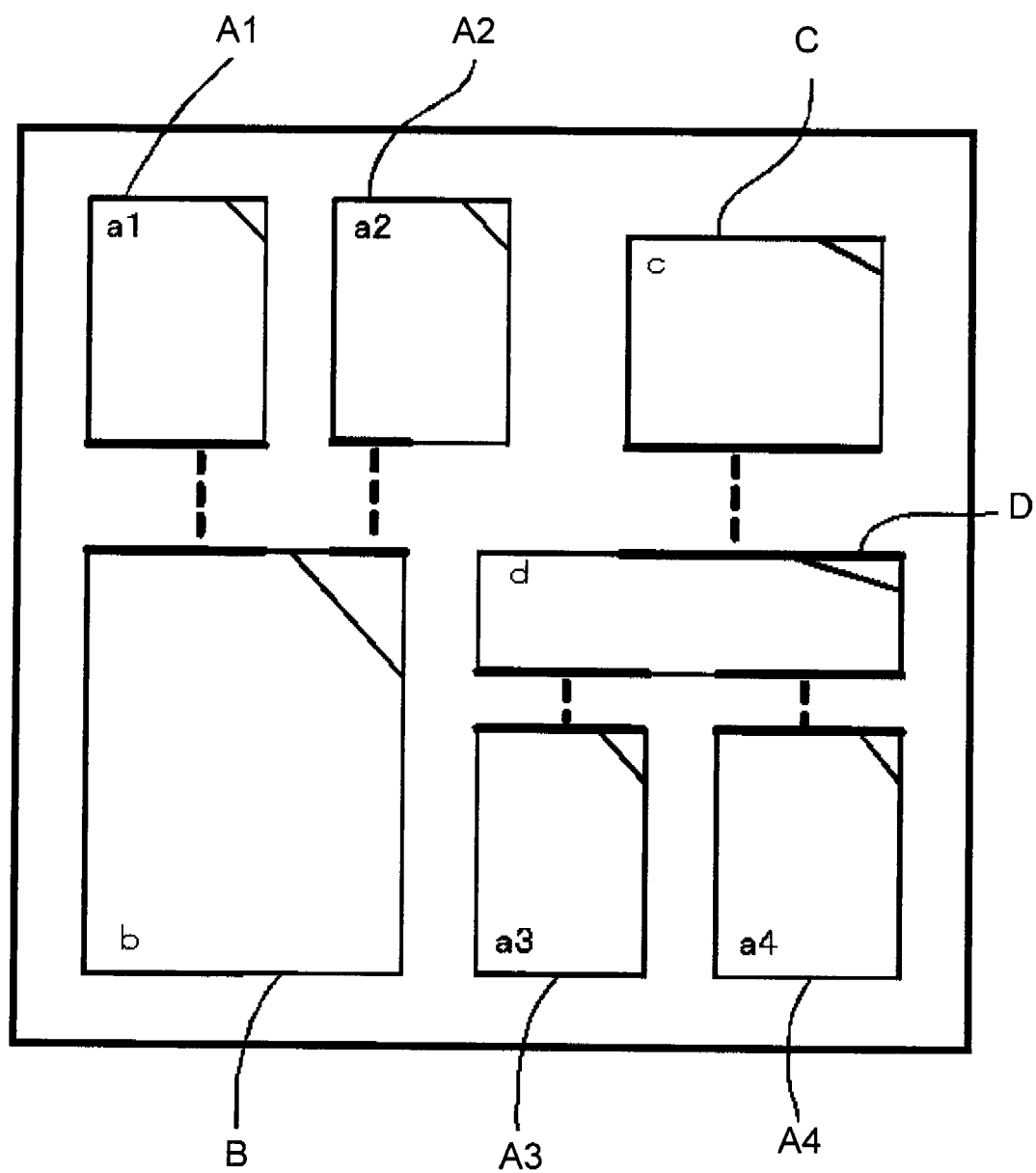
FIG. 28 is an illustration for describing a way of calculating the macro terminal position with the layout design supporting device of FIG. 27.
Figure 29:
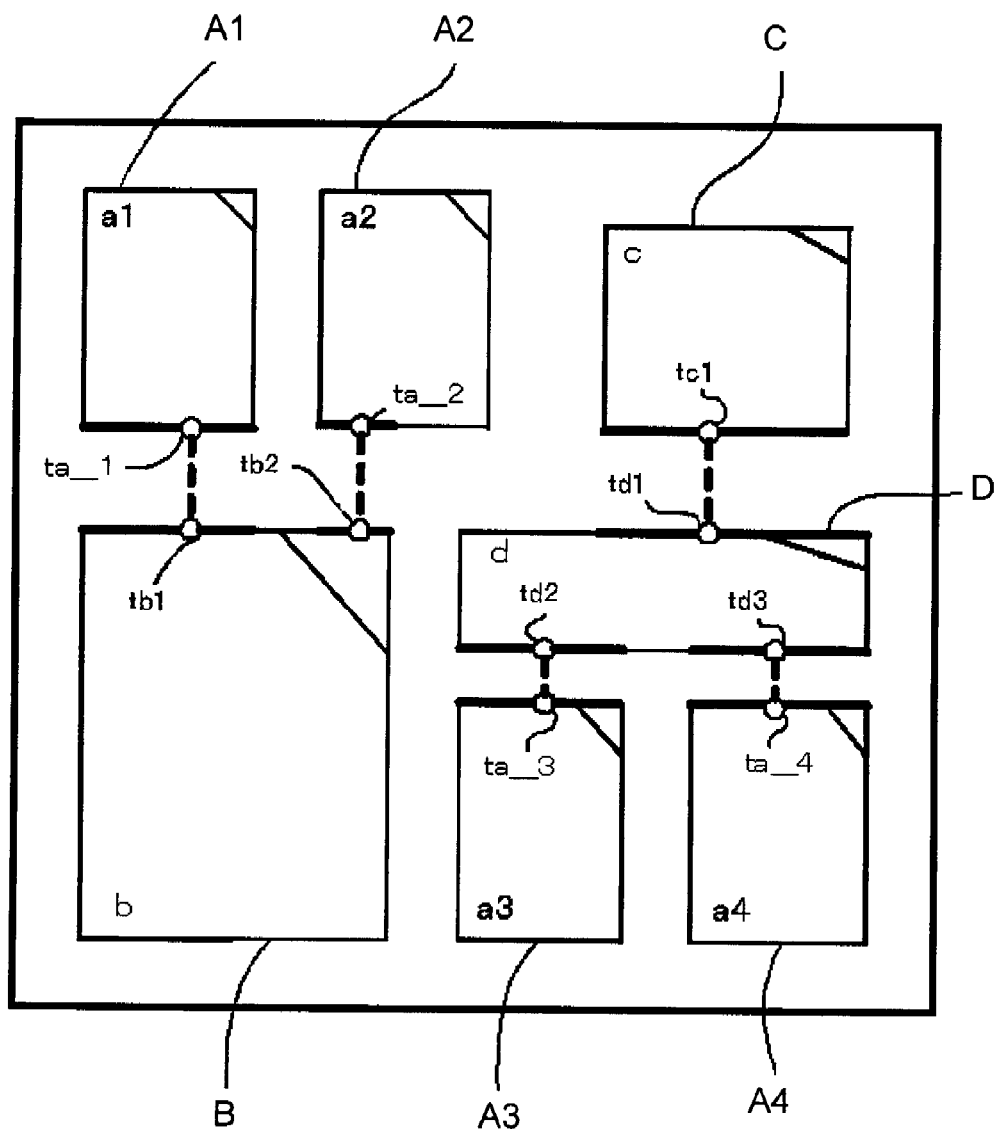
FIG. 29 is an illustration for describing a way of calculating the macro terminal position with the layout design supporting device of FIG. 27.

The side function calculating part 204 obtains the function of a pair of opposing sides with which the distance between at least two macro blocks becomes the shortest. More preferably, the side function calculating part 204 obtains the positions of the pair of sides. The side specific position calculating part 206 calculates the specific positions on the sides. FIG. 28 shows an example of such state. In FIG. 28, each of the specific positions of both of the calculated respective macro blocks is coupled with a broken line. The terminal arrangement processing part 208 arranges each macro terminal at each specific position of the both of calculated respective macro blocks. FIG. 29 shows this state. FIG. 28 and FIG. 29 illustrate the case where the positions at the center of the opposing areas of the two macro blocks are selected as the specific position on the sides. However, it is not limited only to such case, since the distance between any positions on those sides is the shortest distance.

(Regarding Processing Procedure)

Figure 30:
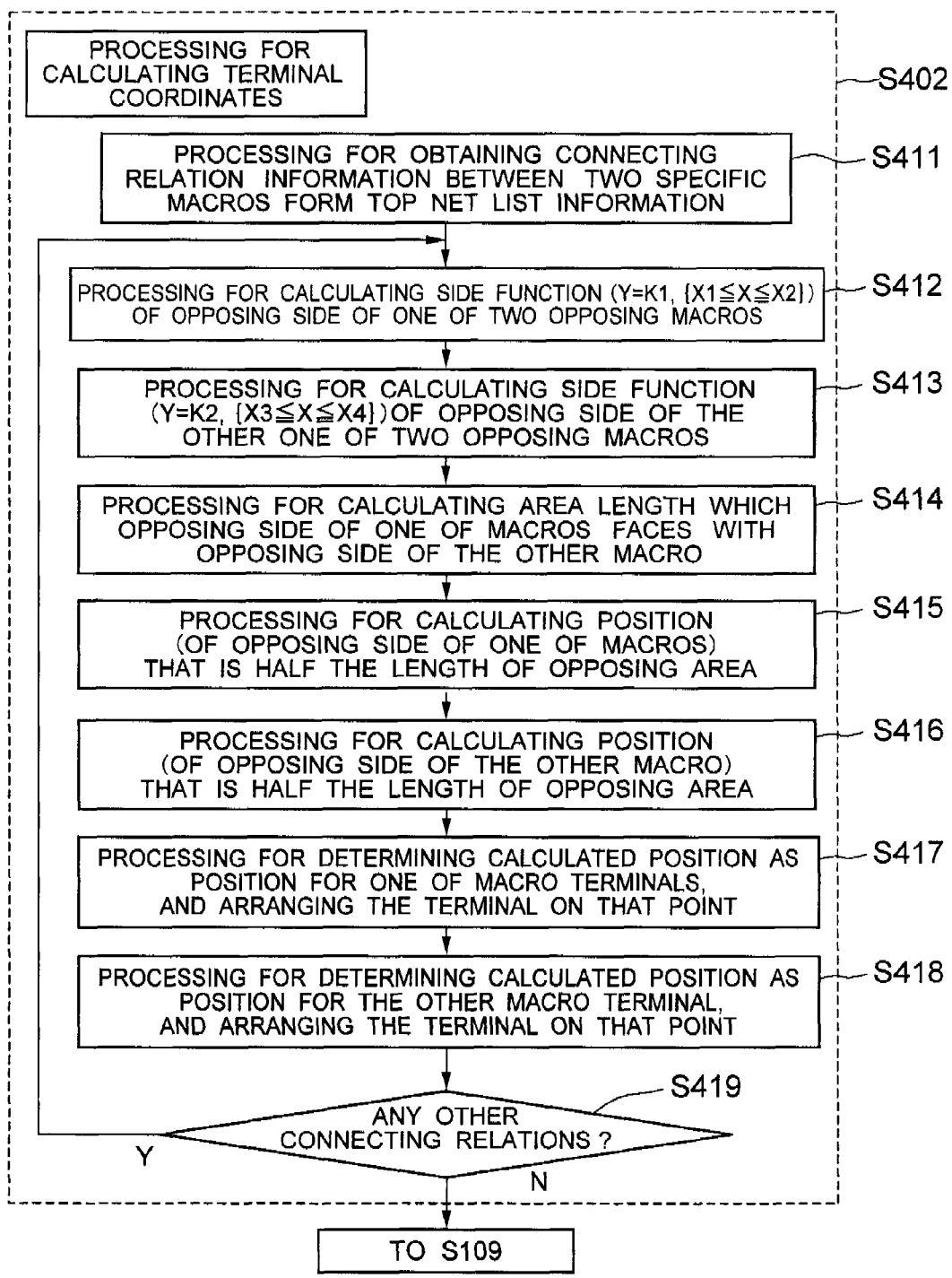
FIG. 30 is a flowchart showing an example of processing order of the layout design supporting device shown in FIG. 27.

Next, described is the detailed processing procedure of the integrated circuit layout design supporting device configured in the manner described above by referring to FIG. 30. FIG. 30 is a flowchart showing an example of the detailed procedure of processing for calculating the terminal coordinates according to the second exemplary embodiment.

As shown in FIG. 30, first, there is performed processing for obtaining connecting relation information of specific two macro blocks from the top net list information (step S411).

Then, there is performed processing for calculating a side function (y=k1, {X1≦x≦X2}) of the opposing side of one of the two opposing macro blocks (step S412: first side function calculating step or first side function calculating processing) Further, there is performed processing for calculating a side function (y=k2, {X3≦x≦X4}) of the opposing side of the other one of the two opposing macro blocks (step S413: second side function calculating step or second side function calculating processing). With the above-described steps S411-S413, the "side calculation control step" of the present invention can be configured.

Then, there is performed processing for calculating the length of the area along which the opposing side of one of the macro blocks faces with the opposing side of the other macro block (S414: opposing area calculating step or opposing area calculating processing). At this point, there is performed processing for calculating the half position of the length of the opposing area of the opposing side of one of the macro blocks (S415: first center part calculating step or first center part calculating processing). Further, there is performed processing for calculating the half position of the length of the opposing area of the opposing side of the other macro block (S416: second center part calculating step or second center part calculating processing). With the above-described steps S414-S416, the "specific position calculation control step" of the present invention can be configured.

Then, the calculated position is determined as the position of the macro terminal of one of the macro blocks, and there is performed processing for arranging the macro terminal (S417). Further, the calculated position is determined as the position of the macro terminal of the other macro block, and there is performed processing for arranging the macro terminal (S418).

Thereafter, there is performed processing for judging whether or not there is any other connecting relation information between macro blocks (step S419: connecting relation information searching/judging step or connecting relation information searching/judging processing). When it is judged with the judging processing that there is another connecting relation information between the macro blocks, the procedure is returned to the step S412. Meanwhile, when it is judged that there is no other connecting relation information between the macro blocks, the processing of the step S402 is ended, and the procedure thereafter is shifted to the next step S109 as in the case of the first exemplary embodiment.

With the second exemplary embodiment as described above, wirings can be provided at the shortest positions between each of the macro blocks when performing the wiring layout processing between the macro blocks. Therefore, the wiring property can be improved further while enabling the same operations and effects as those of the first exemplary embodiment to be achieved.

(Various Modification Examples)

Figure 31:
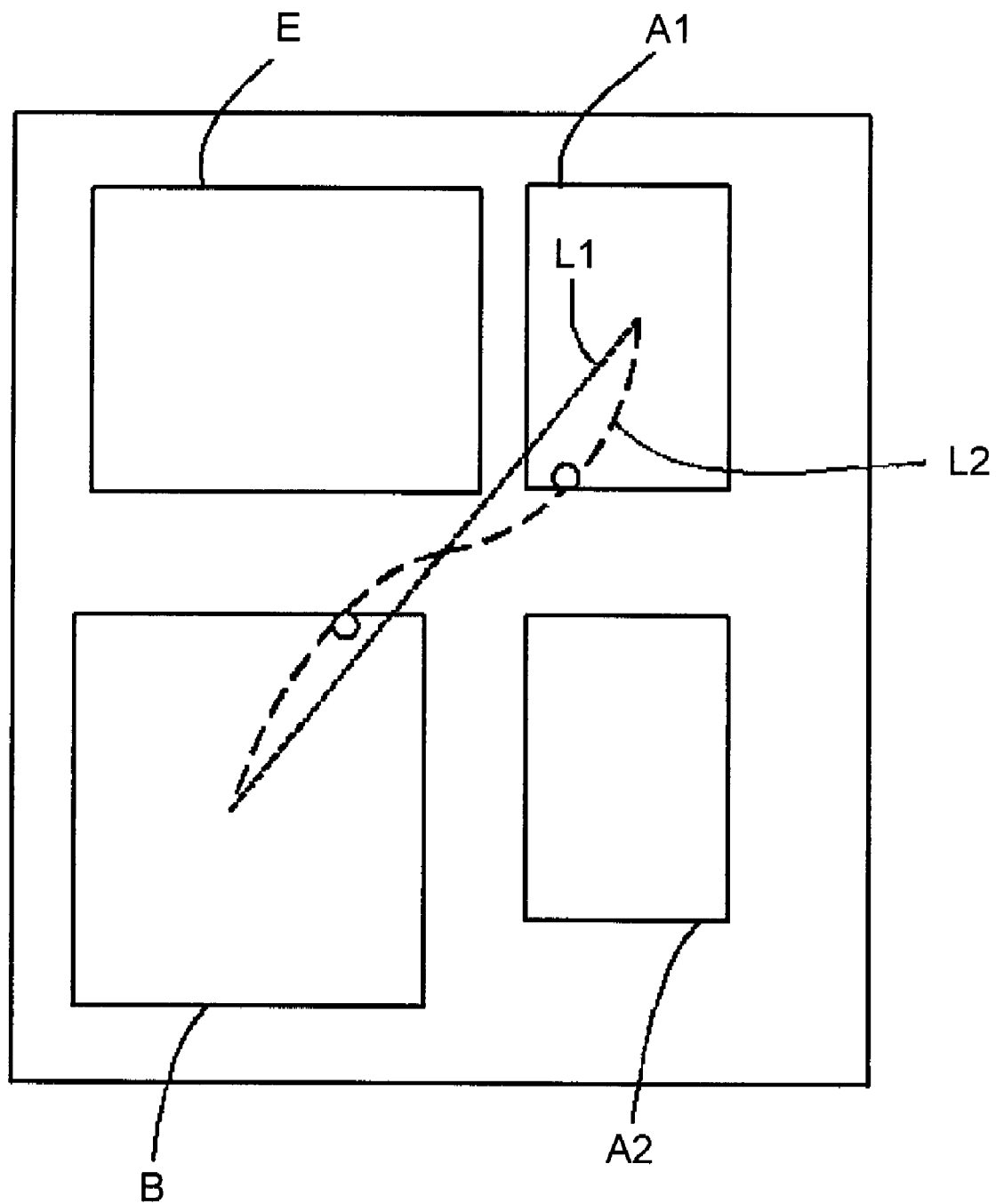
FIG. 31 is an illustration for describing a way of calculating the macro terminal position with the layout design supporting device.

While the LSI layout design supporting device and LSI layout designing method according to the present invention have been described by referring to some of the specific exemplary embodiments, various modifications to the exemplary embodiments of the present invention illustrated herein are possible without departing from the spirit and scope of the present invention. For example, there has been described the case of using a linear function (straight line form) as the coupling function for calculating the optimum positions of the macro terminals in the first exemplary embodiment. However, it is not limited only to that. As shown in FIG. 31, the coupling function may be a cubic function that goes through three points, or a free-form curve that goes through two points.

If the function is in a linear form when the macro blocks are in the layout of FIG. 31, the intersection part between the coupling function L1 and the boundary line of the macro block A1 comes on the left side of the macro block A1. In such case, another coupling function L2 may be employed to have the coordinate position of the intersection part on the bottom side. It is preferable to provide, inside the second terminal coordinate calculation processing part, an intersection part position properness judging part for judging whether the intersection part position is calculated on a first side of the macro block to which the macro terminal is to be arranged or the intersection part is calculated on a second side that opposes to a first direction of a macro block that is not in a connecting relation. Further, it is preferable to provide, inside the second terminal coordinate calculation processing part, a coupling function control part which controls to calculate the intersection part by using the second coupling function instead of the first coupling function, when it is judged by the intersection part position properness judging part that the position is not proper. The coupling function control part calculates the optimum position by controlling each of the coupling function calculating parts that use a plurality of different coupling functions as well as each of the intersection part calculating parts that use each of the coupling functions. This makes it possible to calculate the optimum positions of the macro terminals even it is a case of a complicated layout pattern.

Further, when the macro terminal positions are being calculated, the top layout step and the macro layout step may be performed in parallel.

Furthermore, while the exemplary embodiments above have been described by referring to the structure where the LSI layout design supporting software is loaded on a single information processing device, it may also be structured to include an information terminal and a managing unit (for example, a single server or a plurality of servers) which is formed to be capable of communication with the information terminal via a network, and an LSI layout designing software is loaded on the managing unit side for allowing the layout design by operational input from the information terminal. That is, it maybe structured as a layout design supporting system. Further, in this case, the system may be structured to be capable of being operated through a normal browser and the like.

The "system" in this case means a logical set of a plurality of devices, and it does not matter whether or not the devices of each structure are within a same casing. Thus, this structure can be applied to a system that includes a plurality of devices or an apparatus configured with a single device.

As the network, any of hardware structures can be employed, such as a portable telephone circuit network (including a base station and a switchboard system), a public telephone circuit network, an IP telephone network, various circuit lines similar to those using ISDN circuit network or the like, Internet (i.e. communication mode using TCP/IP protocols), intranet, LAN (Ethernet (registered trademark) including gigabit Ethernet and the like), WAN, an optical fiber communication network, a power-line communication network, and various dedicated lines compatible with broadband. Further, the network may be a network using various types of communication protocols other than the TCP/IP protocols, a virtual network built on software, or any types of network similar to those using any types of communication protocols. Further, the network may not necessarily have to be a wired network but may be a wireless (including a satellite communication, various types of high-frequency communication devices, or the like) network, (e.g. a single carrier communication system such as a simplified telephone system or a portable telephone, a spectrum diffusing communication system such as a radio LAN conforming to W-CDMA or IEEE802.11b, a multicarrier communication system such as Hiper LAN/2 conforming to IEEE802.11a). Further, a combination of those may be used or a system connected to another network may be employed as well. Furthermore, the network may employ any mode such as point-to-point, point-to-multipoint, multipoint-to-multipoint, or the like.

Further, while the exemplary embodiments above have been described by referring to the case of using a single information processor, there may also be a plurality of information processors. Furthermore, each part of the storage unit 8 may include a database or a server used exclusively, such as a top layout information server, a top net list information server, a hierarchy macro change list server, a macro net list server, a macro layout server, and a chip layout server.

Moreover, the "server" may not be configured only with an SQL server such as a database but may be configured also with various types of servers such as a web server, POP and SMTP server for transmitting/receiving e-mails, and other DNS servers. The "server" may also function as a general name of the system including those.

(Programs)

Further, the software program (integrated circuit layout designing program) according to the present invention for enabling the functions of the above-described exemplary embodiments includes: programs that correspond to each part, each processing step (processing procedure), functions, and the like shown in the block diagrams of FIG. 1, FIG. 2, FIG. 3, FIG. 11, FIG. 12, FIG. 27, etc., and the flowcharts and the like of FIG. 22, FIG. 23, FIG. 24, FIG. 25, etc.; each processing program processed respectively by the control unit 2 or the like of each of the above-described exemplary embodiments shown in FIG. 2; the method (steps) depicted generally over the present Application; processing described in the Application; the data (for example, top layout information, top net list information, macro net list information, hierarchy macro change list information, macro layout information, chip layout information, physical library information, and various table); and the entire or a part of data in various types of DB (databases).

There is no restriction regarding the forms of the programs. The programs may be object code programs, programs executed by an interpreter, script data supplied to an OS, and the like. The programs may be mounted with high-level procedure type or object-oriented programming languages or, as necessary, with an assembly or machine language. In any cases, the language may be of compiler type or interpreter type. The programs includes those types in which the above-described layout design supporting program is mounted to application software that can be operated by an ordinal personal computer, a portable information terminal, or the like.

As a method for supplying the integrated circuit layout design supporting program, it is possible to supply the program through a power communication circuit from an external device that is connected to be capable of communicating with a computer via the power communication circuit (no matter if it is wired or radio type). For example, it is possible to supply the program when a user connect to a homepage on the Internet by using a browser of the computer, and downloads the program itself or a compressed file containing automatic install function from the homepage to a recording medium such as a hard disk. Further, it is also possible to divide the program codes configuring the program into a plurality of files, and download each of the files from different homepages. That is, the server allowing a plurality of users to download the program files for achieving the processing of the functions of the present invention with a computer is included within the range of the present invention.

(Information Recording Medium)

Further, the layout design supporting program may be recorded to an information recording medium. An application program including the layout design supporting program may be stored in the information recording medium, and a computer can read the application program from the information recording medium and install the application program to a hard disk. In this way, it is possible to supply the above-described program by recording it to an information recording medium such as a magnetic recording medium, an optical recording medium, or a ROM. By using such information recording medium with the recorded program in the computer, a preferable information processor can be configured.

As the information recording medium for supplying the program, a semiconductor memory such as a ROM, a RAM, a flash memory, an SRAM and, an integrated circuit may be used, for example, or a USB memory, a memory card, an optical disk, a magneto-optical disk, a magnetic recording medium, or the like including those may also be used. Further, the program may be used by being recorded to a portable medium such as a flexible disk, a CD-ROM, a CD-R, a CD-RW, an FD, a DVD RAM, a DVD ROM, a DVD-R, a DVD-RW, a DVD+R, a DVD+RW, an MO, a ZIP, a magnetic card, a magnetic tape, an SD card, a memory stick, a nonvolatile memory card, an IC card, or a storage device such as a hard disk that is built-in inside a computer system, etc.

Furthermore, the "information recording medium" includes such type that dynamically holds the program for a short period of time (a transmission medium or a transmission wave), e.g. a communication line used for transmitting the program via a communication circuit such as a network (Internet or the like) or a telephone circuit, and such type that holds the program for a specific time, e.g. the server used in the above case and a volatile memory provided inside the computer system serving as a client.

Furthermore, in the case where the OS operated on the computer or an RTOS or the like on the terminal (for example, a portable telephone) executes a part of or entire processing, it is also possible to achieve the same functions and the effects as those of the above-described exemplary embodiments.

Moreover, it is also possible to encrypt the program and stores it to a recording medium such as a CD-ROM to distribute it to users, and allow the users who have cleared a prescribed condition to download key information for decrypting the program from a homepage via the Internet so that the user can execute the encrypted program by using the key information and install the program to the computer. In such case, the structure of the present invention may include each structural element (various types of parts, steps, and data) of the layout design supporting program and an encrypting device for encrypting the layout design supporting program (various types of parts, steps, and data).

Further, it is also possible without a question to use the "layout design supporting device" as a device that is integrated with another "information processor", and to configure the entire device as the "layout design supporting device" of the present invention. The "layout design supporting device" is to include an OS and hardware such as the peripheral equipment.

Further, for the information processor to which the LSI layout design supporting program and the like described above are loaded, the server is not limited to a personal computer, for example. Examples of the server may be various types of servers, an EWS (engineering work station), a medium-sized computer, and a main frame. In addition to the above-described examples, the client terminal may also be configured as a structure that can be utilized from a portable information terminal, various types of mobile terminals, a PDA, a portable telephone, a wearable information terminal, various television sets, videos, DVD recorders, various audio systems and remote controllers thereof, household appliances to which the various information communicating functions are loaded, a game machine including a network function, and the like. Alternatively, the structure modified as an application to be displayed on those terminals can be included within the scope of the present invention.

Further, the above-described program may be a program for achieving a part of the above-described functions, or may be the so-called differential file (differential program) which can achieve the above-described functions by being combined with the program that is already being recorded in the computer system.

The processing executed in a time series according to the procedure illustrated in the steps of the flowcharts in the present Application does not necessarily have to be executed in a time series but maybe in parallel or individually. Further, for the implementation, the order of executing the program procedure (steps) can be changed. Furthermore, depending on the necessity, the specific procedure (step) described in the present Application can be implemented, deleted, added, or rearranged as combined procedure (step).

Further, each function of each part shown in FIG. 1, FIG. 2, FIG. 3, FIG. 11, FIG. 12, and FIG. 27 and functions of the programs such as functions of the procedure of each step shown in FIG. 22, FIG. 23, FIG. 24, FIG. 25, and FIG. 30 may be achieved by hardware used exclusively (for example, a semiconductor circuit or the like used exclusively). A part of the entire functions of the program may be processed with the hardware, and other functions thereof may be processed with software. In the case of the exclusive-use hardware, each of the parts may be formed with an integrated circuit such as an LSI. These may be formed individually into a single chip or may be formed into a single chip that includes a part or entire part of those functions. Further, the LSI may include other function blocks such as a streaming engine and the like. Further, the method of integration is not limited to LSI. It may also be achieved by an exclusive-use circuit or a general-purpose processor. Furthermore, when there is a progress in the semiconductor technology or there is a new introduction of integrated circuit technology that replaces LSI, which is achieved by another technology derived from the progress, the functional blocks may naturally be integrated by using those techniques.

Further, each of the above-described exemplary embodiments includes various stages, and various aspects of the present invention are extracted depending on the appropriate combinations of the plurality of constituent features to be disclosed. That is, it is needless to say that the scope of the present invention includes combinations of each of the above-described exemplary embodiments or combinations of the exemplary embodiments and the modification examples. Naturally, even though it is not specifically depicted in the exemplary embodiments, it is possible with the cases of those combinations to achieve the operations and effects that are obvious from each of the structures disclosed in each of the exemplary embodiments and the modification examples thereof. Further, some of the constituent features may be omitted from the entire constituent features that are illustrated in the exemplary embodiments.

In the above, only an example of the exemplary embodiments of the present invention has been described for implementing easy understanding of the present invention. Each of the exemplary embodiments and the modification examples thereof are merely illustrated as concretive examples for embodying the present invention, and it is to be taken only as way of examples but not to be taken as limitations. Various modifications and/or changes are possible within a prescribed range as necessary. The present invention can be embodied in various forms without departing from the technical spirit or the main features thereof, and it is to be understood that the technical scope of the present invention is not limited to each of the exemplary embodiments and the modification examples thereof. Therefore, each of the feature elements disclosed in the above-described exemplary embodiments is to include all the design changes and the equivalent that fall within the technical scope of the present invention.

INDUSTRIAL APPLICABILITY

The present invention can be applied to the semiconductor industry, the LSI designing industry, the computer industry, and the information processing service industry similar to those. Further, it is also applicable for computer software applications that may not necessarily be conformed to specific standards. More specifically, the present invention can be applied to cases for supporting layout designing of an LSI.

What is claimed is:

1. An integrated circuit layout design supporting device for building a chip by dividing the chip into a plurality of macro blocks, which are pieces of a design unit of the chip, and performing layout processing of each of the macro blocks in parallel, comprising:

a center point coupling function calculating part which treats, as individually identifiable specific macro blocks, same-function macro blocks among the plurality of macro blocks as targets of layout, and draws coupling lines connecting between each of center points of hierarchy macro blocks that are in a connected relation;

an intersection coordinate calculating part which calculates intersection points at which the coupling lines drawn by the center point coupling function calculating part intersect with boundary lines of the macro blocks or intersection parts at a vicinity area thereof;

a terminal arrangement processing part which performs processing for arranging macro terminals to the intersection points or the intersection parts calculated by the intersection coordinate calculating part; and a layout processing control unit which performs, to build the chip, wiring processing of the macro blocks once on all macro terminals set at different coordinates of the specific macro blocks, and deletes extra wiring whose connection between the macro blocks is uncompleted.

2. The integrated circuit layout design supporting device as claimed in claim 1, wherein a name changing unit changes the same-type macro blocks into the specific macro blocks by changing names of the macro blocks.

3. The integrated circuit layout design supporting device as claimed in claim 2, wherein the name changing unit changes the same-type macro blocks into the specific macro blocks by also changing names of the macro terminals of the macro blocks in addition to changing the names of the macro blocks.

4. The integrated circuit layout design supporting device as claimed in claim 1, wherein the terminal arrangement processing part arranges the macro terminals at positions that connects between the terminals of the macro blocks with shortest distance based on positional relation of the macro blocks as the targets of layout and connecting relation between each of the macro blocks, and determines coordinates of the macro terminals.

5. The integrated circuit layout design supporting device as claimed in claim 1, wherein the layout processing control unit replaces the macro terminals of the macro blocks in an original state with all the terminals within the macro blocks that are being changed.

6. The integrated circuit layout design supporting device as claimed in claim 5, wherein the layout processing control unit individually cuts out areas of each macro block from a layout area of the entire macro blocks and, for each of the cut out macro blocks, replaces the macro terminals of the macro blocks in an original state with all the terminals within the macro blocks that are being changed.

7. The integrated circuit layout design supporting device as claimed in claim 5, wherein the layout processing control unit deletes, among wirings of the macro terminals of the replaced macro blocks, an extra wiring that is not connected as the wiring between the macro blocks.

8. The integrated circuit layout design supporting device as claimed in claim 1, wherein the layout processing control unit replaces the changed macro blocks with the macro blocks in the original state, and performs the wiring layout processing.

9. An integrated circuit layout design supporting method for building, with use of a computer, a chip by diving the chip into a plurality of macro blocks, which are pieces of a design unit of the chip, and performing layout processing of each macro block in parallel, comprising:

treating as individually identifiable specific macro blocks, same-function macro blocks among the plurality of macro blocks as targets of layout, and drawing coupling lines connecting between each of center points of hierarchy macro blocks that are in a connected relation calculating intersection points at which the coupling lines intersect with boundary lines of the macroblocks or intersection parts at a vicinity area thereof;

arranging the macro terminals to the calculated intersection points or the intersection parts; and performing, to build the chip, wiring processing of the macro blocks once on all macro terminals set at different coordinates of the specific macro blocks, and deleting extra wiring whose connection between the macro blocks is uncompleted.

10. The integrated circuit layout design supporting method as claimed in claim 9, wherein the same-function macro blocks are changed into the specific macro blocks by changing names of the macro blocks.

11. The integrated circuit layout design supporting method as claimed in claim 10, wherein the same- function macro blocks are changed into the specific macro blocks by also changing names of the macro terminals of the macro blocks in addition to changing the names of the macro blocks.

12. The integrated circuit layout design supporting method as claimed in claim 9, comprising:

arranging the macro terminals at positions that connects between the terminals of the macro blocks with shortest distance based on positional relation of the macro blocks as the targets of layout and connecting relation between each of the macro blocks; and determining coordinates of the macro terminals.

13. The integrated circuit layout design supporting method as claimed in claim 9, comprising:

replacing the macro terminal of the macro blocks in an original state with all the terminals within the macro blocks that are being changed.

14. The integrated circuit layout design supporting method as claimed in claim 13, comprising:

individually cutting out areas of each macro block from a layout area of the entire macro blocks; and for each of the cut out macro blocks, replacing the macro terminals of the macro blocks in an original state with all the terminals within the macro blocks that are being changed.

15. The integrated circuit layout design supporting method as claimed in claim 13, comprising: deleting, among wirings of the macro terminals of the replaced macroblocks, an extra wiring that is not connected as the wiring between the macro blocks.

16. The integrated circuit layout design supporting method as claimed in claim 9, comprising:

replacing the changed macro blocks with the macro blocks in the original state; and performing the wiring layout processing.

* * * * *

UNITED STATES PATENT AND TRADEMARK OFFICE
CERTIFICATE OF CORRECTION

| | |
|---|---|
| PATENT NO. | : 8,117,583 B2 |
| APPLICATION NO. | : 12/036643 |
| DATED | : February 14, 2012 |
| INVENTOR(S) | : Gotou |

It is certified that error appears in the above-identified patent and that said Letters Patent is hereby corrected as shown below:

In the Specification

Column 9, Line 58: Delete "Ba" and insert -- 5a --

Column 9, Line 64: Delete "Ba," and insert -- 5a, --

Column 34, Line 11: Delete "19S." and insert -- 195. --

Signed and Sealed this
Ninth Day of September, 2014

Michelle K. Lee
*Deputy Director of the United States Patent and Trademark Office*